US011264424B2

(12) United States Patent
Yokogawa et al.

(10) Patent No.: US 11,264,424 B2
(45) Date of Patent: Mar. 1, 2022

(54) OPTICAL FILTERS AND ASSOCIATED IMAGING DEVICES

(71) Applicant: Sony Semiconductor Solutions Corporation, Kanagawa (JP)

(72) Inventors: Sozo Yokogawa, Kanagawa (JP); Hirotaka Murakami, Kanagawa (JP); Mikinori Ito, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/611,973

(22) PCT Filed: May 1, 2018

(86) PCT No.: PCT/JP2018/017381
§ 371 (c)(1),
(2) Date: Nov. 8, 2019

(87) PCT Pub. No.: WO2018/211971
PCT Pub. Date: Nov. 22, 2018

(65) Prior Publication Data
US 2021/0091135 A1 Mar. 25, 2021

(30) Foreign Application Priority Data

May 15, 2017 (JP) .............................. JP2017-096403

(51) Int. Cl.
*H01L 27/14* (2006.01)
*H01L 27/146* (2006.01)

(52) U.S. Cl.
CPC .. *H01L 27/14645* (2013.01); *H01L 27/14612* (2013.01); *H01L 27/14629* (2013.01); *H01L 27/14621* (2013.01); *H01L 27/14627* (2013.01)

(58) Field of Classification Search
CPC ......... H01L 27/14645; H01L 27/14612; H01L 27/14629; H01L 27/14621;
(Continued)

(56) References Cited

U.S. PATENT DOCUMENTS 7,858,921 B2 12/2010 Stanton
8,963,267 B2 2/2015 Kokubun
(Continued)

FOREIGN PATENT DOCUMENTS

CN 1825603 A 8/2006
JP 2005019958 A 1/2005
(Continued)

OTHER PUBLICATIONS

International Search Report and Written Opinion dated Jul. 18, 2018 in connection with International Application No. PCT/JP2018/017381.

(Continued)

*Primary Examiner* — Mohammad M Hoque
(74) *Attorney, Agent, or Firm* — Wolf, Greenfield & Sacks, P.C.

(57) ABSTRACT

An imaging device includes a photodetector and an optical filter disposed on a light-receiving surface of the photodetector. The optical filter may include a diffraction grating, a core layer, and a reflector disposed on first and second opposing sides of the core layer. In some cases, the optical filter (e.g., a guided mode resonance ("GMR") filter) uses interference of electromagnetic waves on an incidence plane of light or a plane parallel to the incidence plane. The reflector may reflect electromagnetic waves between adjacent optical filters. In some cases, the imaging device is a back-side-illuminated or front-side-illuminated CMOS or CCD image sensor.

53 Claims, 42 Drawing Sheets

(58) Field of Classification Search
CPC ......... H01L 27/14627; H01L 27/14641; H01L 27/14634; H01L 27/14623; H01L 27/14625; H01L 27/14603; H01L 27/1463; H01L 27/14636; H01L 27/1464; H01L 27/14681; H01L 27/14–32; G02B 5/1842
USPC ...................................................... 257/431
See application file for complete search history.

(56) References Cited

U.S. PATENT DOCUMENTS

| | | | |
|---|---|---|---|
| 2006/0192083 A1* | 8/2006 | Fu .................... | H01J 27/14685 250/214.1 |
| 2009/0272880 A1* | 11/2009 | Stanton ............. | H01L 27/14621 250/208.1 |
| 2010/0060769 A1* | 3/2010 | Inuiya .................... | H04N 9/04 348/311 |
| 2010/0328587 A1 | 12/2010 | Yamada et al. | |
| 2013/0093034 A1 | 4/2013 | Kokubun et al. | |
| 2014/0146207 A1 | 5/2014 | Yokogawa | |
| 2014/0367817 A1* | 12/2014 | Furuta ................ | H01L 27/1464 257/432 |
| 2017/0108375 A1* | 4/2017 | Brueck ................ | G01J 3/0218 |
| 2017/0108620 A1* | 4/2017 | Yu .......................... | G02B 21/08 |

FOREIGN PATENT DOCUMENTS

| | | |
|---|---|---|
| JP | 2006140413 A | 6/2006 |
| JP | 2009088415 A | 4/2009 |
| JP | 2011-013330 A | 1/2011 |
| JP | 2011-180426 A | 9/2011 |
| JP | 2011528136 A | 11/2011 |
| JP | 2012-190848 A | 10/2012 |
| JP | 2013088557 A | 5/2013 |
| JP | 2015069076 A | 4/2015 |
| JP | 2015200816 A | 11/2015 |
| JP | 2017076683 A | 4/2017 |
| TW | I501388 B | 9/2015 |
| WO | WO 2017/064844 A1 | 4/2017 |

OTHER PUBLICATIONS

International Preliminary Report on Patentability dated Nov. 28, 2019 in connection with International Application No. PCT/JP2018/017381.

Rosenblatt et al., Resonant Grating Waveguide Structures, IEEE Journal of Quantum Electronics, vol. 33, No. 11, Nov. 1997, pp. 2038-2059.

* cited by examiner

| DETECTION TARGET | DETECTION ITEM | PEAK WAVELENGTH | FULL WIDTH AT HALF MAXIMUM |
|---|---|---|---|
| MYOGLOBIN | UMAMI INGREDIENT | 580-630nm | 30-50nm |
| OLEIC ACID | DEGREE OF FRESHNESS | 970nm | 50-100nm |
| CHLOROPHYLL | DEGREE OF FRESHNESS | 650-700nm | 50-100nm |

FIG. 28

| FRUIT | DETECTION TARGET | DETECTION ITEM | PEAK WAVELENGTH | FULL WIDTH AT HALF MAXIMUM |
|---|---|---|---|---|
| MELON RAIDEN | SUGAR CONTENT | FLESH OPTICAL PATH LENGTH | 880nm | 20-30nm |
| | | SUCROSE | 910nm | 40-50nm |
| MELON RAIDEN RED | SUGAR CONTENT | SUCROSE | 915nm | 40-50nm |
| | | WATER CONTENT | 955nm | 20-30nm |
| APPLE | SUGAR CONTENT | SUCROSE | 912nm | 40-50nm |
| | WATER CONTENT | WATER | 844nm | 30nm |
| MANDARIN ORANGE | SUGAR CONTENT | SUCROSE | 914nm | 40-50nm |

FIG. 29

| DETECTION TARGET | PEAK WAVELENGTH | FULL WIDTH AT HALF MAXIMUM |
|---|---|---|
| PET | 1669nm | 30-50nm |
| PS | 1688nm | 30-50nm |
| PE | 1735nm | 30-50nm |
| PVC | 1716 – 1726nm | 30-50nm |
| PP | 1716 – 1735nm | 30-50nm |

OPTICAL FILTERS AND ASSOCIATED IMAGING DEVICES

CROSS REFERENCE TO RELATED APPLICATIONS

This application claims the benefit under 35 U.S.C. § 371 as a U.S. National Stage Entry of International Application No. PCT/JP2018/017381, filed in the Japanese Patent Office as a Receiving Office on May 1, 2018, which claims priority to Japanese Patent Application Number JP 2017-096403, filed in the Japanese Patent Office on May 15, 2017, each of which is hereby incorporated by reference in its entirety.

TECHNICAL FIELD

A technology according to an embodiment of the present disclosure (hereinbelow, also referred to as "the present technology") relates to an image sensor, an image sensor manufacturing method, an electronic device, and an imaging module, and, particularly, to an image sensor, an image sensor manufacturing method, an electronic device, and an imaging module that use a structural color filter.

CROSS REFERENCE TO RELATED APPLICATIONS

This application claims the benefit of Japanese Priority Patent Application JP 2017-096403 filed on May 15, 2017, the entire contents of which are incorporated herein by reference.

BACKGROUND ART

In related art, a guided mode resonance (GMR) filter which is one of structural color filters is used for various purposes. A GMR filter is an optical filter capable of transmitting only light of a narrow wavelength band (narrow band) by a combination of a diffraction grating and a clad-core structure (e.g., refer to Patent Literatures 1 to 3 and Non Patent Literature 1).

CITATION LIST

Patent Literature

PTL 1: JP 2011-13330A
PTL 2: JP 2011-180426A
PTL 3: JP 2012-190848A

Non Patent Literature

NPL 1: D. Rosenblatt et al., "Resonant grating waveguide structures", IEEE Journal of Quantum Electronics, IEEE, November 1997, Volume 33, Issue 11, p. 2038-2059

SUMMARY OF INVENTION

Technical Problem

Incidentally, in cases where a GMR filter is used as a wavelength selection filter of an image sensor such as a CMOS image sensor or a CCD image sensor, the GMR filter may disadvantageously upsize the image sensor.

The present technology has been made in view of such a circumstance, and it is desirable to downsize an image sensor provided with a structural color filter that uses interference of electromagnetic waves on an incidence plane of light or a plane parallel to the incidence plane such as a GMR filter or an apparatus provided with the image sensor.

Solution to Problem

An imaging device of a first aspect of the present technology includes: a photodetector; and an optical filter disposed on a light-receiving surface of the photodetector, in which the optical filter includes a diffraction grating, a core layer, and a reflector disposed on first and second opposing sides of the core layer. In some embodiments, a refractive index of the reflector is different from a refractive index of the core layer.

An imaging device of a second aspect of the present technology includes: a first photodetector; a second photodetector positioned adjacent to the first photodetector; and an optical filter disposed above a light-receiving surface of the first photodetector and the second photodetector. In some embodiments, a first portion of the optical filter disposed above the first photodetector and a second portion of the optical filter disposed above the second photodetector each include a diffraction grating and a core layer. In some cases, a reflector is positioned between the core layer of the first portion of the optical filter and the core layer of the second portion of the optical filter. In certain embodiments, the reflector has a refractive index different from a refractive index of the core layer of the first portion of the optical filter and a refractive index of the core layer of the second portion of the optical filter.

An image sensor of a third aspect of the present technology includes: a structural color filter that uses interference of electromagnetic waves on an incidence plane of light or a plane parallel to the incidence plane; and a reflector that reflects electromagnetic waves between adjacent structural color filters.

An image sensor manufacturing method of a fourth aspect of the present technology includes: forming a structural color filter that uses interference of electromagnetic waves on an incidence plane of light or a plane parallel to the incidence plane; and forming a reflector that reflects electromagnetic waves between adjacent structural color filters.

An electronic device of a fifth aspect of the present technology includes: an image sensor; and a signal processing unit that processes a signal output from the image sensor, in which the image sensor includes a structural color filter that uses interference of electromagnetic waves on an incidence plane of light or a plane parallel to the incidence plane, and a reflector that reflects electromagnetic waves between adjacent structural color filters.

An imaging module of a sixth aspect of the present technology includes: an image sensor; an optical system that forms an image of a subject onto the image sensor; and a signal processing unit that processes a signal output from the image sensor, in which the image sensor includes a structural color filter that uses interference of electromagnetic waves on an incidence plane of light or a plane parallel to the incidence plane, and a reflector that reflects electromagnetic waves between adjacent structural color filters.

In the first aspect of the present technology, the diffraction grating causes diffraction and interference of electromagnetic waves in an incidence plane of light or a plane parallel to the incidence plane, and the reflector reflects the electromagnetic waves.

In the second aspect of the present technology, electromagnetic waves interfere in an incidence plane of light of the optical filter or a plane parallel to the incidence plane, and the electromagnetic waves are reflected between the first portion of the optical filter and the second portion of the optical filter.

In the third aspect of the present technology, electromagnetic waves interfere on the incidence plane of light or the plane parallel to the incidence plane, and electromagnetic waves are reflected between adjacent structural color filters.

In the fourth aspect of the present technology, the structural color filter that uses interference of electromagnetic waves on the incidence plane of light or the plane parallel to the incidence plane is formed, and the reflector that reflects electromagnetic waves between adjacent structural color filters is formed.

In the fifth aspect of the present technology, in the image sensor, electromagnetic waves interfere on the incidence plane of light or the plane parallel to the incidence plane, electromagnetic waves are reflected between adjacent structural color filters, and a signal output from the image sensor is processed.

In the sixth aspect of the present technology, an image of a subject is formed onto the image sensor, and electromagnetic waves interfere on the incidence plane of light or the plane parallel to the incidence plane, electromagnetic waves are reflected between adjacent structural color filters, and a signal output from the image sensor is processed in the image sensor.

Advantageous Effects of Invention

The above first to sixth aspects of the present technology make it possible to downsize an image sensor provided with an optical filter (e.g., a structural color filter) that uses interference of electromagnetic waves on an incidence plane of light or a plane parallel to the incidence plane such as a GMR filter or an apparatus provided with the image sensor.

It is to be noted that effects of the present technology are not necessarily limited to the effects described above, and may be any of the effects described in the present disclosure.

BRIEF DESCRIPTION OF DRAWINGS

FIG. 27 is a table illustrating examples of a detection band in detection of umami and the degree of freshness of food.

FIG. 28 is a table illustrating examples of the detection band in detection of a sugar content and a water content of fruit.

FIG. 29 is a table illustrating examples of the detection band in separation of plastics.

DESCRIPTION OF EMBODIMENTS

Hereinbelow, modes for carrying out the present disclosure (hereinbelow, referred to as "embodiments") will be described in detail with reference to the drawings. Note that the description will be made in the following order.

1. Common GMR Filter
2. First Embodiment (an example in which a clad-core structure is disposed on a lower layer of a diffraction grating, and a reflector is disposed on a clad layer and a core layer)
3. Second Embodiment (an example in which a clad-core structure is disposed on an upper layer of a diffraction grating, and a reflector is disposed on a clad layer and a core layer)
4. Third Embodiment (an example in which a clad-core structure is disposed on a lower layer of a diffraction grating, and a reflector is disposed only on a core layer)
5. Fourth Embodiment (an example in which a clad-core structure is disposed on an upper layer of a diffraction grating, and a reflector is disposed only on a core layer)
6. Fifth Embodiment (an example in which a Bragg mirror structure is used in a reflector)
7. Sixth Embodiment (an example in which a dielectric mirror is used in a reflector)
8. Seventh Embodiment (an example in which an air gap is used in a reflector)
9. Eighth Embodiment (an example in which two layers of clad-core structures are provided)
10. Image Sensor Manufacturing Method
11. Application Examples
12. Modifications 1. Common GMR Filter First, a common GMR filter will be described with reference to FIGS. 1 to 5A and 5B.

Figure 1:
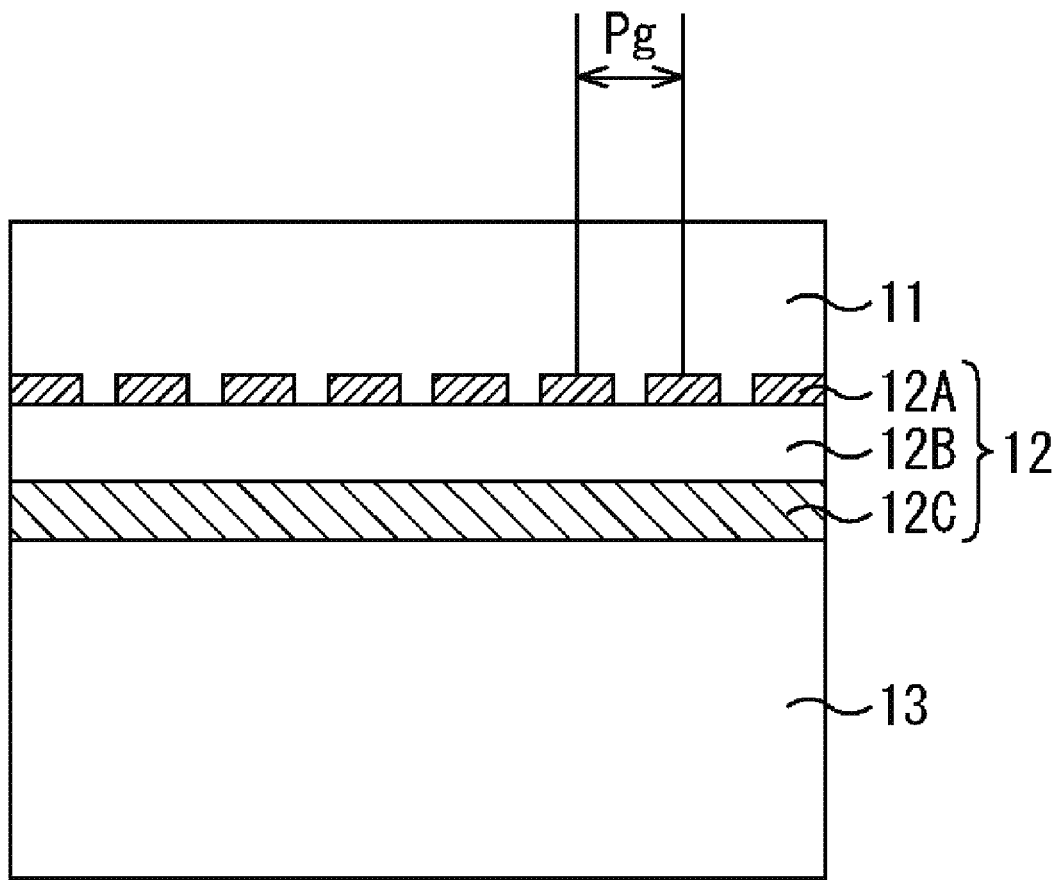
FIG. 1 is a cross-sectional view schematically illustrating the structure of a common GMR filter.
Figure 2:
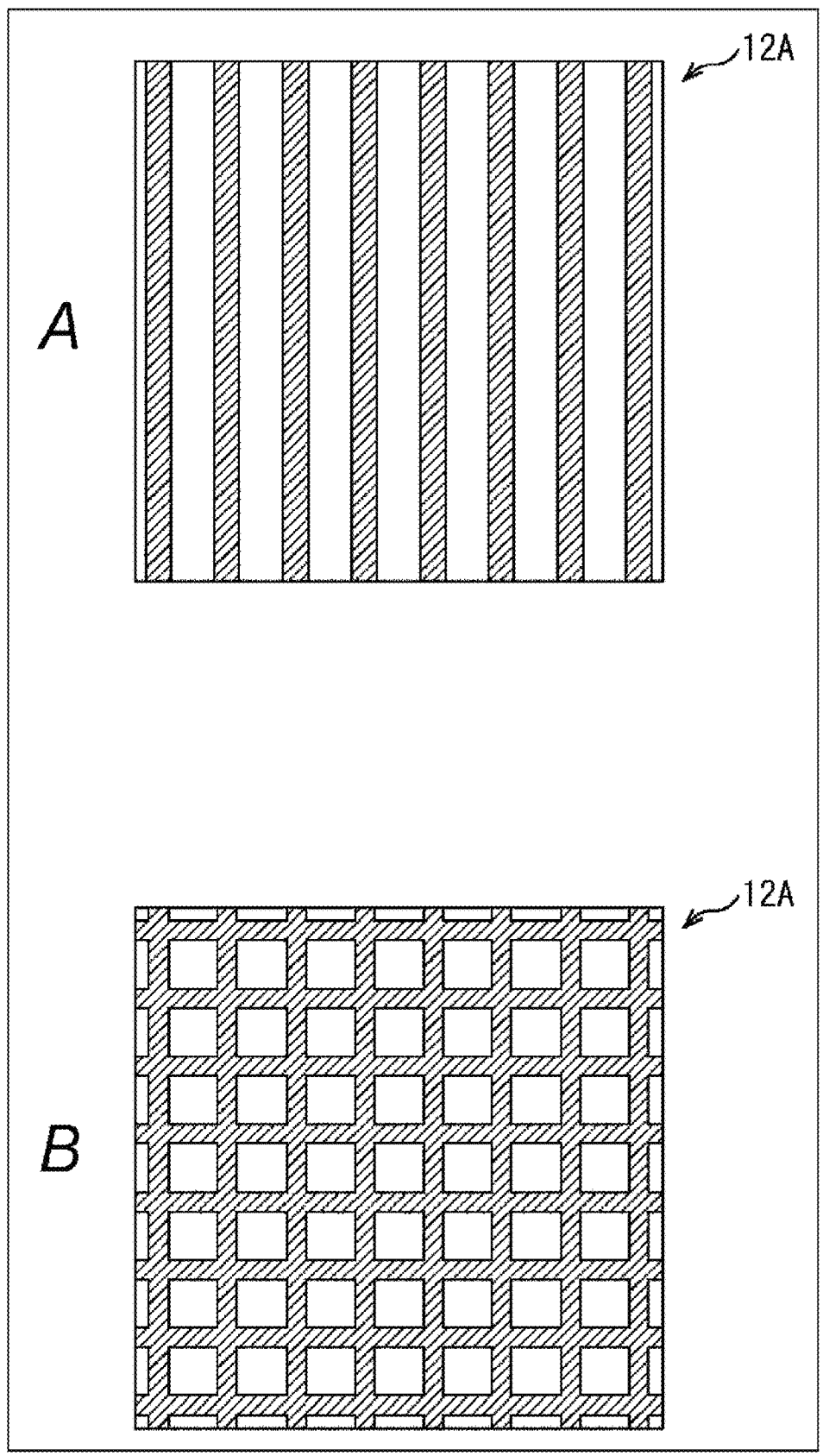
FIG. 2 is a plan view illustrating examples of a pattern of a diffraction grating of the GMR filter.

FIG. 1 is a cross-sectional view schematically illustrating the structure of a common GMR filter.

In this example, a dielectric layer 11, a GMR filter 12, and a dielectric layer 13 are stacked in this order from top (a light incidence direction). The dielectric layer 11 includes, for example, a dielectric having a refractive index Na. The dielectric layer 13 includes, for example, a dielectric having a refractive index Nd.

In the GMR filter 12, a diffraction grating 12A, a clad layer 12B, and a core layer 12C are stacked in this order from top (the light incidence direction). The clad layer 12B includes, for example, a dielectric having a refractive index Nb. The core layer 12C includes, for example, a dielectric having a refractive index Nc.

The refractive index Na of the dielectric layer 11, the refractive index Nb of the clad layer 12B, the refractive index Nc of the core layer 12C, and the refractive index Nd of the dielectric layer 13 are, for example, set to satisfy a relationship of the following expression (1).

$$Nc>Nb \text{ or } Nd>Na \qquad (1)$$

Note that the magnitude relationship between the refractive index Nb and the refractive index Nd is not particularly limited to any relationship.

FIGS. 2A and 2B are plan views schematically illustrating structural examples of the diffraction grating 12A viewed from top. The diffraction grating 12A includes, for example, a one-dimensional diffraction grating having a one-dimensional grid-like (one-dimensional linear) pattern as illustrated in FIG. 2A or a two-dimensional diffraction grating having a two-dimensional grid-like pattern as illustrated in FIG. 2B.

Note that, in a case where a one-dimensional diffraction grating is used as the diffraction grating 12A, a polarization component that is parallel to the grating and a polarization component that is perpendicular to the grating have different response characteristics, which results in a polarization spectroscopic filter having a selective sensitivity to a wavelength and polarization of an electromagnetic wave.

In both the cases where the diffraction grating 12A is a one-dimensional diffraction grating and a two-dimensional diffraction grating, a grating period Pg which is a spacing between adjacent grating lines is, for example, set to satisfy the following expression (2).

$$200 \text{ nm} \leq 0.5\lambda/Nd < Pg < \lambda/Nd \leq 600 \text{ nm} \qquad (2)$$

Note that $\lambda$ denotes a center wavelength of a transmission wavelength band of the GMR filter 12.

Further, the GMR filter 12 transmits light in a predetermined narrow band by light diffraction by the diffraction grating 12A, confinement of light of a specific wavelength into the core layer 12C by the clad-core structure, and a transmission characteristic of the clad-core structure with respect to light of a specific wavelength.

Next, the wavelength characteristic of the GMR filter 12 will be described with reference to FIGS. 3, 4A and 4B.

Figure 3:
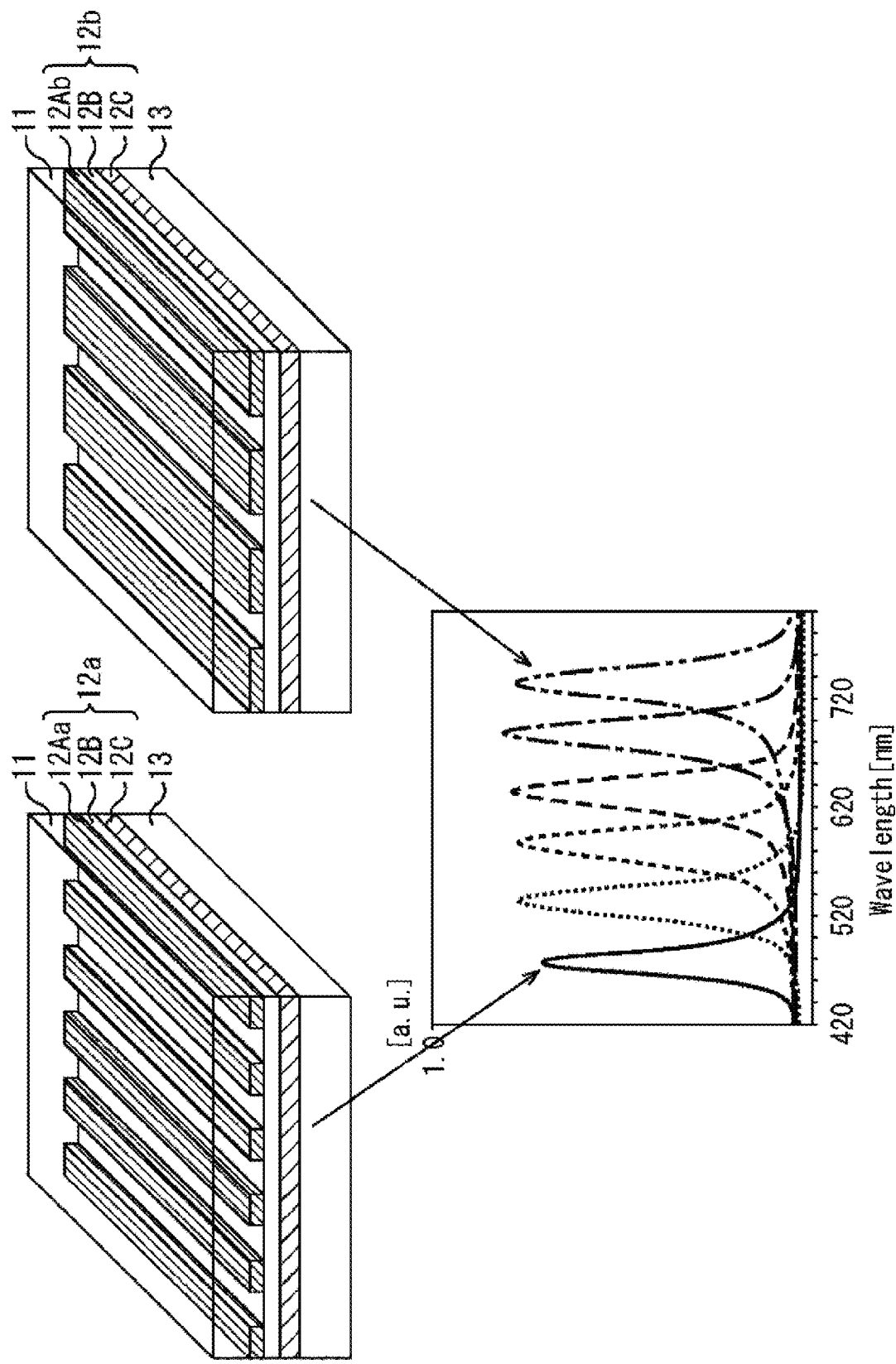
FIG. 3 is a diagram illustrating an example of a wavelength characteristic of the GMR filter with respect to a grating period.
Figure 4:
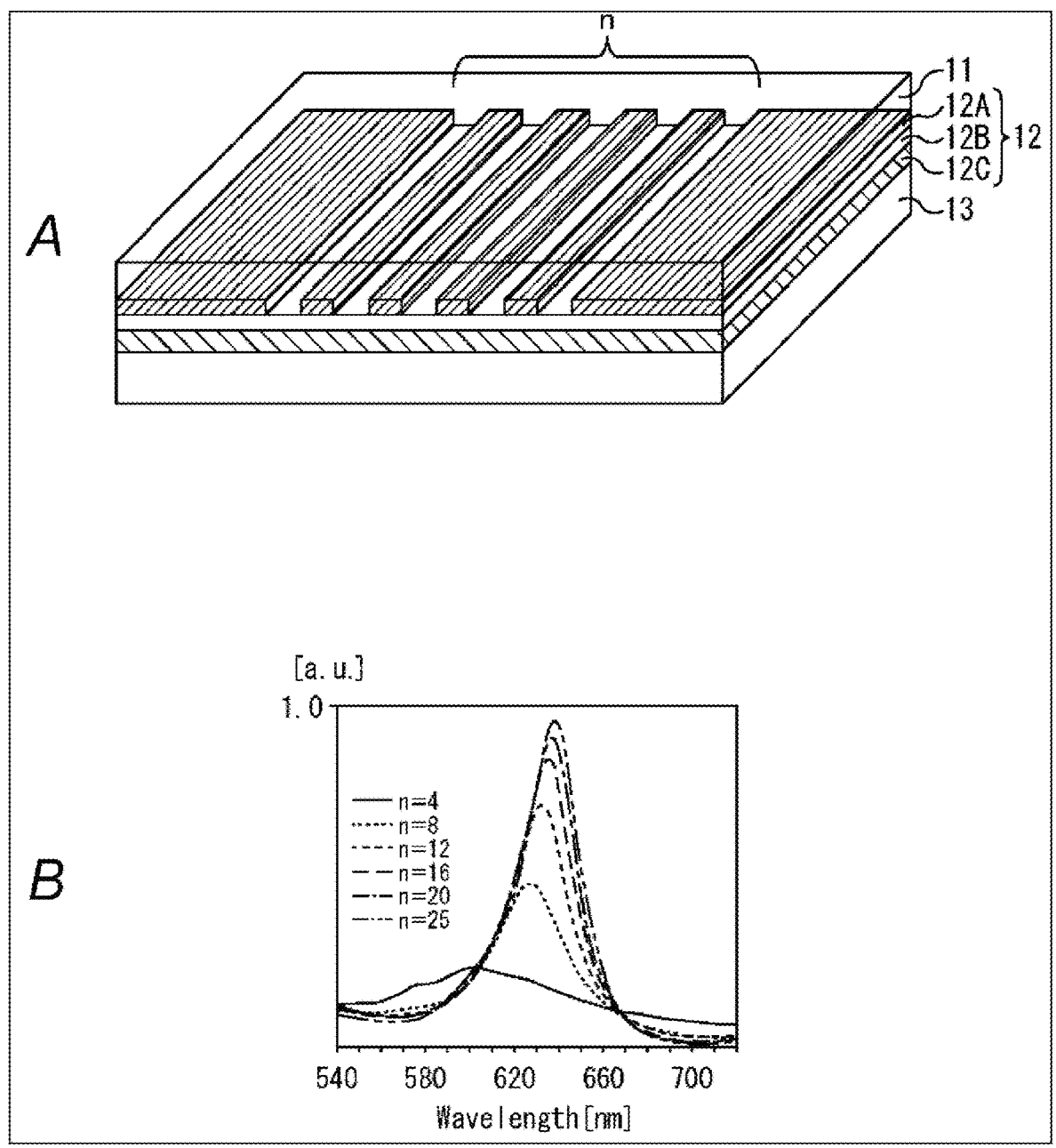
FIG. 4 is a diagram illustrating an example of a wavelength characteristic of the GMR filter with respect to the number of grating lines.
Figure 5:
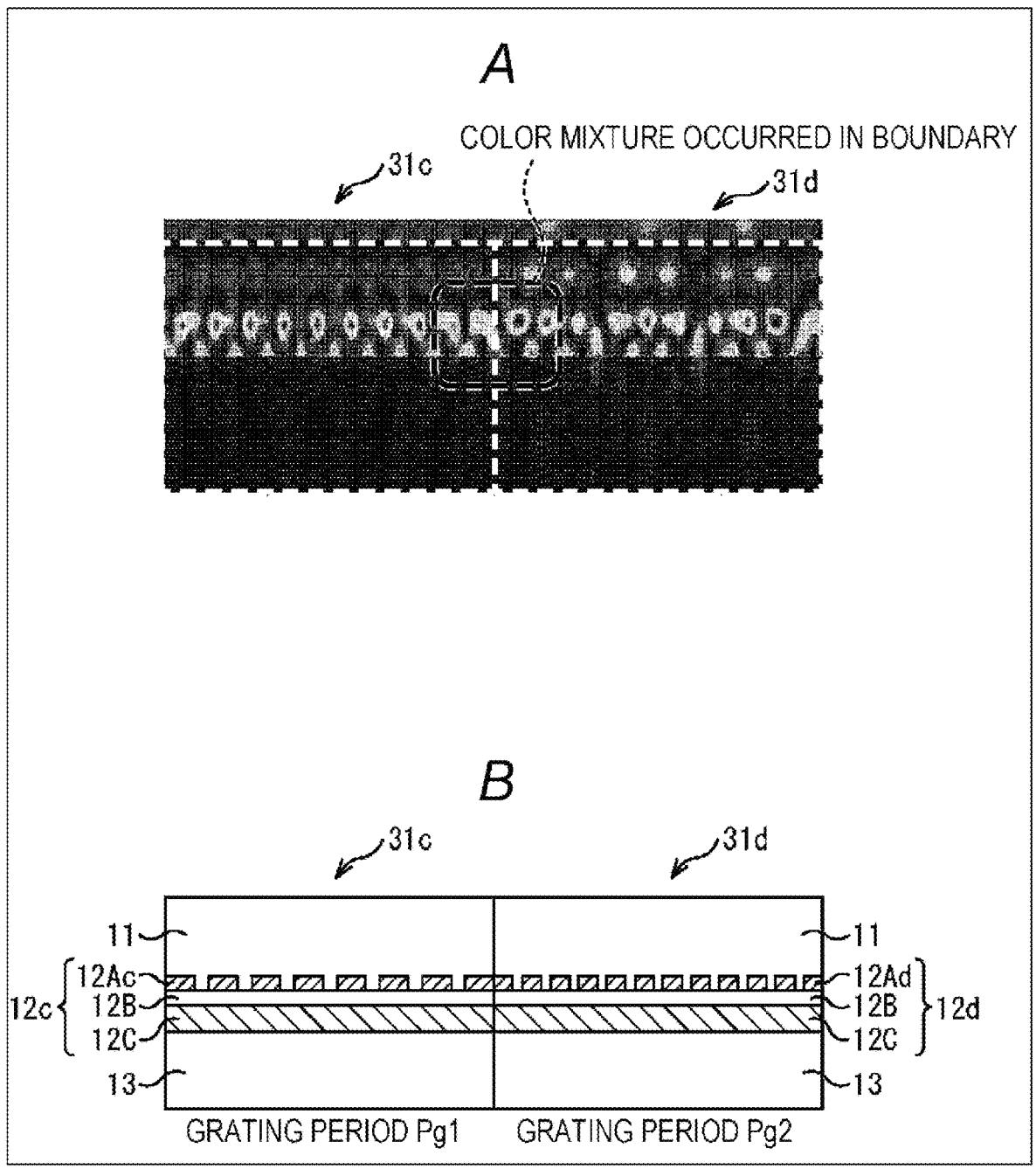
FIG. 5 is a diagram for describing problems in a case where a common GMR filter is used in an image sensor.

FIG. 3 illustrates an example of the wavelength characteristic of the GMR filter 12 which uses a one-dimensional diffraction grating with respect to the grating period Pg. Specifically, in the graph in the lower side of FIG. 3, the horizontal axis represents wavelength (in nm), and the vertical axis represents transmittance (in any unit). Further, each wave form represents the wavelength characteristic of the GMR filter 12 in a case where the grating period Pg of the diffraction grating 12A is changed.

The transmission wavelength band of the GMR filter 12 transitions to a narrower wavelength band as the grating period Pg becomes shorter (the grating spacing becomes narrower) and transitions to a wider wavelength band as the grating period Pg becomes longer (the grating spacing becomes wider).

For example, a grating period Pg of a diffraction grating 12Aa of a GMR filter 12a illustrated in the upper left side of FIG. 3 is set to 280 nm, and a grating period Pg of a diffraction grating 12Ab of a GMR filter 12b illustrated in the upper right side of FIG. 3 is set to 500 nm. In this case, a peak of the transmission wavelength band of the diffraction grating 12Aa appears in a wavelength band of blue light, and a peak of the transmission wavelength band of the diffraction grating 12Ab appears in a wavelength band from red light to near infrared rays.

FIGS. 4A and 4B illustrate an example of the wavelength characteristic of the GMR filter 12 which uses a one-dimensional diffraction grating with respect to the number of grating lines. Specifically, FIG. 4B illustrates an example of the wavelength characteristic of the GMR filter 12 in a case where the number of grating lines n is changed with the grating period of the diffraction grating 12A of the GMR filter 12 of FIG. 4A fixed. In FIG. 4B, the horizontal axis represents wavelength (in nm), and the vertical axis represents transmittance (in any unit).

The wavelength characteristic of the GMR filter 12 changes according to the number of grating lines of the diffraction grating 12A. That is, as the number of grating lines n increases, the intensity of the peak of the transmission wavelength band of the GMR filter 12 (the peak transmission intensity) becomes higher and the full width at half maximum (FWHM) of the transmission wavelength band becomes narrower, which results in a wavelength characteristic of a narrower band. This is because light is diffracted with high accuracy and confined in the core layer 12C by increasing the number of grating lines n of the diffraction grating 12A.

On the other hand, the GMR filter 12 becomes large by increasing the number of grating lines n. For example, in a case where the GMR filter 12 is used in an image sensor such as a CMOS image sensor or a CCD image sensor, each pixel may require the diffraction grating 12A whose grating period Pg is approximately half a wavelength to be desirably selected and whose number of grating lines n is 10 to 20 or more. Thus, the size of the GMR filter 12 increases, which becomes an obstacle to downsizing of the image sensor.

Further, in a case where the GMR filter 12 is used in an image sensor, a plurality of types of GMR filters 12 having different wavelength characteristics are provided for the respective pixels according to a wavelength band (color) of light to be detected. For example, as illustrated in FIG. 5B, a GMR filter 12c which is provided with a diffraction grating 12Ac having a grating period Pg1 is provided for a pixel 31c, and a GMR filter 12d which is provided with a diffraction grating 12Ad having a grating period Pg2 is provided for a pixel 31d.

In this case, in the pixel 31c, light selectively diffracted by the diffraction grating 12Ac is confined into the core layer 12C. Further, in the pixel 31d, light selectively diffracted by the diffraction grating 12Ad is confined into the core layer 12C.

Here, the clad layer 12B and the core layer 12C are shared between the pixel 31c and the pixel 31d. Thus, a color mixture (crosstalk) occurs in a boundary between the GMR filter 12c and the GMR filter 12d. Further, in the boundary between the GMR filter 12c and the GMR filter 12d, the grating periods of the diffraction grating 12Ac and the diffraction grating 12Ad are disturbed. Thus, effective light diffraction does not occur. As a result, the wavelength characteristics of the GMR filter 12c and the GMR filter 12d are deteriorated.

For example, FIG. 5A schematically illustrates a distribution of an electric field strength in the GMR filter 12c of the pixel 31c and the GMR filter 12d of the pixel 31d. In FIG. 5A, the electric field strength is represented by the depth of color. Further, FIG. 5A shows the occurrence of a color mixture in the boundary between the pixel 31c and the pixel 31d, the boundary being surrounded by a square in the drawing.

As described above, in a case where the GMR filter 12 is used in an image sensor, there are problems such as upsizing of the image sensor and deterioration of the wavelength characteristic of the GMR filter 12.

2. First Embodiment

Next, a first embodiment of the present technology will be described with reference to FIGS. 6 to 10.

<Structural Example of Image Sensor>

First, a structural example of an image sensor to which the present technology is applied will be described with reference to FIGS. 6 to 9A and 9B.

Figure 6:
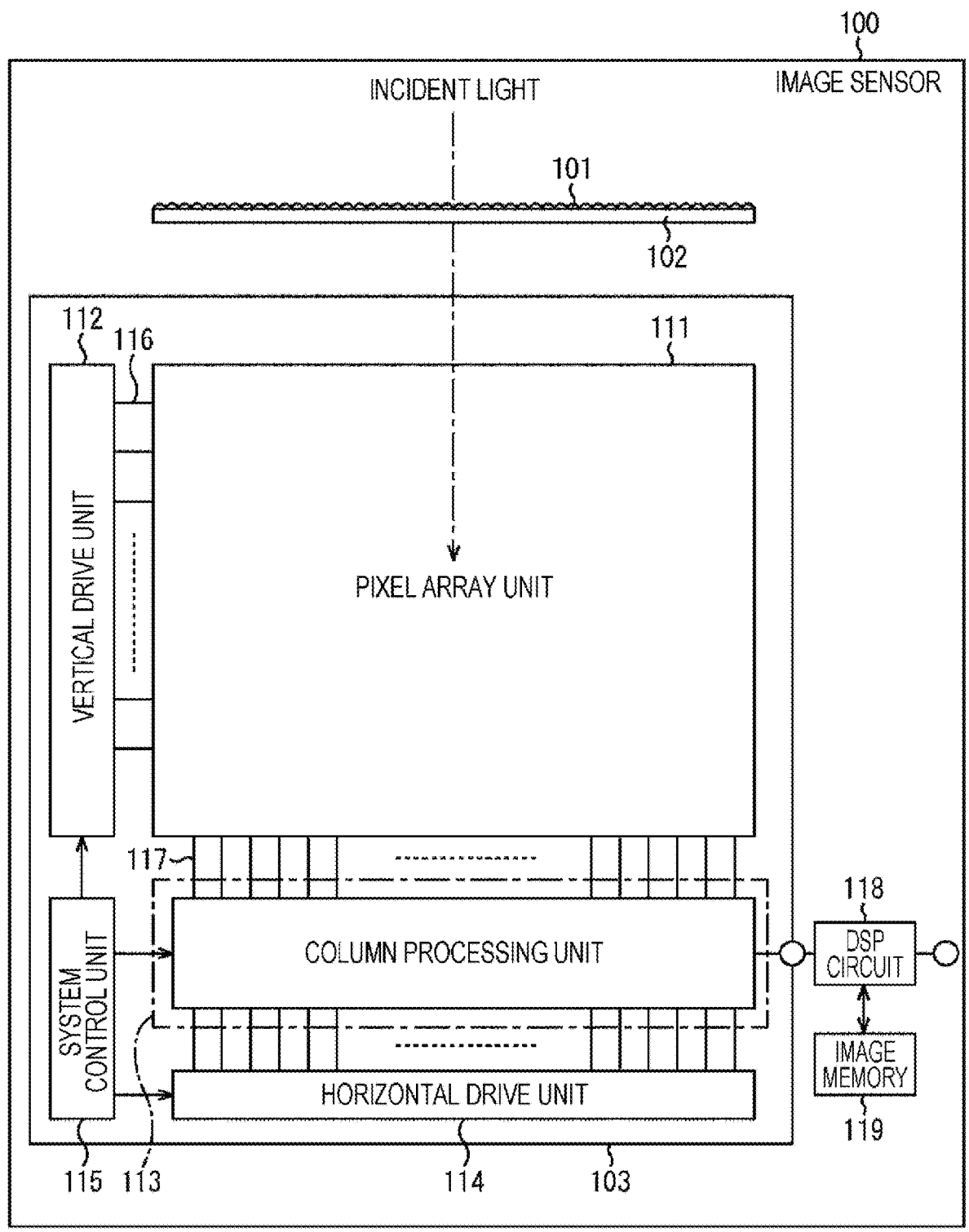
FIG. 6 is a system configuration diagram of an image sensor to which the present technology is applied.

FIG. 6 is a system configuration diagram schematically illustrating the configuration of an image sensor to which the present technology is applied, for example, a CMOS image sensor which is a type of X-Y address type solid state image sensor.

An image sensor 100 is provided with a pixel array unit 111 which is formed on a semiconductor substrate 103 and a peripheral circuit unit.

The peripheral circuit unit is provided with, for example, a vertical drive unit 112, a column processing unit 113, a horizontal drive unit 114, and a system control unit 115. Further, the peripheral circuit unit is provided with a digital signal processor (DSP) circuit 118 which constitutes a signal processing system and an image memory 119. Note that all or some of the members of the peripheral circuit unit may be disposed on the same semiconductor substrate 103 on which the pixel array unit 111 is disposed or may be disposed on a semiconductor substrate different from the semiconductor substrate 103 on which the pixel array unit 111 is disposed.

The pixel array unit 111 includes unit pixels (not illustrated, hereinbelow, also merely referred to as the pixels) which are arranged in an array. Each of the unit pixels includes a photodetector (e.g., a photodiode, a phototransistor, a photoconductor). In some embodiments, for example, each unit pixel includes a photoelectric conversion element which photoelectrically converts incident light to a charge amount corresponding to the amount of the incident light. A filter layer 102 which is provided with a GMR filter is disposed at a light incidence plane (light receiving surface) side of the pixel array unit 111. An on-chip microlens 101 is disposed on the filter layer 102. The pixel array unit 111 further includes pixel drive lines 116 which are formed in the right-left direction in the drawing (the pixel array direction of the pixel rows/horizontal direction) for the respective rows of the pixel array in the form of matrix and vertical signal lines 117 which are formed in the up-down direction in the drawing (the pixel array direction of the pixel columns/vertical direction) for the respective columns thereof.

One end of each of the pixel drive lines 116 is connected to the corresponding one of output ends of the vertical drive unit 112, the output ends corresponding to the respective rows. Note that, in FIG. 6, one pixel drive line 116 is provided for each pixel row. However, two or more pixel drive lines 116 may be provided for each pixel row.

The vertical drive unit 112 includes a shift register and an address decoder. Although a specific configuration is not illustrated herein, the vertical drive unit 112 includes a read scanning system and a sweep-out scanning system.

The read scanning system sequentially performs selective scanning in units of rows for the unit pixel which reads a signal. On the other hand, the sweep-out scanning system performs sweep-out scanning for sweeping out (resetting) unnecessary charges from a photoelectric conversion element of a unit pixel on a read row on which read scanning is performed by the read scanning system prior to the read scanning by a time of a shutter speed. A so-called electronic shutter operation is performed by the sweepout (reset) of unnecessary charges by the sweep-out scanning system. Here, the electronic shutter operation refers to an operation of throwing away photocharges of the photoelectric conversion element and newly starting exposure to light (starting accumulation of photocharges). A signal read by a read operation of the read scanning system corresponds to an immediately preceding read operation or the amount of incident light after the electronic shutter operation. Further, a period from a read timing by the immediately preceding read operation or a sweep-out timing by the electronic shutter operation to a read timing by the current read operation is an accumulation time (exposure time) of photocharges in the unit pixel.

A signal output from each unit pixel of a pixel row that has been selectively scanned by the vertical drive unit 112 is supplied to the column processing unit 113 through each of the vertical signal lines 117.

The column processing unit 113 performs predetermined signal processing on an analog pixel signal output from each pixel of a selected row for each pixel row of the pixel array unit 111. Correlated double sampling (CDS) processing is an example of the signal processing in the column processing unit 113. The CDS processing fetches a reset level and a signal level output from each pixel of a selected row and takes the difference between these levels to obtain signals of pixels in one row and remove a fixed pattern noise of pixels. The column processing unit 113 may have an A/D conversion function for digitalizing an analog pixel signal.

The horizontal drive unit 114 includes a shift register, an address decoder, and the like and sequentially performs selective scanning on a circuit part corresponding to a pixel column of the column processing unit 113. Pixel signals processed by the column processing unit 113 for each pixel column are sequentially output to the outside by the selective scanning by the horizontal drive unit 114. That is, a pixel signal corresponding to color coding (color array) of the filter layer 102 is output as it is as RAW data.

The system control unit 115 receives a clock given from the outside, data that designates an operation mode, and the like and outputs data such as internal information of the image sensor 100. The system control unit 115 includes a timing generator which generates various timing signals and performs drive control for the vertical drive unit 112, the column processing unit 113, the horizontal drive unit 114 and the like on the basis of the various timing signals generated by the timing generator.

The DSP circuit 118 temporarily stores, for example, one frame of image data output from the column processing unit 113 in the image memory 119 and executes demosaic processing and the like on the basis of pixel information stored in the image memory 119. The demosaic processing creates a full-color image by collecting and giving lack color information to a signal of each pixel that has only monochrome color information from a signal of a peripheral pixel thereof to complement the color information.

Figure 7:
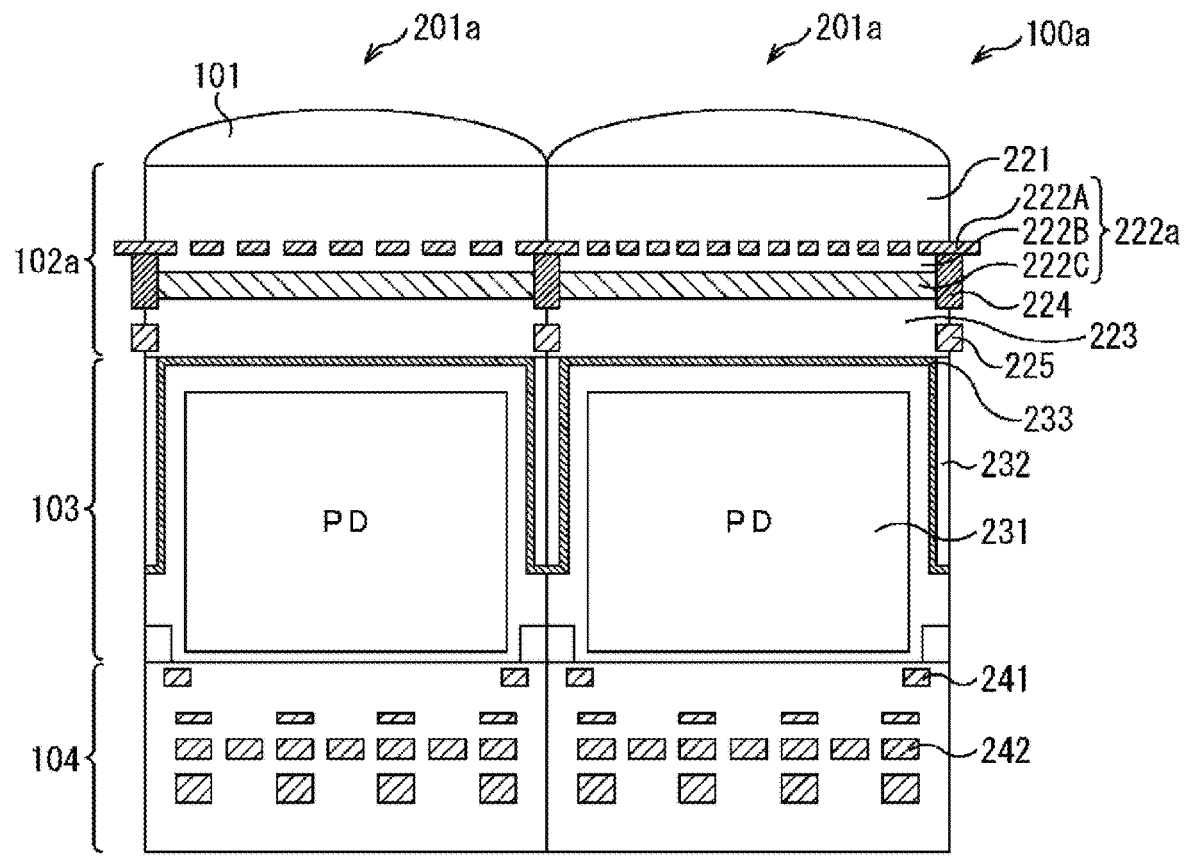
FIG. 7 is a cross-sectional view schematically illustrating a structural example of a first embodiment of the image sensor.
Figure 8:
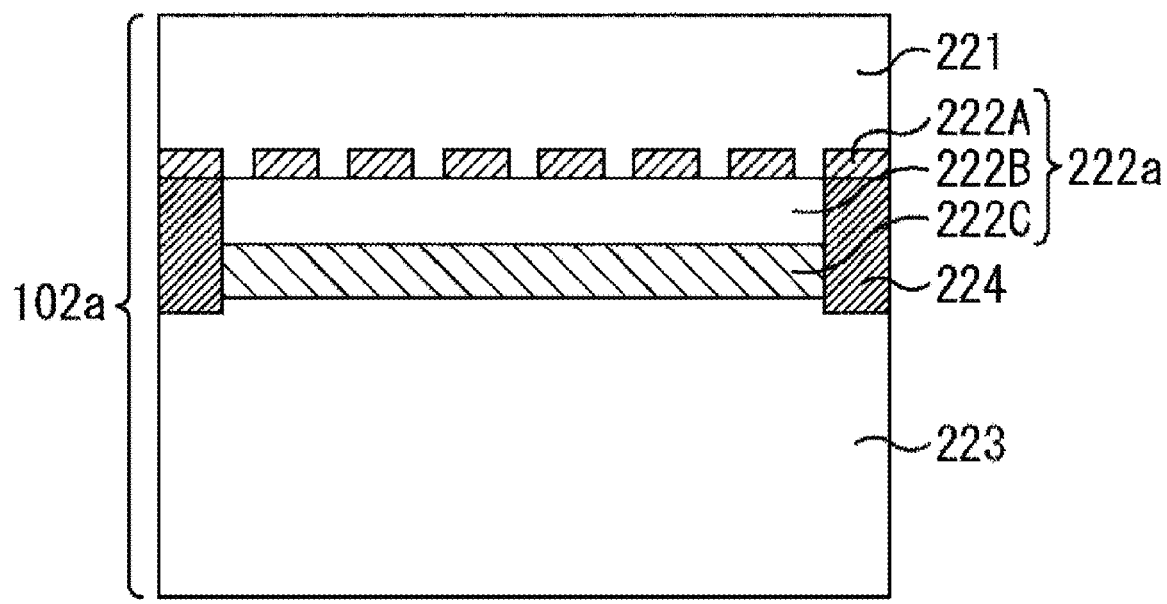
FIG. 8 is an enlarged view of a filter part of FIG. 7.
Figure 9:
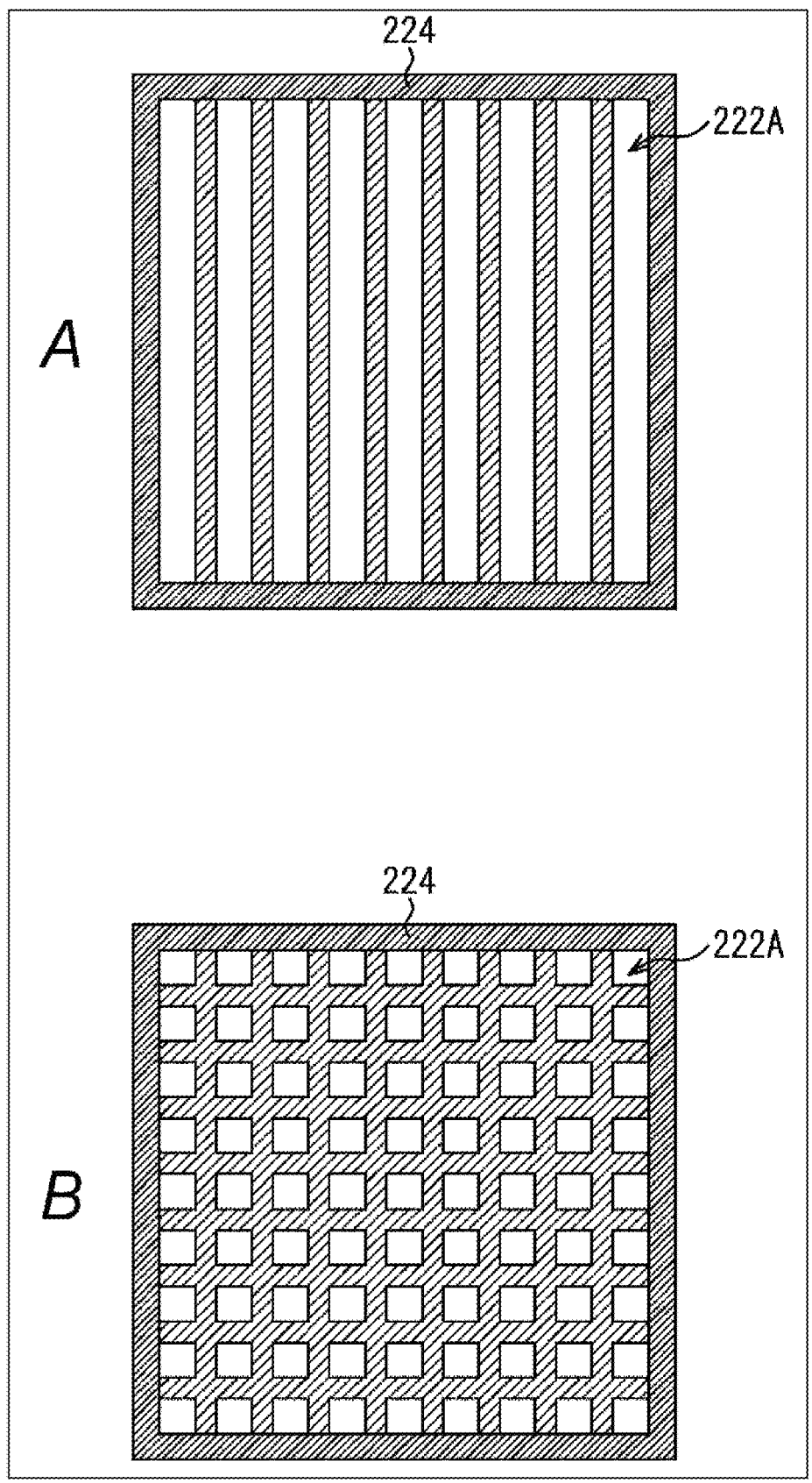
FIG. 9 is a plan view schematically illustrating a positional relationship between a diffraction grating and a reflector.

FIG. 7 is a cross-sectional view schematically illustrating a structural example of an image sensor 100a which is a first embodiment of the image sensor 100 of FIG. 6. FIG. 8 is an enlarged view of a filter layer 102a of the image sensor 100a. FIGS. 9A and 9B are plan views schematically illustrating a positional relationship between a diffraction grating 222A and a reflector 224 in the filter layer 102a.

Note that, although FIG. 7 illustrates only two pixels 201a arranged on a pixel array unit 111 of the image sensor 100a, three or more pixels 201a are arranged in an array in two-dimensional directions in practice.

In each pixel 201a, an on-chip microlens 101, the filter layer 102a, a semiconductor substrate 103, and a wiring layer 104 are stacked in this order from top (the light incidence direction). That is, the image sensor 100a is a back side illuminated image sensor in which the wiring layer 104 is stacked on the semiconductor substrate 103 at the side opposite to the incidence plane thereof.

In the filter layer 102a, an interlayer insulating film 221 which is made of a dielectric, a GMR filter 222a, and an interlayer insulating film 223 which is made of a dielectric are stacked in this order from top.

In the GMR filter 222a, the diffraction grating 222A, a clad layer 222B, and a core layer 222C are stacked in this order from top in the drawing. That is, the GMR filter 222a is provided with the diffraction grating 222A and a clad-core structure which includes the clad layer 222B and the core layer 222C. The clad-core structure is disposed at the side opposite to the incidence plane of the GMR filter 222a with respect to the diffraction grating 222A.

The diffraction grating 222A is, for example, the one-dimensional diffraction grating illustrated in FIG. 9A or the two-dimensional diffraction grating illustrated in FIG. 9B and performs diffraction and interference of incident light (electromagnetic waves) on the incidence plane of the GMR filter 222a.

For example, a metal thin film is used in the diffraction gating 222A. More specifically, for example, a thin film that is made of Al or an alloy containing Al as a main component or Cu or an alloy containing Cu as a main component is used. Alternatively, for example, a dielectric material having a high refractive index or a high refractive index material is used as the diffraction grating 222A.

The thickness of the diffraction grating 222A is, for example, set within the range of 50 nm to 150 nm taking into consideration the performance, the thickness, the manufacturing process and the like of the GMR filter 222a. The grating period Pg of the diffraction grating 222A is, for example, set to satisfy the condition of expression (2) described above. Note that setting the grating period Pg within the range of 200 nm to 600 nm enables the diffraction grating 222A to correspond to light of a wavelength band of ultraviolet light to near infrared light.

For example, SiO2 is used in the clad layer 222B. The thickness of the clad layer 222B is, for example, set to 150 nm or less taking into consideration the performance, the thickness, the manufacturing process and the like of the GMR filter 222a. Note that, as the clad layer 222B becomes thicker, the full width at half maximum of the GMR filter 222a becomes narrower. Further, the clad layer 222B may be omitted (the thickness of the clad layer 222B may be zero).

For example, the core layer 222C includes a waveguide structure or a light-guiding plate structure which uses SiN, tantalum dioxide, titanium oxide, or the like. The thickness of the core layer 222C is, for example, set within the range of 50 nm to 200 nm taking into consideration the performance, the thickness, the manufacturing process and the like of the GMR filter 222a.

Here, Na, Nb, Nc, and Nd are set to satisfy the relationship of expression (1) described above, where Na denotes a refractive index of the interlayer insulating film 221, Nb denotes a refractive index of the clad layer 222B, Nc denotes a refractive index of the core layer 222C, and Nd denotes a refractive index of the interlayer insulating film 223. Note that the magnitude relationship between the refractive index Nb and the refractive index Nd may be any relationship.

Further, as illustrated in FIGS. 7 to 9A and 9B, in each of the pixels 201a, the reflector 224 surrounds the periphery of the clad layer 222B and the periphery of the core layer 222C. For example, the reflector 224 is made of metal that has a refractive index different from at least the refractive index of the core layer 222C and has mirror finishing performed thereon so as to reflect electromagnetic waves. The reflector 224 optically separates the clad layer 222B and the core layer 222C between adjacent pixels 201a. Further, the width of the reflector 224 is, for example, set within the range of 50 nm to 200 nm taking into consideration the performance, the manufacturing process and the like of the GMR filter 222a.

Further, in the filter layer 102a, a light shielding film 225 surrounds the periphery of each pixel 201a near the incidence plane of the semiconductor substrate 103.

In some embodiments, a photodetector (e.g., a photodiode, a phototransistor, a photoconductor) is disposed within the semiconductor substrate. As an illustrative example, in FIG. 7, a photodiode (PD) 231 which constitutes a photoelectric converter is disposed in each pixel 201a within the semiconductor substrate 103. Further, an element separator 232 which has a trench-like shape and extends from the incidence plane of the semiconductor substrate 103 is formed between adjacent pixels 201a. Further, an antireflective film 233 is formed around the incidence plane of the semiconductor substrate 103 and the element separator 232.

An electrode 241 and one or more layers of metal wiring lines 242 are disposed inside the interlayer film of the wiring layer 104.

<Action of Reflector 224>

Figure 10:
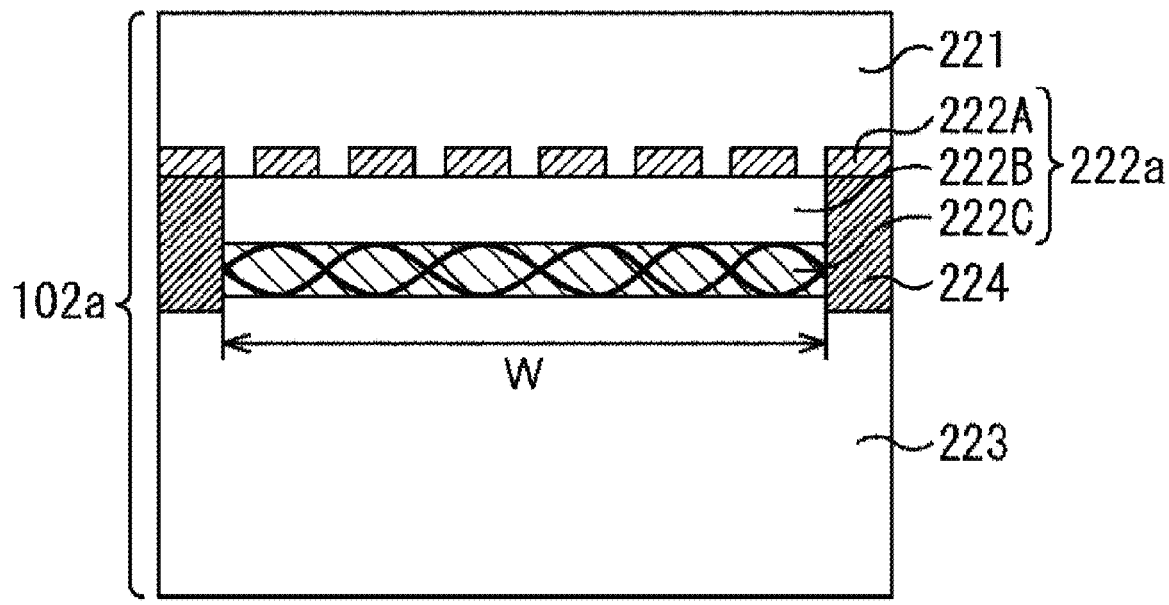
FIG. 10 is a diagram for describing the action of the reflector.

Next, the action of the reflector 224 will be described with reference to FIG. 10.

Light that has entered the diffraction grating 222A through the on-chip microlens 101 and the interlayer insulating film 221 is selectively diffracted by the diffraction grating 222A and enters the core layer 222C through the clad layer 222B. Light of a specific wavelength is confined into the core layer 222C. Here, both ends of the core layer 222C are terminated by the reflector 224. Thus, a standing wave is generated between sides of the reflector 224.

Further, even in a case where the diffraction grating 222A has a small number of grating lines, the GMR filter 222a can obtain a wavelength characteristic equivalent to that of a GMR filter having a large number of grating lines by the standing wave generated in the core layer 222C. Thus, the GMR filter 222a can be downsized. As a result, the image sensor 100a can be downsized.

Further, the reflector 224 can reduce propagation of optical crosstalk through the core layer 222C between adjacent pixels 201a, in particular, between GMR filters 222a having different wavelength characteristics (transmission wavelength bands) and reduce the occurrence of a color mixture.

Note that a spacing W between the sides of the reflector 224 on both ends of the core layer 222C is, for example, set to satisfy a condition of the following expression (3).

$$W = M \times \lambda / Nc \quad (3)$$

Note that $\lambda$ denotes a wavelength of the standing wave generated in the core layer 222C, and M is an integer.

3. Second Embodiment

Next, a second embodiment of the present technology will be described with reference to FIGS. 11 to 13A and 13B.

<Structural Example of Image Sensor>

Figure 11:
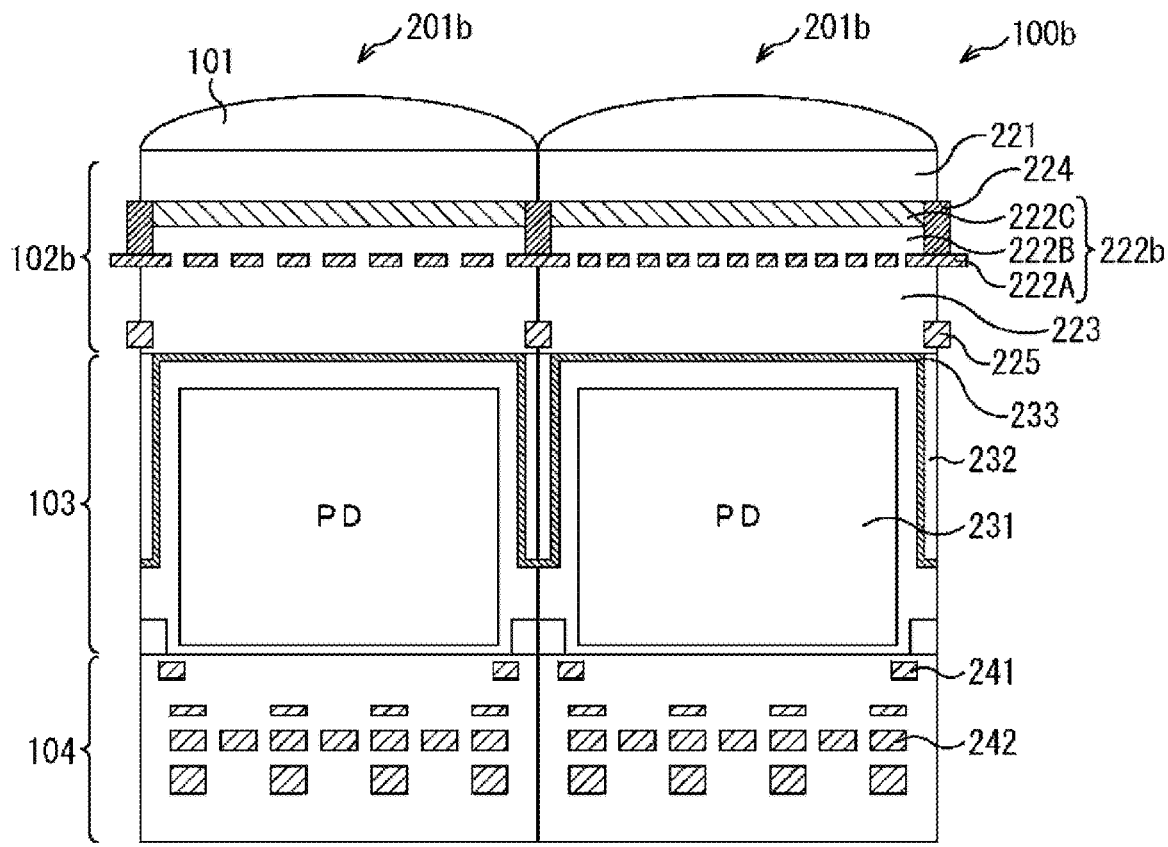
FIG. 11 is a cross-sectional view schematically illustrating a structural example of a second embodiment of the image sensor.
Figure 12:
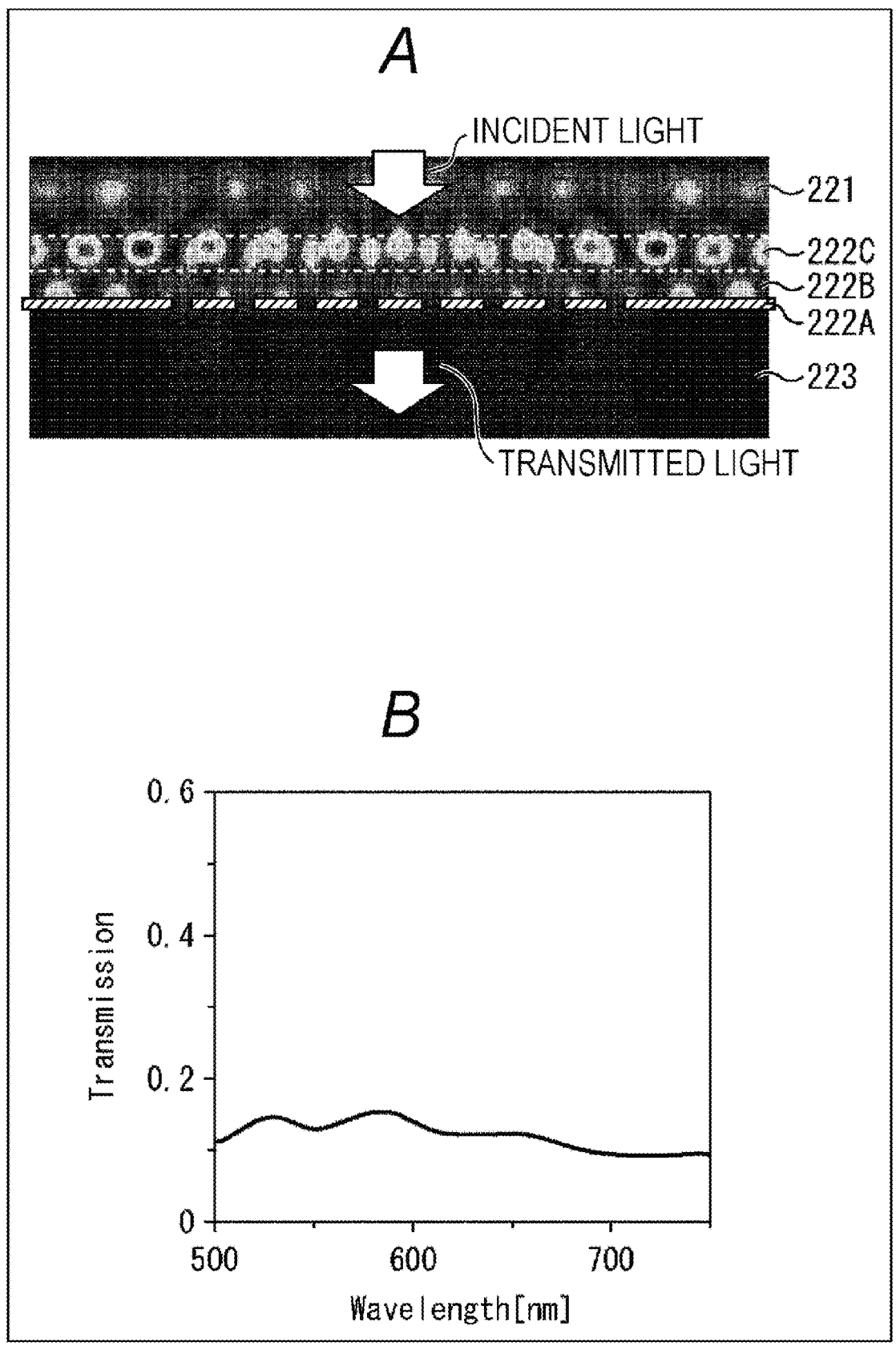
FIG. 12 is a diagram illustrating an example of a wavelength characteristic of a GMR filter in a case where no reflector is provided.
Figure 13:
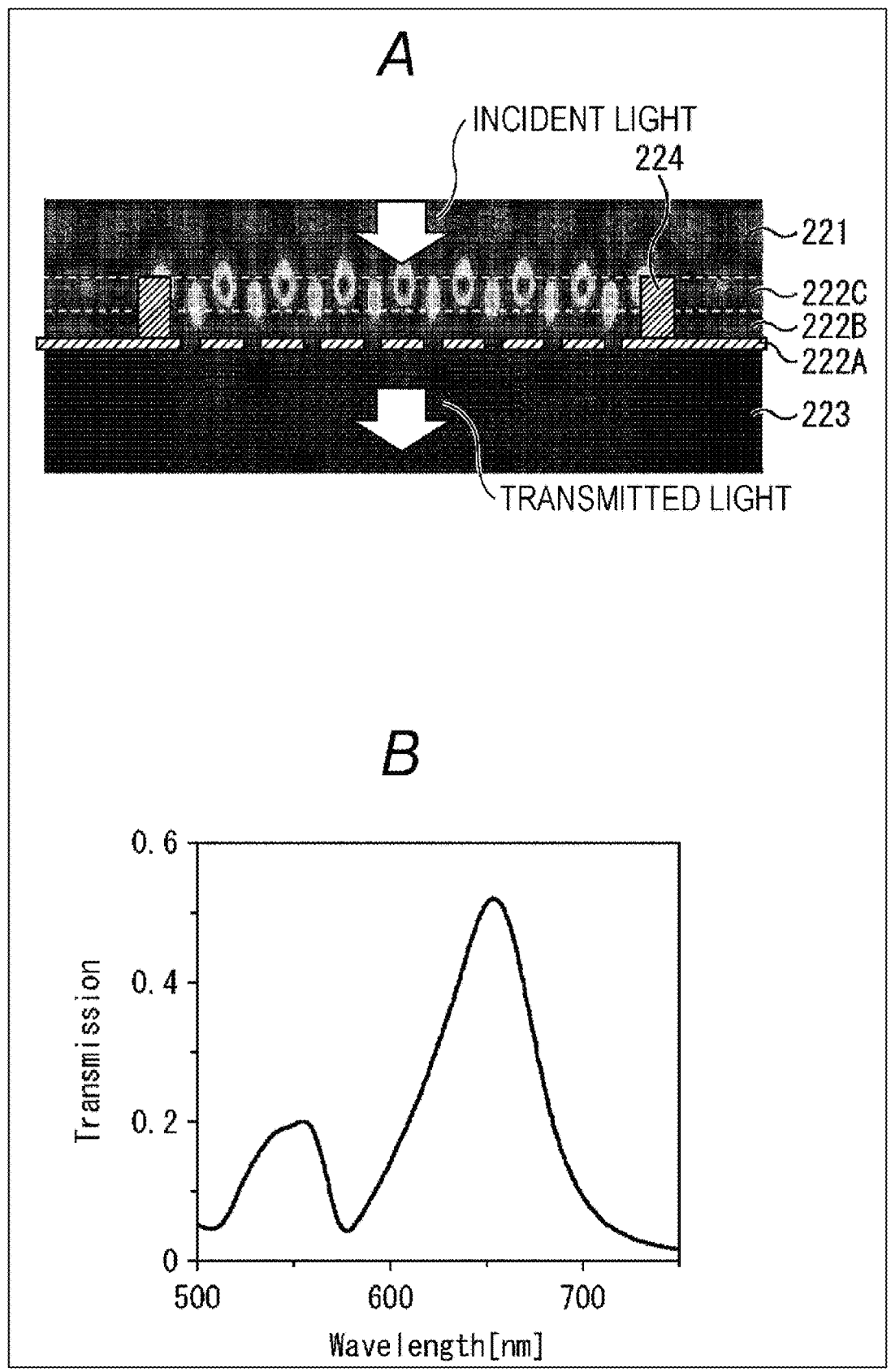
FIG. 13 is a diagram illustrating an example of a wavelength characteristic of a GMR filter in a case where a reflector is provided.

FIG. 11 is a cross-sectional view schematically illustrating a structural example of an image sensor 100b which is a second embodiment of the image sensor 100. Note that in the drawing, a part corresponding to the image sensor 100a of FIG. 7 is denoted by the same reference sign, and description thereof will be appropriately omitted.

The image sensor 100b differs from the image sensor 100a in including a pixel 201b instead of the pixel 201a. The pixel 201b differs from the pixel 201a in including a filter layer 102b instead of the filter layer 102a. The filter layer 102b differs from the filter layer 102a in including a GMR filter 222b instead of the GMR filter 222a and the position of a reflector 224.

Specifically, in the GMR filter 222b, a layer order of layers is opposite to that in the GMR filter 222a. That is, in the GMR filter 222b, a core layer 222C, a clad layer 222B, and a diffraction grating 222A are stacked in this order from top. That is, in the GMR filter 222b, the clad-core structure which includes the clad layer 222B and the core layer 222C is disposed at the incidence plane side of the GMR filter 222b with respect to the diffraction grating 222A. Further, the diffraction grating 222A performs diffraction and interference of incident light on a plane parallel to the incidence plane of the GMR filter 222b.

Further, in each pixel 201b, in a manner similar to that in the pixel 201a, the reflector 224 surrounds the periphery of the core layer 222C and the periphery of the clad layer 222B. Accordingly, the core layer 222C and the clad layer 222B are optically separated between adjacent pixels 201b.

<Concrete Example of Effects of Reflector 224>

Here, a wavelength characteristic of the GMR filter 222b in a case where the reflector 224 is not provided and a wavelength characteristic of the GMR filter 222b in a case where the reflector 224 is provided will be compared with each other with reference to FIGS. 12A, 12B, 13A, and 13B.

FIG. 12A illustrates a distribution of an electric field strength in the GMR filter 222b in the case where the reflector 224 is not provided in a manner similar to that of FIG. 5A. FIG. 12B illustrates the wavelength characteristic of the GMR filter 222b in the case where the reflector 224 is not provided. The horizontal axis represents wavelength, and the vertical axis represents transmittance.

On the other hand, FIG. 13A illustrates a distribution of an electric field strength in the GMR filter 222b in the case where the reflector 224 is provided in a manner similar to that of FIG. 12A. FIG. 13B illustrates the wavelength characteristic of the GMR filter 222b in the case where the reflector 224 is provided in a manner similar to that of FIG. 12B.

As apparent from the comparison between FIGS. 12A and 12B and 13A and 13B, the peak transmission intensity becomes higher and the full width at half maximum of the transmission wavelength band becomes narrower in the case where the reflector 224 is provided. That is, a wavelength characteristic of a narrower band can be obtained by providing the reflector 224.

As described above, in the image sensor 100a or the image sensor 100b, it is possible to downsize the GMR filter 222a or the GMR filter 222b while maintaining an excellent wavelength characteristic of the GMR filter 222a or the GMR filter 222b by providing the reflector 224. As a result, it is possible to downsize the image sensor 100a or the image sensor 100b while maintaining an excellent quality of an image obtained by the image sensor 100a or the image sensor 100b.

4. Third Embodiment

Next, a third embodiment of the present technology will be described with reference to FIGS. 14 and 15. The third embodiment differs from the first embodiment in the position of a reflector.

Figure 14:
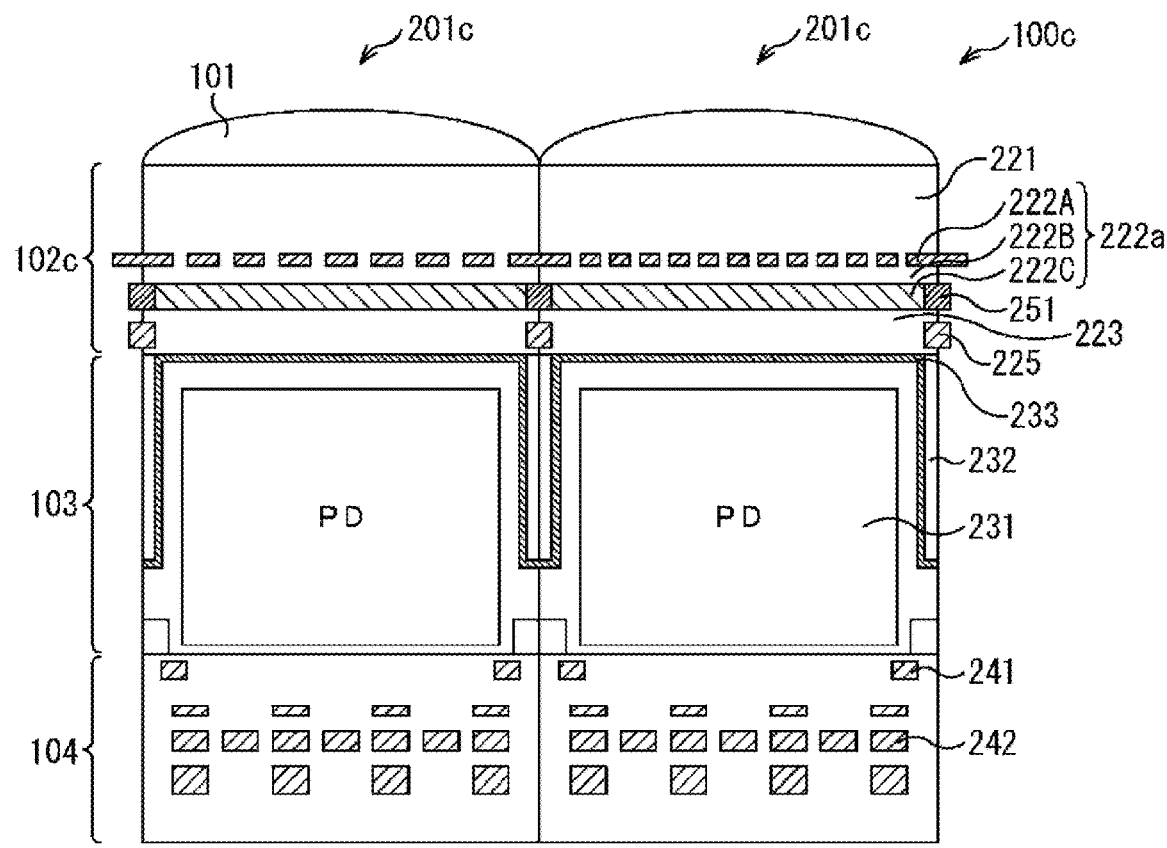
FIG. 14 is a cross-sectional view schematically illustrating a structural example of a third embodiment of the image sensor.

FIG. 14 is a cross-sectional view schematically illustrating a structural example of an image sensor 100c which is a third embodiment of the image sensor 100. FIG. 15 is an enlarged view of a filter layer 102c of the image sensor 100c. Note that, in FIG. 14, a part corresponding to the image sensor 100a of FIG. 7 is denoted by the same reference sign, and description thereof will be appropriately omitted. Further, in FIG. 15, a part corresponding to the filter layer 102a of FIG. 8 is denoted by the same reference sign, and description thereof will be omitted.

The image sensor 100c differs from the image sensor 100a in including a pixel 201c instead of the pixel 201a. The pixel 201c differs from the pixel 201a in including a filter layer 102c instead of the filter layer 102a. The filter layer 102c differs from the filter layer 102a in including a reflector 251 instead of the reflector 224.

Differently from the reflector 224, the reflector 251 surrounds only the periphery of a core layer 222C in each pixel 201c and does not surround a clad layer 222B. That is, only the core layer 222C is optically separated by the reflector 251, and the clad layer 222B is not separated between adjacent pixels 201c.

Figure 15:
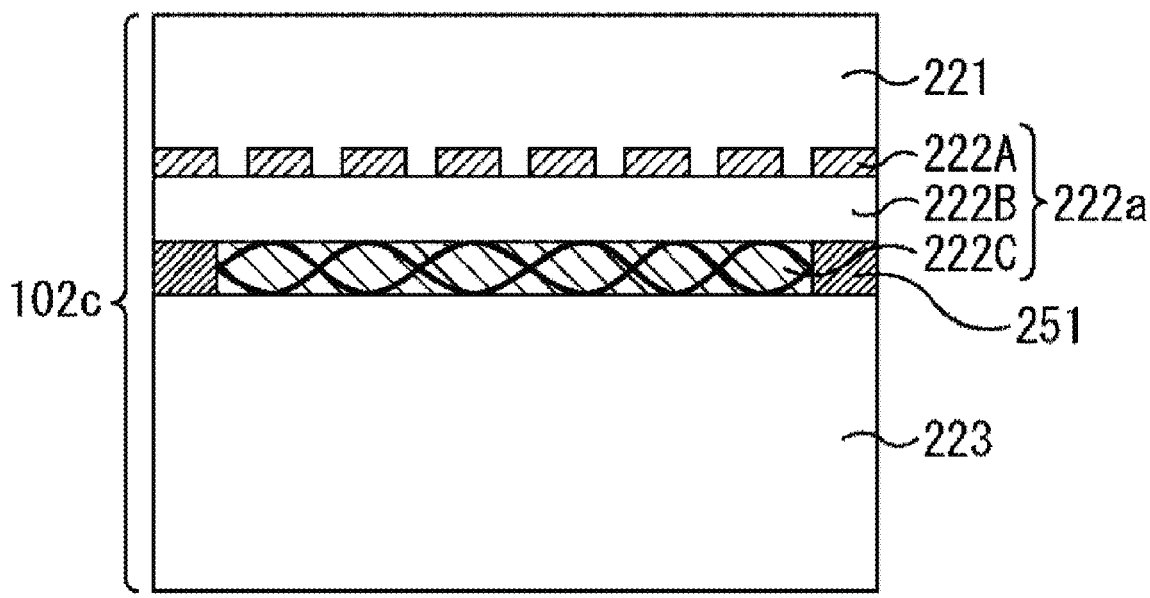
FIG. 15 is an enlarged view of a filter part of FIG. 14.

Also in a case where the reflector 251 surrounds only the core layer 222C in this manner, a standing wave is generated in the core layer 222C as illustrated in FIG. 15. Thus, it is possible to obtain effects substantially similar to those of the first and second embodiments.

5. Fourth Embodiment

Next, a fourth embodiment of the present technology will be described with reference to FIG. 16. The fourth embodiment differs from the second embodiment in a range in which a reflector is disposed.

Figure 16:
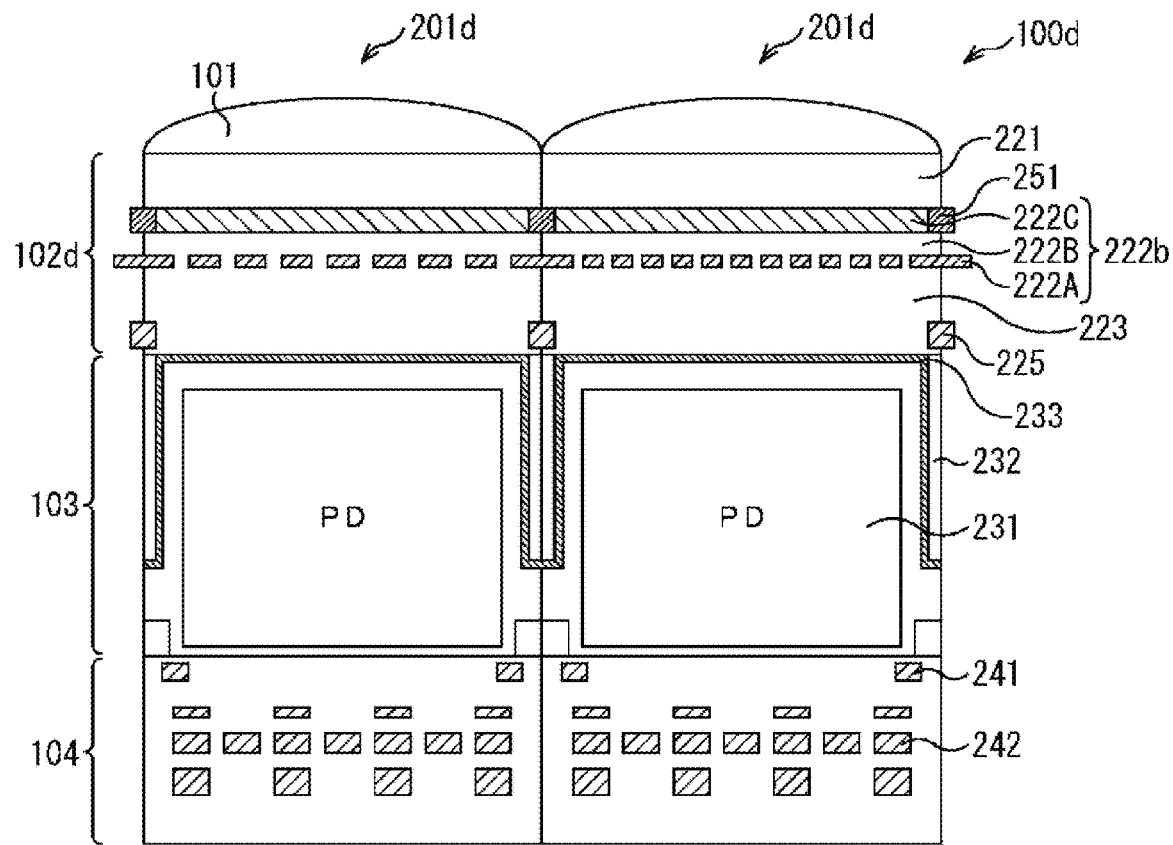
FIG. 16 is a cross-sectional view schematically illustrating a structural example of a fourth embodiment of the image sensor.

FIG. 16 is a cross-sectional view schematically illustrating a structural example of an image sensor 100d which is a fourth embodiment of the image sensor 100. Note that, in FIG. 16, a part corresponding to the image sensor 100b of FIG. 11 and the image sensor 100c of FIG. 14 is denoted by the same reference sign, and description thereof will be appropriately omitted.

The image sensor 100d differs from the image sensor 100b in including a pixel 201d instead of the pixel 201b. The pixel 201d differs from the pixel 201b in including a filter layer 102d instead of the filter layer 102b. The filter layer 102d differs from the filter layer 102b in including a reflector 251 instead of the reflector 224.

In a manner similar to that of the reflector 251 of the image sensor 100c of FIG. 14, the reflector 251 surrounds only the periphery of a core layer 222C in each pixel 201d and does not surround a clad layer 222B. That is, only the core layer 222C is optically separated by the reflector 251, and the clad layer 222B is not separated between adjacent pixels 201d.

Also in a case where the reflector 251 surrounds only the core layer 222C in this manner, it is possible to obtain effects substantially similar to those of the first and second embodiments in a manner similar to that of the third embodiment.

6. Fifth Embodiment

Next, a fifth embodiment of the present technology will be described with reference to FIG. 17. The fifth embodiment differs from the third embodiment in the structure of a reflector.

Figure 17:
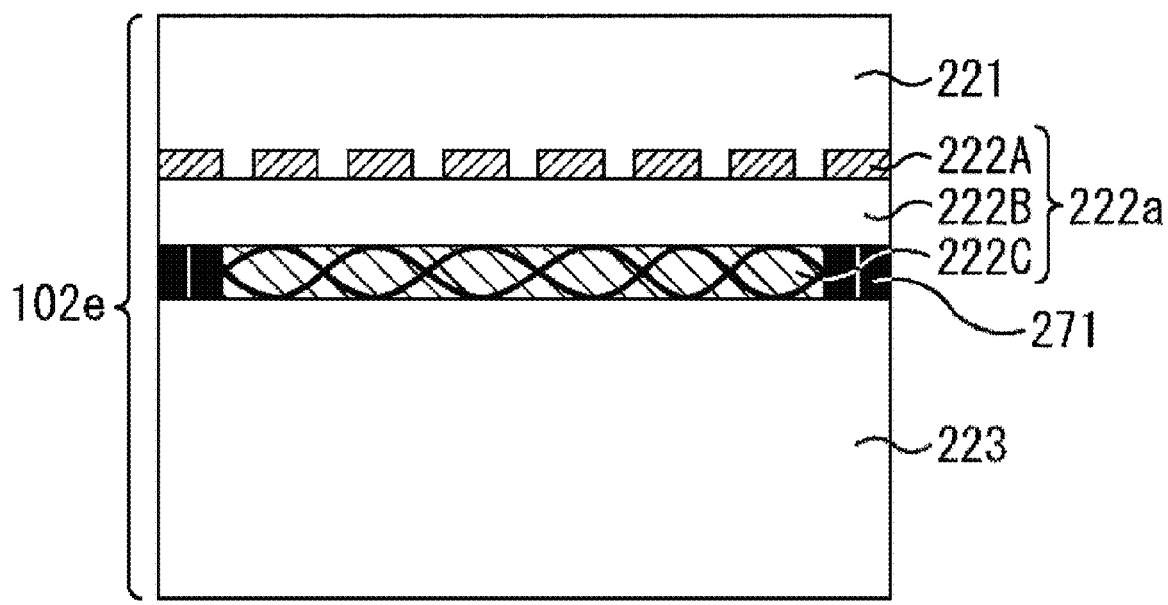
FIG. 17 is an enlarged view of a filter part of a fifth embodiment of the image sensor.

FIG. 17 is a cross-sectional view schematically illustrating a structural example of a filter layer 102e of an image sensor 100e (not illustrate) which is a fifth embodiment of the image sensor 100. Note that in FIG. 17, a part corresponding to the filter layer 102c of FIG. 15 is denoted by the same reference sign, and description thereof will be appropriately omitted.

The filter layer 102e differs from the filter layer 102c in including a reflector 271 instead of the reflector 251.

The reflector 271 has a Bragg mirror structure. Also in a case where the reflector 271 having the Bragg mirror structure is used in this manner, it is possible to obtain effects substantially similar to those of the above embodiments.

Note that in the image sensor 100d of FIG. 16, the reflector 271 having the Bragg mirror structure may be provided instead of the reflector 251.

7. Sixth Embodiment

Next, a sixth embodiment of the present technology will be described with reference to FIGS. 18 and 19. The sixth embodiment differs from the above embodiments in the position and the material of a reflector.

Figure 18:
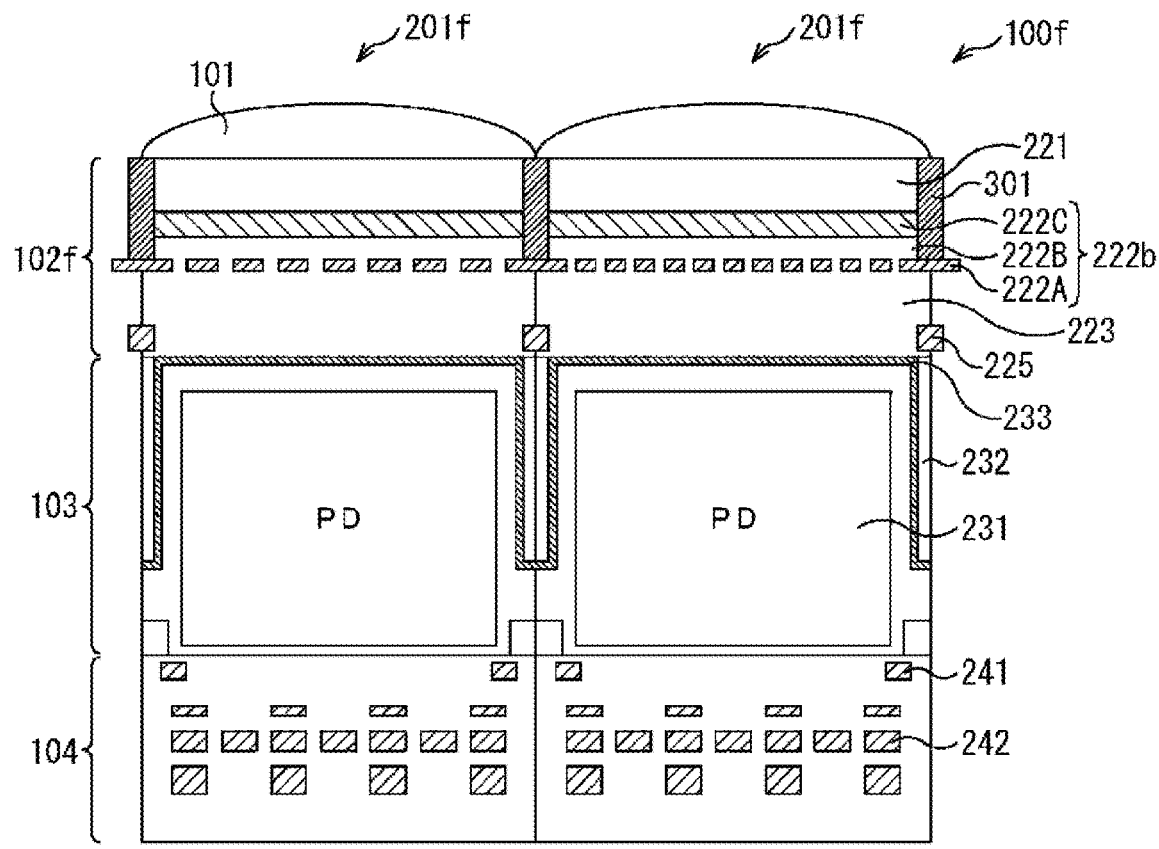
FIG. 18 is a cross-sectional view schematically illustrating a structural example of a sixth embodiment of the image sensor.
Figure 19:
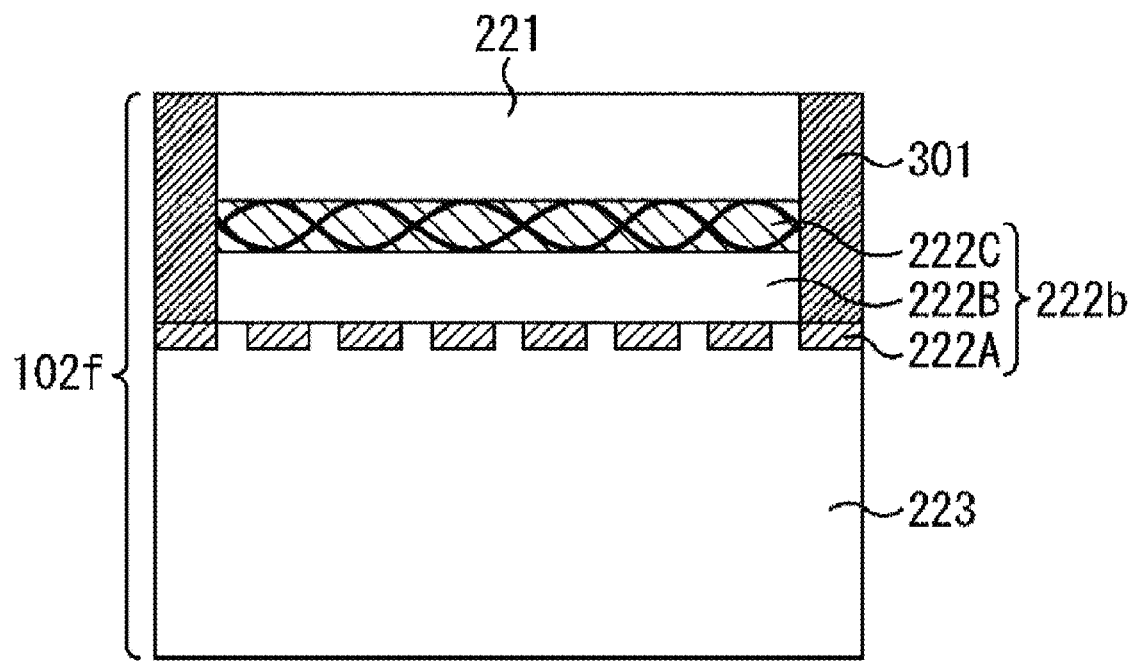
FIG. 19 is an enlarged view of a filter part of FIG. 18.

FIG. 18 is a cross-sectional view schematically illustrating a structural example of an image sensor 100f which is a sixth embodiment of the image sensor 100. FIG. 19 is an enlarged view of a filter layer 102f of the image sensor 100f. Note that, in FIGS. 18 and 19, a part corresponding to the image sensor 100b of FIG. 11 is denoted by the same reference sign, and description thereof will be appropriately omitted.

The image sensor 100f differs from the image sensor 100b in including a pixel 201f instead of the pixel 201b. The pixel 201f differs from the pixel 201b in including a filter layer 102f instead of the filter layer 102b. The filter layer 102f differs from the filter layer 102b in including a reflector 301 instead of the reflector 224.

The reflector 301 includes, for example, a dielectric mirror obtained by mirror finishing a dielectric having a higher reflectivity than a core layer 222C (e.g., a silicon nitride thin film, TiO2, or the like). For example, the reflector 301 is formed by filling a trench which extends from an incidence plane of the filter layer 102f up to an incidence plane of a diffraction grating 222A and surrounds the periphery of an interlayer insulating film 221, the periphery of the core layer 222C, and the periphery of a clad layer 222B of each pixel 201f with a dielectric having a high refractive index.

Also in a case where the reflector 301 is a dielectric mirror having a high refractive index in this manner, it is possible to obtain effects substantially similar to those of the above embodiments.

Note that, for example, a dielectric mirror that uses a dielectric having a lower reflectivity than the core layer 222C (e.g., a silicon oxide film or the like) may be used as the reflector 301.

8. Seventh Embodiment

Next, a seventh embodiment of the present technology will be described with reference to FIGS. 20 and 21. The seventh embodiment differs from the sixth embodiment in the structure or the material of a reflector.

Figure 20:
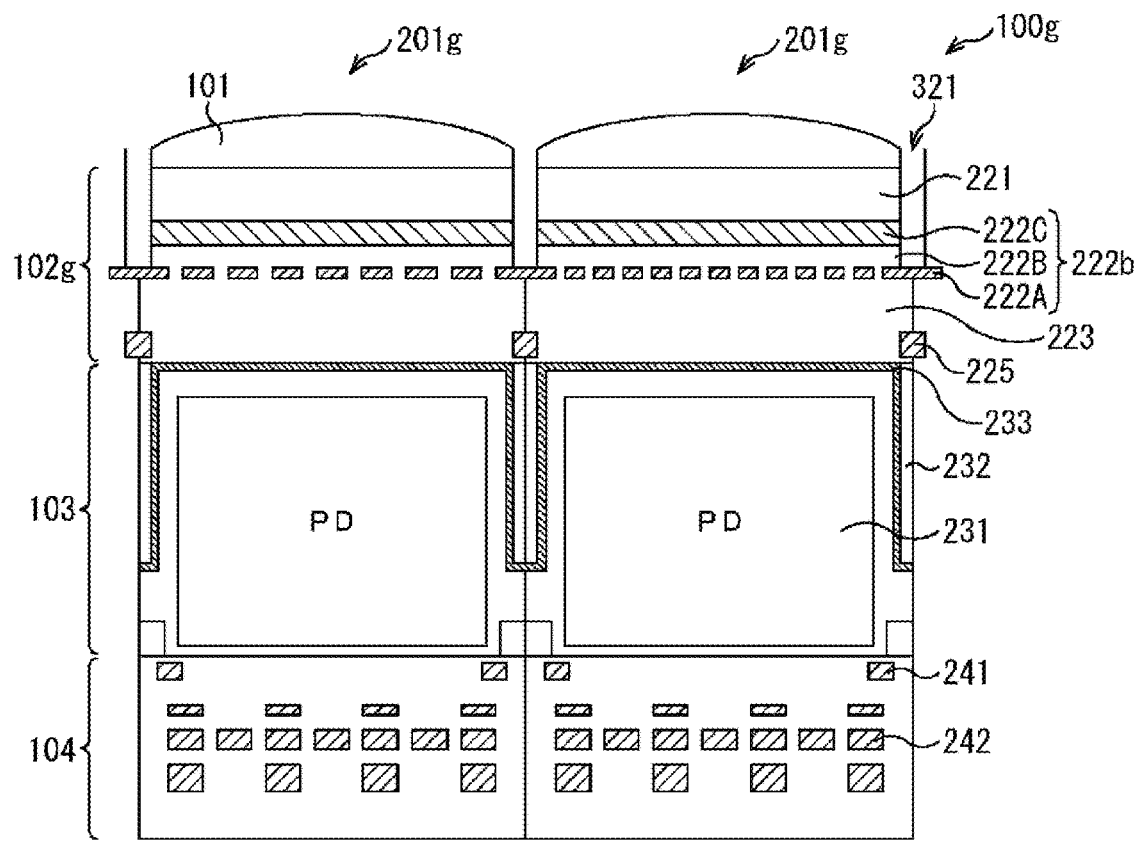
FIG. 20 is a cross-sectional view schematically illustrating a structural example of a seventh embodiment of the image sensor.
Figure 21:
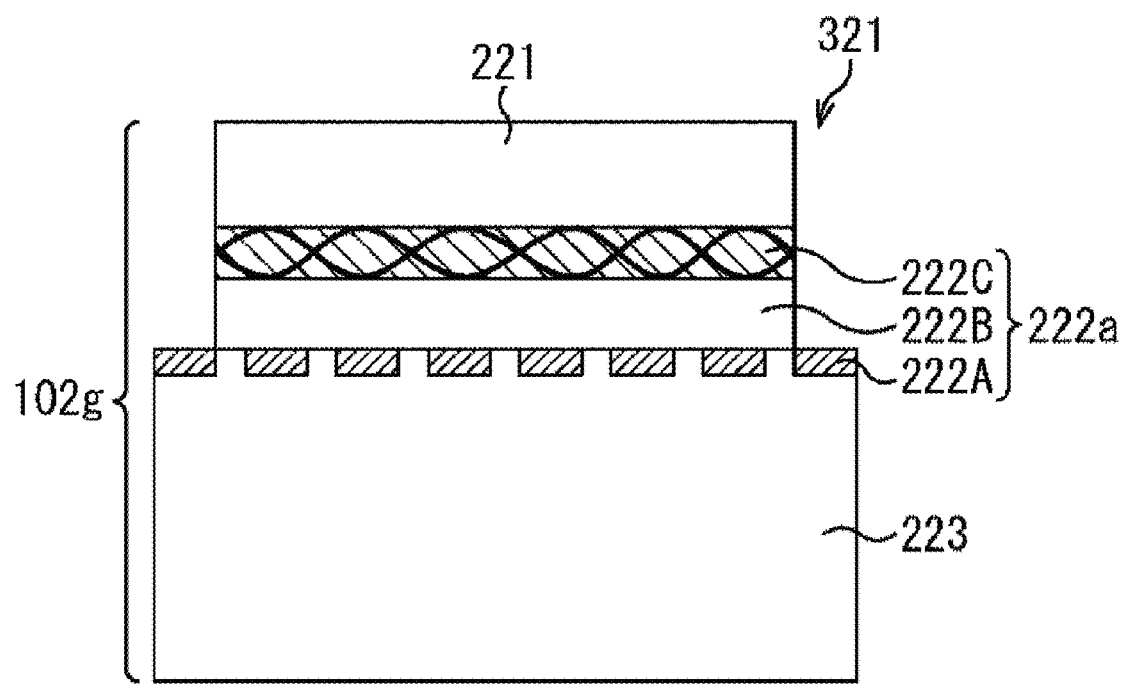
FIG. 21 is an enlarged view of a filter part of FIG. 20.

FIG. 20 is a cross-sectional view schematically illustrating a structural example of an image sensor 100g which is a seventh embodiment of the image sensor 100. FIG. 21 is an enlarged view of a filter layer 102g of the image sensor 100g. Note that, in FIG. 20, a part corresponding to the image sensor 100f of FIG. 18 is denoted by the same reference sign, and description thereof will be appropriately omitted. Further, in FIG. 21, a part corresponding to the filter layer 102f of FIG. 19 is denoted by the same reference sign, and description thereof will be appropriately omitted.

The image sensor 100g differs from the image sensor 100f in including a pixel 201g instead of the pixel 201f. The pixel 201g differs from the pixel 201f in including a filter layer 102g instead of the filter layer 102f. The filter layer 102g differs from the filter layer 102f in including a reflector 321 instead of the reflector 301.

The reflector 321 includes a trench (air gap) which extends from an incidence plane of the filter layer 102g up to an incidence plane of a diffraction grating 222A and surrounds the periphery of an interlayer insulating film 221, the periphery of a core layer 222C, and the periphery of a clad layer 222B of each pixel 201g.

Note that the trench may be filled with a material having a lower refractive index than a silicon oxide film (low refractive index material).

Also in a case where the reflector 321 is an air gap or a low refractive index material in this manner, it is possible to obtain effects substantially similar to those of the above embodiments.

9. Eighth Embodiment

Next, an eighth embodiment of the present technology will be described with reference to FIG. 22. The eighth embodiment differs from the other embodiments in that clad-core structures are disposed on the respective upper and lower sides of a diffraction grating 222A.

Figure 22:
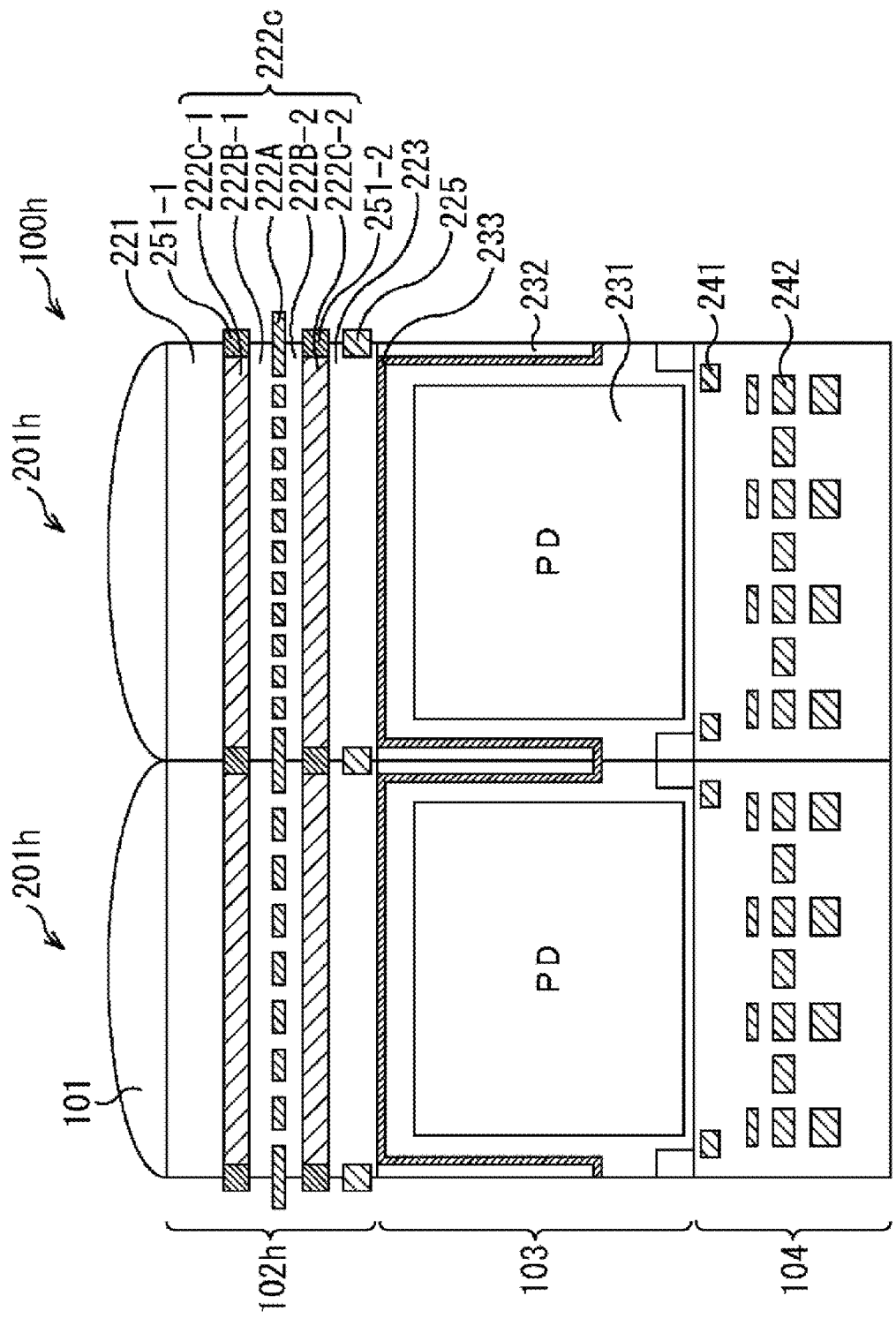
FIG. 22 is a cross-sectional view schematically illustrating a structural example of an eighth embodiment of the image sensor.
Figure 23:
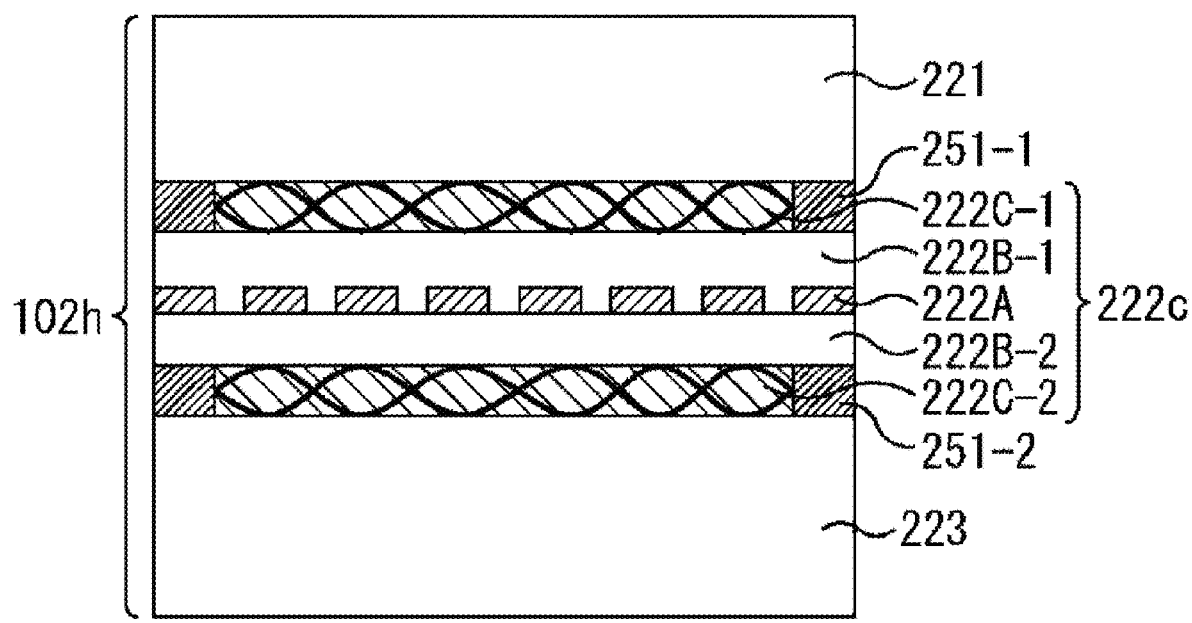
FIG. 23 is an enlarged view of a filter part of FIG. 22.

FIG. 22 is a cross-sectional view schematically illustrating a structural example of an image sensor 100h which is an eight embodiment of the image sensor 100. Note that, in FIG. 22, a part corresponding to the image sensor 100c of FIG. 14 is denoted by the same reference sign, and description thereof will be appropriately omitted.

The image sensor 100h differs from the image sensor 100c in including a pixel 201h instead of the pixel 201c. The pixel 201h differs from the pixel 201c in including a filter layer 102h instead of the filter layer 102c. The filter layer 102h differs from the filter layer 102c in including a GMR filter 222c instead of the GMR filter 222a and including a reflector 251-1 and a reflector 251-2.

In the GMR filter 222c, a core layer 222C-1, a clad layer 222B-1, the diffraction grating 222A, a clad layer 222B-2, and a core layer 222C-2 are stacked in this order from top. That is, in the GMR filter 222c, a clad-core structure that includes the clad layer 222B-1 and the core layer 222C-1 and a clad-core structure that includes the clad layer 222B-2 and the core layer 222C-2 are disposed on and under the diffraction grating 222A with the diffraction grating 222A interposed therebetween.

Further, in each pixel 201h, the reflector 251-1 surrounds the periphery of the core layer 222C-1, and the reflector 251-2 surrounds the periphery of the core layer 222C-2. That is, the core layer 222C-1 is optically separated by the reflector 251-1 and the core layer 222C-2 is optically separated by the reflector 251-2 between adjacent pixels 201h.

In this manner, the clad-core structure may have a two-layer structure in the GMR filter 222c. Further, it is possible to obtain effects similar to those of the above embodiments by the reflectors 251 surrounding the respective core layers 222C.

Note that, for example, in a manner similar to that of the first and second embodiments, the reflector 251-1 may surround also the periphery of the clad layer 222B-1, and the reflector 251-2 may surround also the periphery of the clad layer 222B-2.

Further, for example, in the reflector 251-1 and the reflector 251-2, the Bragg mirror structure may be used as with the fifth embodiment, a dielectric mirror having a high refractive index or a low refractive index may be used as with the sixth embodiment, or an air gap or a low refractive index material may be used as with the seventh embodiment.

10. Image Sensor Manufacturing Method

Figure 24:
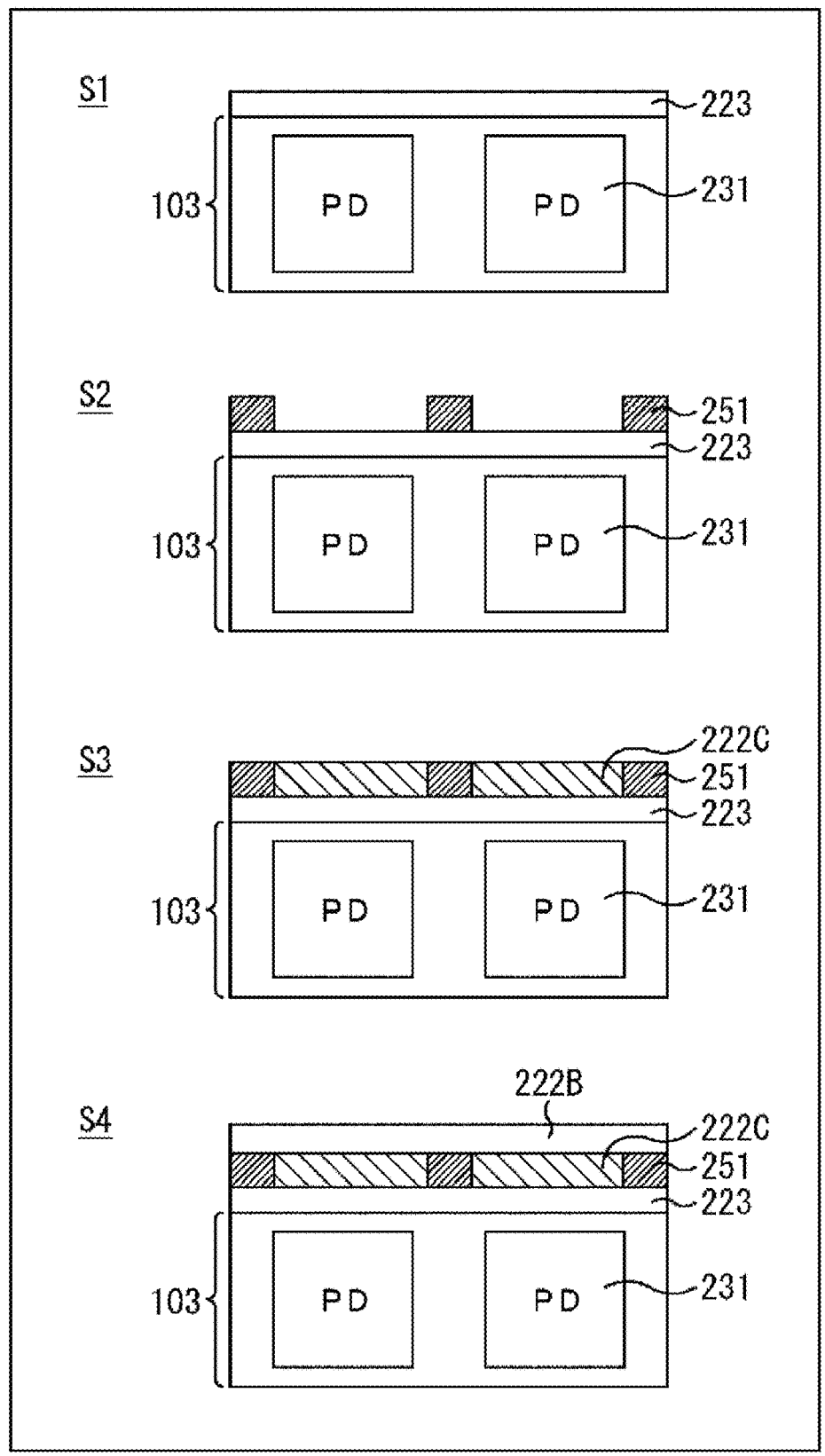
FIG. 24 is a diagram for describing a method for manufacturing the image sensor.
Figure 25:
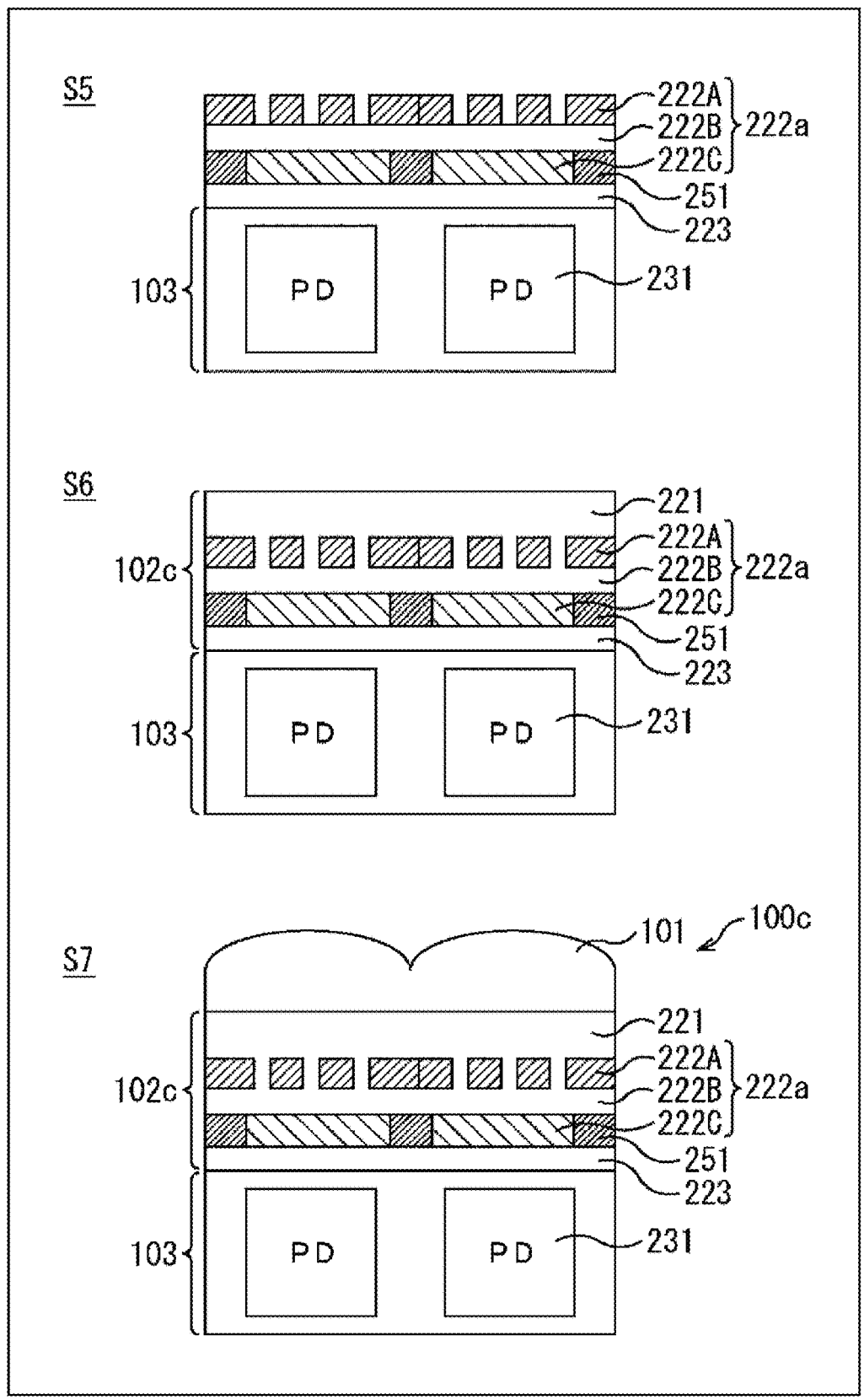
FIG. 25 is a diagram for describing the method for manufacturing the image sensor.

Next, an example of steps from a step of forming the filter layer 102c in a method for manufacturing the image sensor 100c of FIG. 14 will be described with reference to FIGS. 24 and 25. Note that FIGS. 24 and 25 illustrate only a part necessary for description of the manufacture of the filter layer 102c, and the other part will be appropriately omitted. Further, description of a step of forming the light shielding film 225 of the filter layer 102c will be omitted.

In step S1, an oxide film is formed on the incidence plane of the semiconductor substrate 103 on which the PDs 231 are formed and then flattened. As a result, the interlayer insulating film 223 is formed.

In step S2, a metal is formed on the surface of the interlayer insulating film 223 and then processed so as to surround the periphery of each pixel 201c. Further, mirror finishing is performed on the processed metal. As a result, the reflector 251 is formed.

In step S3, for example, a member such as SiN, tantalum dioxide, or titanium oxide is filled inside the reflector 251. As a result, the core layer 222C is formed.

In step S4, an oxide film (e.g., SiO2) is formed on the surface of the core layer 222C and the surface of the reflector 251 and then flattened. As a result, the clad layer 222B is formed.

In step S5, a metal is formed on the surface of the clad layer 222B and then processed into a one-dimensional or two-dimensional grid-like form. As a result, the diffraction grating 222A is formed, and the GMR filter 222a is formed.

In step S6, an oxide film is filled between the grating lines of the diffraction grating 222A and also formed on the surface of the diffraction grating 222A, and then flattened. As a result, the interlayer insulating film 221 is formed.

In step S7, the on-chip microlens 101 is formed on the surface of the interlayer insulating film 221.

In the above manner, the on-chip microlens 101 and the filter layer 102c of the image sensor 100c are formed.

11. Application Examples

Next, application examples of the present technology will be described.

<Application Examples of Present Technology>

Figure 26:
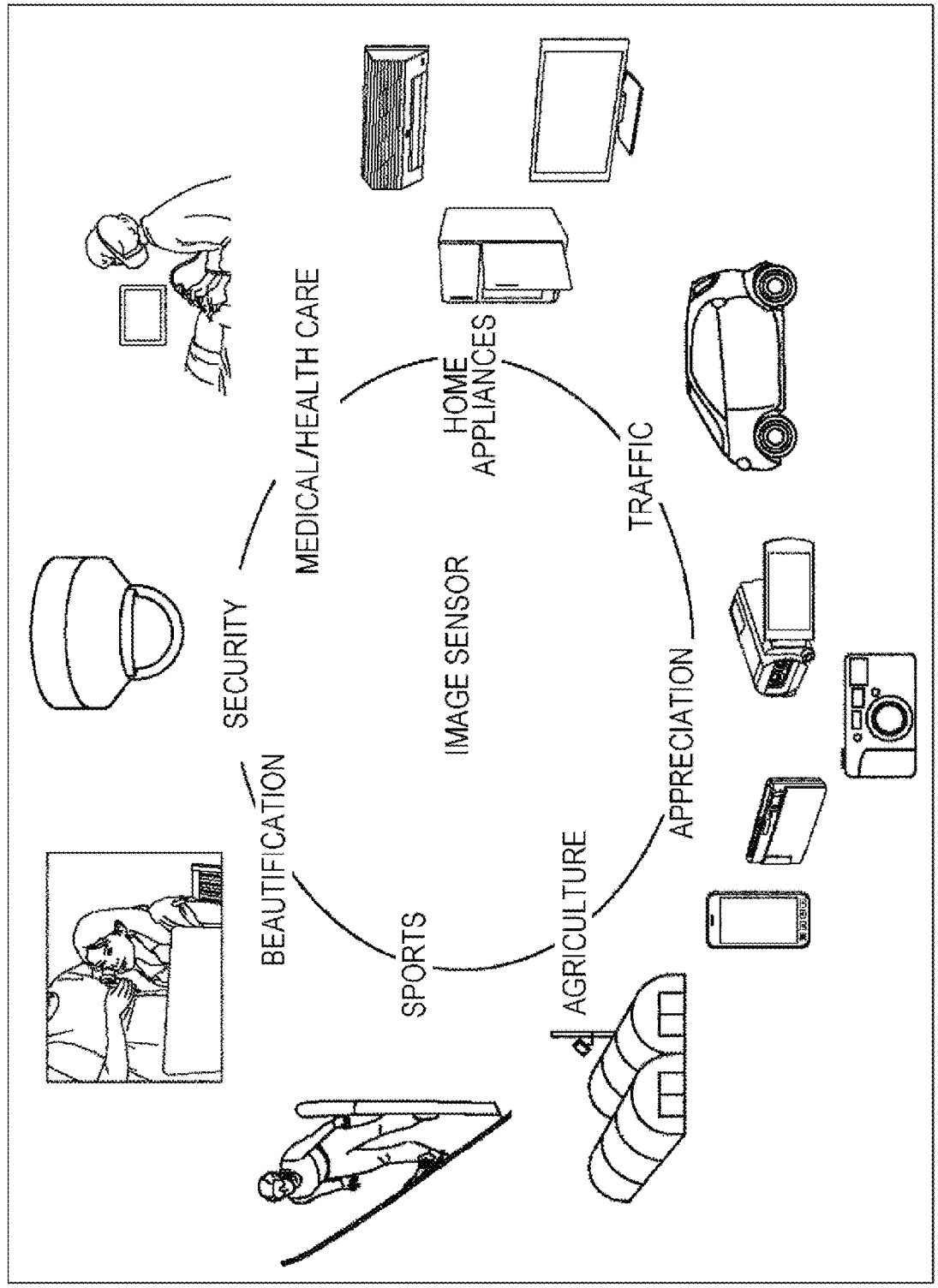
FIG. 26 is a diagram illustrating application examples of the present technology.

For example, as illustrated in FIG. 26, the present technology can be applied to various cases of sensing light such as visible light, infrared light, ultraviolet light, or an X-ray.

An apparatus that captures an image used for appreciation such as a digital camera or a portable device with a camera function.

An apparatus used for traffic such as an onboard sensor which captures images of the front side, the rear side, the surroundings, and the inside of an automobile, a monitoring camera which monitors a traveling vehicle and a road, or a range sensor which measures the distance between vehicles for safe driving such as an automatic stop and for recognition of a state of a driver.

An apparatus used in home appliances such as a TV, a refrigerator, and an air conditioner for capturing a gesture of a user and performing a device operation in accordance with the gesture.

An apparatus used for medical care or health care such as an endoscope or an apparatus that performs angiography by receiving infrared light.

An apparatus used for security such as a surveillance camera for crime prevention or a camera for personal identification.

An apparatus used for beautification such as a skin measuring device which captures an image of the skin or a microscope which captures an image of the scalp.

An apparatus used for sports such as an action camera or a wearable camera for supports.

An apparatus used for agriculture such as a camera for monitoring a state of the field or crops.

Hereinbelow, more concrete application examples will be described.

For example, it is possible to adjust a wavelength band of light detected by each pixel of the image sensor 100 (hereinbelow, referred to as a detection band) by adjusting the transmission band of the GMR filter 222 in the filter layer 102 of the image sensor 100 in each of the above embodiments. Further, it is possible to use the image sensor 100 for various purposes by appropriately setting the detection band of each pixel.

For example, FIG. 27 illustrates examples of the detection band in detection of umami and the degree of freshness of food.

For example, in detection of myoglobin which indicates an umami ingredient of tuna, beef, or the like, the peak wavelength of the detection band is within the range of 580 nm to 630 nm, and the full width at half maximum thereof is within the range of 30 nm to 50 nm. In detection of oleic acid which indicates the degree of freshness of tuna, beef, or the like, the peak wavelength of the detection band is 980 nm, and the full width at half maximum thereof is within the range of 50 nm to 100 nm. In detection of chlorophyll which indicates the degree of freshness of green vegetables such as komatsuna, the peak wavelength of the detection band is within the range of 650 nm to 700 nm, and the full width at half maximum thereof is within the range of 50 nm to 100 nm.

FIG. 28 illustrates examples of the detection band in detection of a sugar content and a water content of fruit.

For example, in detection of a flesh optical path length which indicates a sugar content of Raiden which is one kind of melon, the peak wavelength of the detection band is 880 nm, and the full width at half maximum thereof is within the range of 20 nm to 30 nm. In detection of sucrose which indicates a sugar content of Raiden, the peak wavelength of the detection band is 910 nm, and the full width at half maximum thereof is within the range of 40 nm to 50 nm. In detection of sucrose which indicates a sugar content of Raiden Red which is another kind of melon, the peak wavelength of the detection band is 915 nm, and the full width at half maximum thereof is within the range of 40 nm to 50 nm. In detection of a water content which indicates a sugar content of Raiden Red, the peak wavelength of the detection band is 955 nm, and the full width at half maximum thereof is within the range of 20 nm to 30 nm.

In detection of sucrose which indicates a sugar content of apple, the peak wavelength of the detection band is 912 nm, and the full width at half maximum thereof is within the range of 40 nm to 50 nm. In detection of water which indicates a water content of mandarin orange, the peak wavelength of the detection band is 844 nm, and the full width at half maximum thereof is 30 nm. In detection of sucrose which indicates a sugar content of mandarin orange, the peak wavelength of the detection band is 914 nm, and the full width at half maximum thereof is within the range of 40 nm to 50 nm.

FIG. 29 illustrates examples of the detection band in separation of plastics.

For example, in detection of poly ethylene terephthalate (PET), the peak wavelength of the detection band is 1669 nm, and the full width at half maximum thereof is within the range of 30 nm to 50 nm. In detection of poly styrene (PS), the peak wavelength of the detection band is 1688 nm, and the full width at half maximum thereof is within the range of 30 nm to 50 nm. In detection of poly ethylene (PE), the peak wavelength of the detection band is 1735 nm, and the full width at half maximum thereof is within the range of 30 nm to 50 nm. In detection of poly vinyl chloride (PVC), the peak wavelength of the detection band is within the range of 1716 nm to 1726 nm, and the full width at half maximum thereof is within the range of 30 nm to 50 nm. In detection of polypropylene (PP), the peak wavelength of the detection band is within the range of 1716 nm to 1735 nm, and the full width at half maximum thereof is within the range of 30 nm to 50 nm.

Further, for example, the present technology can be applied to cut flower freshness management.

Further, for example, the present technology can be applied to inspection of foreign substances mixed in food. For example, the present technology can be applied to detection of foreign substances such as a skin, a shell, a stone, a leaf, a branch, and a piece of wood mixed in nuts such as almond and walnut or fruit such as blueberry. Further, for example, the present technology can be applied to detection of foreign substances such as a piece of plastic mixed in processed food, drink, or the like.

Further, for example, the present technology can be applied to detection of a normalized difference vegetation index (NDVI) which is an index of vegetation.

Further, for example, the present technology can be applied to detection of a human on the basis of one or both of a spectroscopic shape near a wavelength of 580 nm derived from a hemoglobin of the skin of a human and a spectroscopic shape near a wavelength of 960 nm derived from a melanin pigment contained in the skin of a human.

Further, for example, the present technology can be applied to forgery prevention and surveillance for living body detection (biometrics), a user interface, a sign, and the like.

<Application Example to Electronic Device>

Figure 30:
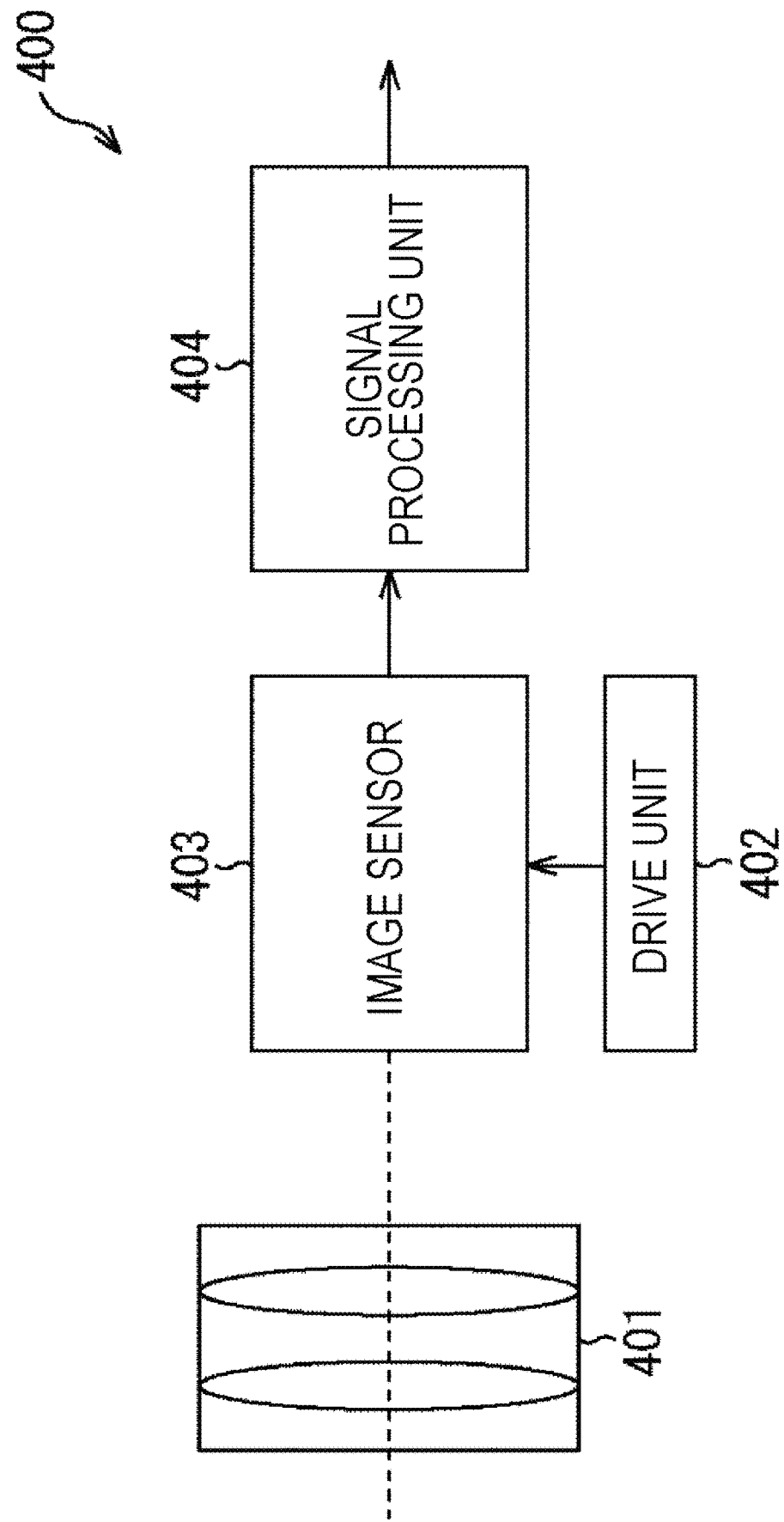
FIG. 30 is a block diagram illustrating a configuration example of an electronic device.

FIG. 30 illustrates a configuration example of an electronic device to which the present technology is applied.

An electronic device 400 is provided with an optical system configuration unit 401, a drive unit 402, an image sensor 403, and a signal processing unit 404.

The optical system configuration unit 401 includes an optical lens and causes an optical image of a subject to enter the image sensor 403. The drive unit 402 controls driving of the image sensor 403 by generating and outputting various timing signals relating to driving inside the image sensor 403. The signal processing unit 404 performs predetermined signal processing on an image signal output from the image sensor 403 and executes processing corresponding to a result of the signal processing. Further, the signal processing unit 404 outputs an image signal as the result of signal processing to the subsequent stage, and, for example, records the image signal in a recording medium such as a solid memory or transfers the image signal to a predetermined server through a predetermined network.

Here, using the image sensor 100 of each of the above embodiments as the image sensor 403 makes it possible to achieve downsizing of the electronic device 400 and enhancement of the quality of an image captured.

<Application Example to Imaging Module>

Further, the present technology can be applied to an imaging module used in various electronic devices such as an imaging device. The imaging module is provided with, for example, the image sensor 100, an optical system (e.g., a lens or the like) which forms an image of a subject onto the image sensor 100, and a signal processing unit (e.g., a DSP) which processes a signal output from the image sensor 100.

<Application Example to Endoscopic Surgery System>

Further, for example, the technology according to an embodiment of the present disclosure may be applied to an endoscopic surgery system.

Figure 31:
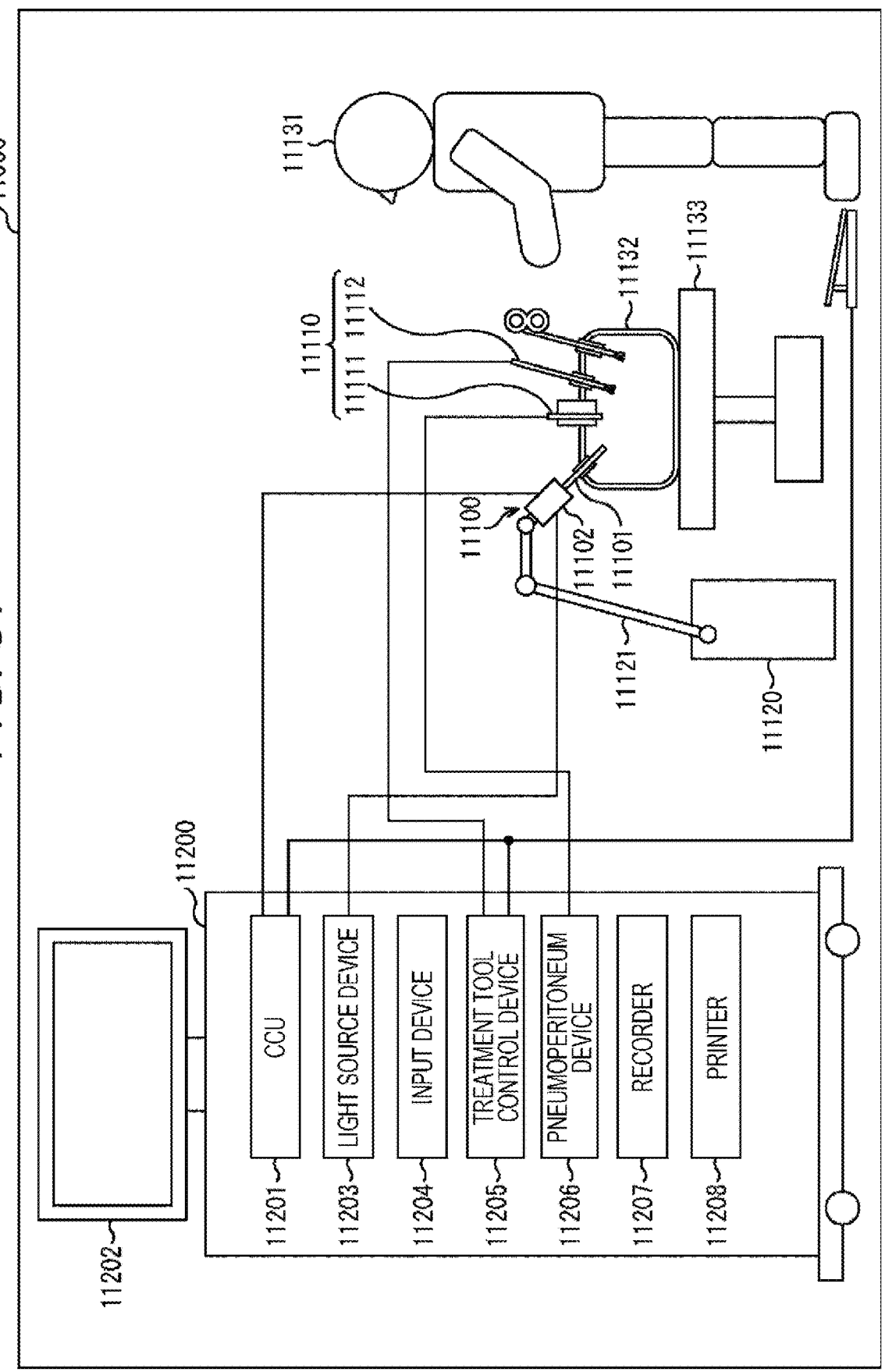
FIG. 31 is a diagram illustrating an example of a schematic configuration of an endoscopic surgery system.

FIG. 31 is a diagram illustrating an example of a schematic configuration of an endoscopic surgery system to which the technology according to an embodiment of the present disclosure (the present technology) can be applied.

FIG. 31 illustrates a state in which an operator (doctor) 11131 performs a surgery on a patient 11132 lying on a patient bed 11133 using an endoscopic surgery system 11000. As illustrated, the endoscopic surgery system 11000 includes an endoscope 11100, the other surgical tools 11110 including a pneumoperitoneum tube 11111 and an energy treatment tool 11112, a support arm device 11120 which supports the endoscope 11100, and a cart 11200 on which various devices for endoscopic surgery are mounted.

The endoscope 11100 includes a body tube 11101 whose region having a predetermined length from the distal end is inserted into the body cavity of the patient 11132 and a camera head 11102 which is connected to the proximal end of the body tube 11101. In the illustrated example, the endoscope 11100 is configured as a so-called hard endoscope which includes a hard body tube 11101. However, the endoscope 11100 may be configured as a so-called soft endoscope including a soft body tube.

The distal end of the body tube 11101 includes an opening in which an objective lens is fitted. A light source device 11203 is connected to the endoscope 11100. Light generated by the light source device 11203 is guided to the distal end of the body tube by a light guide which extends inside the body tube 11101 and applied to an object to be observed inside the body cavity of the patient 11132 through the objective lens. Note that the endoscope 11100 may be a direct-looking endoscope, an oblique-looking endoscope, or a side-looking endoscope.

An optical system and an image sensor are disposed inside the camera head 11102. Reflected light (observation light) from the object to be observed is condensed onto the image sensor by the optical system. The image sensor photoelectrically converts the observation light to generate an electric signal corresponding to the observation light, that is, an image signal corresponding to an observed image. The image signal is transmitted as RAW data to a camera control unit (CCU) 11201.

The CCU 11201 includes a central processing unit (CPU), a graphics processing unit (GPU), and the like and totally controls operations of the endoscope 11100 and a display device 11202. Further, the CCU 11201 receives an image signal from the camera head 11102 and performs various kinds of image processing such as development processing (demosaic processing) for displaying an image based on the image signal on the image signal.

The display device 11202 displays an image based on an image signal image-processed by the CCU 11201 by control from the CCU 11201.

The light source device 11203 includes, for example, a light source such as a light emitting diode (LED) and supplies irradiation light to the endoscope 11100 when an image of a surgical site is captured.

The input device 11204 is an input interface with respect to the endoscopic surgery system 11000. A user can perform input of various pieces of information and instruction input with respect to the endoscopic surgery system 11000 through the input device 11204. For example, a user inputs an instruction for changing imaging conditions (the type of irradiation light, magnification, focal length, and the like) by the endoscope 11100.

A treatment tool control device 11205 controls driving of the energy treatment tool 11112 for tissue ablation, incision, blood vessel sealing, or the like. A pneumoperitoneum device 11206 feeds gas into the body cavity of the patient 11132 through the pneumoperitoneum tube 11111 to distend the body cavity for the purpose of ensuring the field of view by the endoscope 11100 and ensuring an operation space of an operator. A recorder 11207 is a device capable of recording various pieces of information relating to the surgery. A printer 11208 is a device capable of printing various pieces of information relating to the surgery in various forms such as a text, an image, and a graph.

Note that the light source device 11203 which supplies irradiation light to the endoscope 11100 when an image of a surgical site is captured includes, for example, a white light source such as an LED, a laser light source, or a combination thereof. In a case where a white light source is configured as a combination of RGB laser light sources, an output intensity and an output timing of each color (each wavelength) can be controlled with high accuracy. Thus, it is possible to adjust white balance of a captured image in the light source device 11203. Further, in this case, it is also possible to capture images corresponding to RGB in a time division manner by applying laser beams from the respective RGB laser light sources to an object to be observed in a time division manner and controlling driving of the image sensor of the camera head 11102 synchronously with the application timing. This method enables a color image to be obtained without providing a color filter in the image sensor.

Further, driving of the light source device 11203 may be controlled so as to change the intensity of light to be output every predetermined time. It is possible to generate a high dynamic range image with no blocked up shadow and no blown out highlight by controlling driving of the image sensor of the camera head 11102 synchronously with the light intensity change timing to acquire images in a time division manner and combining the images.

Further, the light source device 11203 may be capable of supplying light in a predetermined wavelength band corresponding to special light observation. In the special light observation, for example, so-called narrow band imaging is performed. The narrow band imaging captures an image of a predetermined tissue such as a blood vessel on a mucous membrane surface layer with high contrast by applying light in a narrower band than irradiation light in a normal observation (that is, white light) using the dependence of absorption of light in a body tissue on wavelength. Alternatively, fluorescence imaging which obtains an image by fluorescence generated by application of excitation light may be performed in the special light observation. In the fluorescence imaging, it is possible to observe fluorescence from a body tissue by applying excitation light to the body tissue (autofluorescence imaging), obtain a fluorescence image by locally injecting a reagent such as indocyanine green (ICG) into a body tissue and applying excitation light corresponding to a fluorescence wavelength of the reagent to the body tissue, or the like. The light source device 11203 may be capable of supplying narrow band light and/or excitation light corresponding to such a special light observation.

Figure 32:
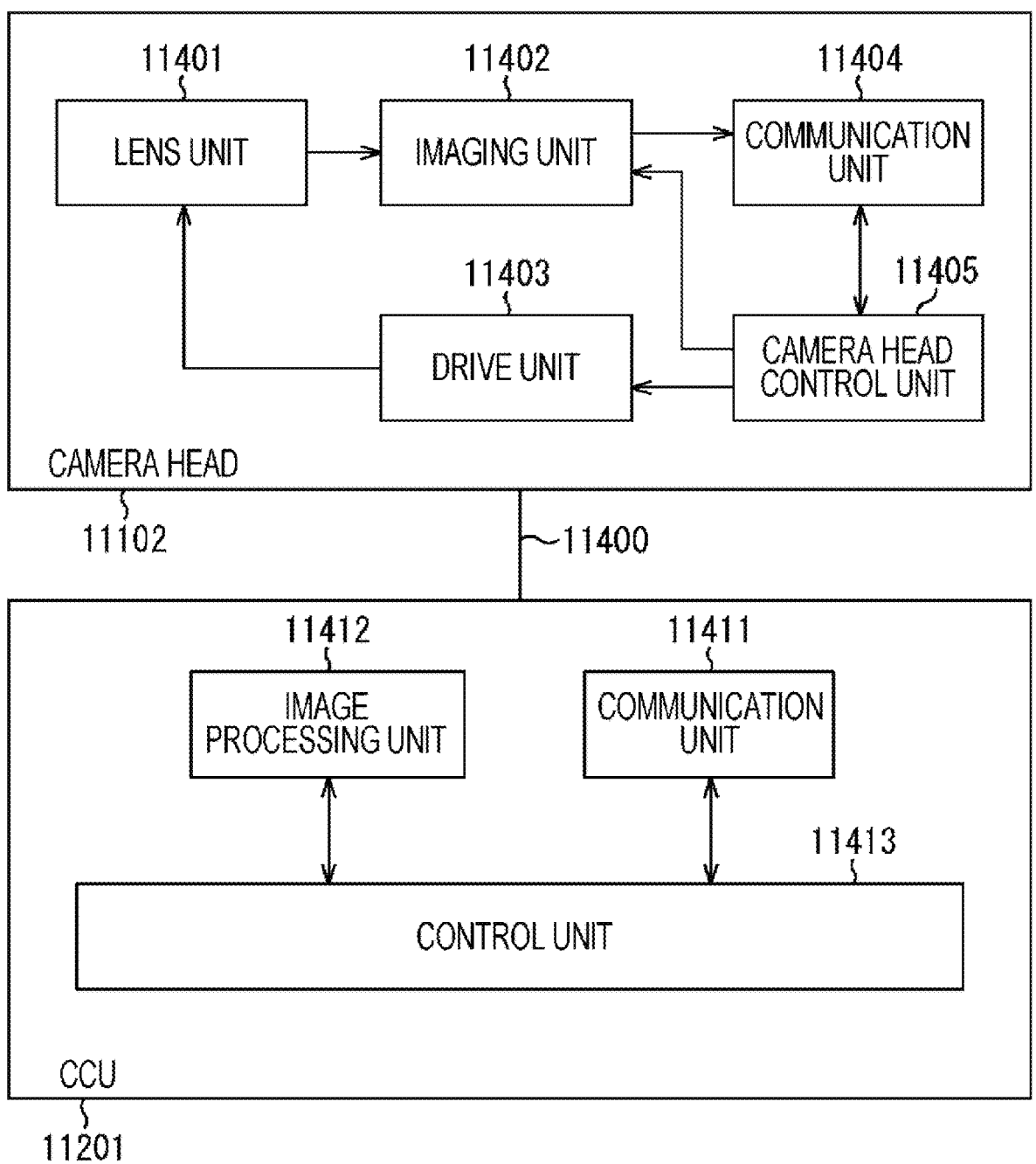
FIG. 32 is a block diagram illustrating an example of functional configurations of a camera head and a CCU.

FIG. 32 is a block diagram illustrating an example of functional configurations of the camera head 11102 and the CCU 11201 illustrated in FIG. 31.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicably connected through a transmission cable 11400.

The lens unit 11401 is an optical system which is disposed in a connection part with the body tube 11101. Observation light taken from the distal end of the body tube 11101 is guided to the camera head 11102 and enters the lens unit 11401. The lens unit 11401 includes a combination of a plurality of lenses including a zoom lens and a focusing lens.

The imaging unit 11402 includes an image sensor. The imaging unit 11402 may include one image sensor (so-called single-plate type) or a plurality of image sensors (so-called multi-plate type). In a case where the imaging unit 11402 is a multi-plate type imaging unit, for example, the image sensors may generate image signals corresponding to the respective RGB, and these image signals may be combined to obtain a color image. Alternatively, the imaging unit 11402 may include a pair of image sensors for acquiring image signals for respective right and left eyes corresponding to three-dimensional (3D) display. The 3D display enables the operator 11131 to more accurately grasp the depth of a body tissue in a surgical site. Note that, in a case where the imaging unit 11402 is a multi-plate type imaging unit, a plurality of systems of lens units 11401 can be provided corresponding to the respective image sensors.

Further, the imaging unit 11402 may not be necessarily disposed on the camera head 11102. For example, the imaging unit 11402 may be disposed immediately behind the objective lens inside the body tube 11101.

The drive unit 11403 includes an actuator and moves the zoom lens and the focusing lens of the lens unit 11401 by a predetermined distance along an optical axis by control from the camera head control unit 11405. As a result, the scaling and focus of an image captured by the imaging unit 11402 can be appropriately adjusted.

The communication unit 11404 includes a communication device for transmitting and receiving various pieces of information to and from the CCU 11201. The communication unit 11404 transmits an image signal obtained from the imaging unit 11402 as RAW data to the CCU 11201 through the transmission cable 11400.

Further, the communication unit 11404 receives a control signal for controlling driving of the camera head 11102 from the CCU 11201 and supplies the control signal to the camera head control unit 11405. The control signal includes, for example, information relating to imaging conditions such as information designating a frame rate of a captured image, information designating an exposure value during imaging, and/or information designating the scaling and focus of a captured image.

Note that the above imaging conditions such as the frame rate, the exposure value, the scaling, and the focus may be appropriately designated by a user or may be automatically set by the control unit 11413 of the CCU 11201 on the basis of the acquired image signal. In the latter case, the endoscope 11100 has an auto exposure (AE) function, an auto focus (AF) function, and an auto white balance (AWB) function.

The camera head control unit 11405 controls driving of the camera head 11102 on the basis of a control signal from the CCU 11201 received through the communication unit 11404.

The communication unit 11411 includes a communication device for transmitting and receiving various pieces of information to and from the camera head 11102. The communication unit 11411 receives an image signal transmitted from the camera head 11102 through the transmission cable 11400.

Further, the communication unit 11411 transmits a control signal for controlling driving of the camera head 11102 to the camera head 11102. The image signal and the control signal can be transmitted by telecommunication or optical communication.

The image processing unit 11412 performs various kinds of image processing on the image signal which is RAW data transmitted from the camera head 11102.

The control unit 11413 performs various controls relating to imaging of a surgical site and the like by the endoscope 11100 and display of a captured image obtained by imaging of a surgical site and the like. For example, the control unit 11413 generates a control signal for controlling driving of the camera head 11102.

Further, the control unit 11413 causes the display device 11202 to display a captured image which includes a surgical site and the like on the basis of an image signal image-processed by the image processing unit 11412. At this time, the control unit 11413 may recognize various objects within the captured image using various image recognition technologies. For example, the control unit 11413 can recognize a surgical tool such as a forceps, a specific living body site, bleeding, mist during the use of the energy treatment tool 11112, or the like by detecting the shape of an edge or color of an object, or the like included in the captured image. When the display device 11202 displays the captured image, various pieces of surgery support information may be allowed to be displayed on the image of the surgical site in a superimposed manner using the recognition result by the control unit 11413. The surgery support information displayed in a superimposed manner and presented to the operator 11131 enables the burden to the operator 11131 to be reduced and enables the operator 11131 to reliably perform the surgery.

The transmission cable 11400 which connects the camera head 11102 and the CCU 11201 is an electric signal cable corresponding to communication of electric signals, an optical fiber corresponding to optical communication, or a composite cable thereof.

Note that, although communication is performed by wire using the transmission cable 11400 in the illustrated example, communication between the camera head 11102 and the CCU 11201 may be wirelessly performed.

An example of the endoscopic surgery system to which the technology according to an embodiment of the present disclosure can be applied has been described above. The technology according to an embodiment of the present disclosure can be applied to, for example, the imaging unit 11402 of the camera head 11102 in the configuration described above. Specifically, for example, the image sensor 100 of each of the above embodiments can be used in the imaging unit 10402. With this application, for example, a surgical site image having a higher quality can be obtained, and an operator can reliably check a surgical site. Further, for example, the imaging unit 10402 can be downsized.

Note that, although the endoscopic surgery system has been described as an example hereinabove, the technology according to an embodiment of the present disclosure can also be applied to other systems such as a microsurgery system.

<Application Example to Mobile Body>

Further, for example, the technology according to an embodiment of the present disclosure may be implemented as an apparatus mounted on a mobile body of any kind such as an automobile, an electric automobile, a hybrid electric automobile, a motorcycle, a bicycle, a personal mobility, an airplane, a drone, a ship, or a robot.

Figure 33:
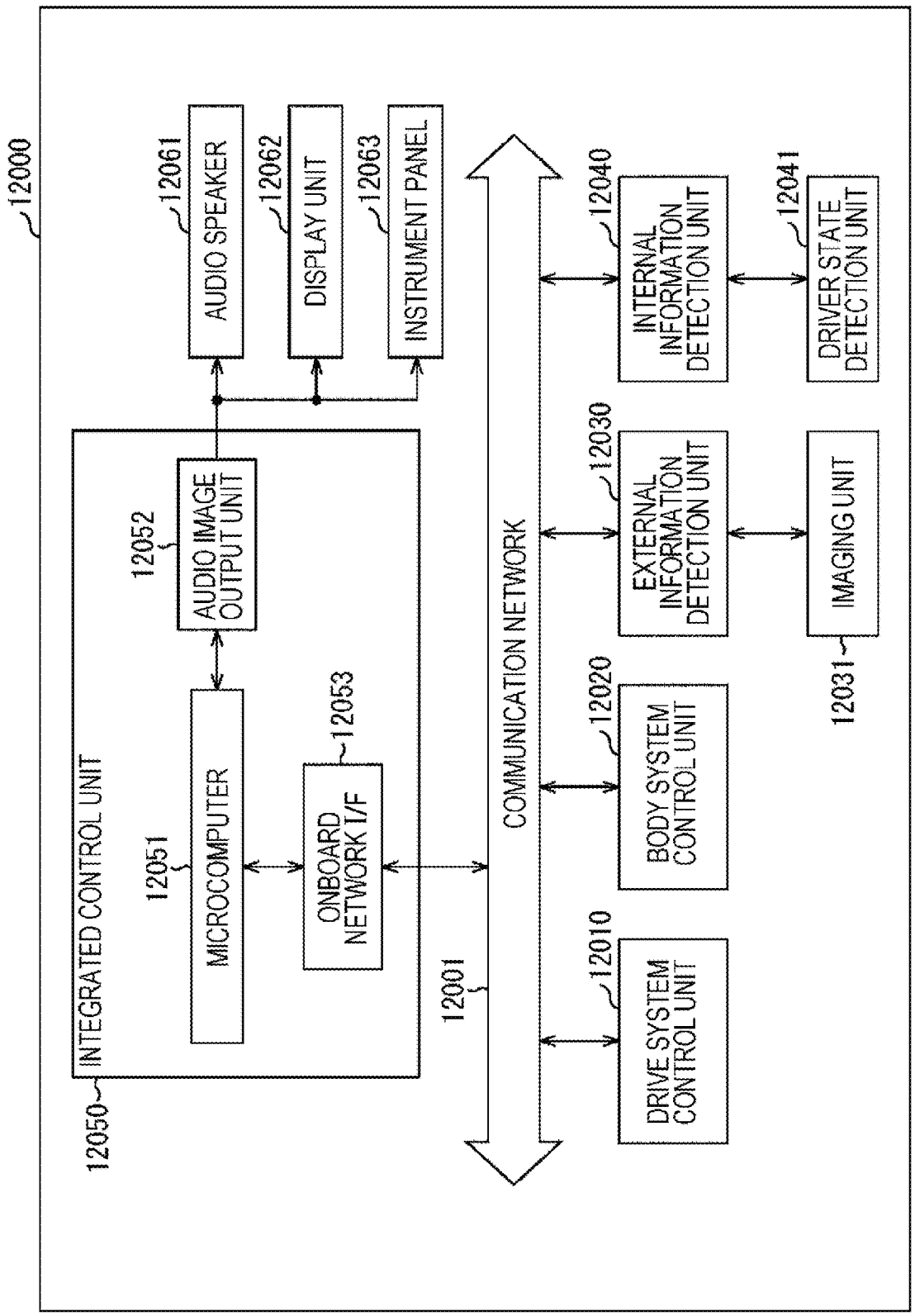
FIG. 33 is a block diagram illustrating an example of a schematic configuration of a vehicle control system.

FIG. 33 is a block diagram illustrating a schematic configuration example of a vehicle control system which is an example of a mobile body control system to which the technology according to an embodiment of the present disclosure can be applied.

A vehicle control system 12000 is provided with a plurality of electronic control units which are connected through a communication network 12001. In the example illustrated in FIG. 33, the vehicle control system 12000 is provided with a drive system control unit 12010, a body system control unit 12020, an external information detection unit 12030, an internal information detection unit 12040, and an integrated control unit 12050. Further, FIG. 33 illustrates a microcomputer 12051, an audio image output unit 12052, and an onboard network interface (I/F) 12053 as a functional configuration of the integrated control unit 12050.

The drive system control unit 12010 controls the operation of a device relating to a drive system of the vehicle in accordance with various programs. For example, the drive system control unit 12010 functions as a control device for a driving force generation device for generating a driving force of the vehicle such as an internal combustion engine or a driving motor, a driving force transmission mechanism for transmitting the driving force to wheels, a steering mechanism which adjusts a steering angle of the vehicle, a braking device which generates a braking force of the vehicle, and the like.

The body system control unit 12020 controls the operation of various devices mounted on a vehicle body in accordance with various programs. For example, the body system control unit 12020 functions as a control device for a keyless entry system, a smart key system, a power window device, or various lamps such as a headlamp, a back lamp, a stop lamp, a blinker, or a fog lamp. In this case, a radio wave transmitted from a portable device which substitutes for a key or a signal from various switches can be input to the body system control unit 12020. The body system control unit 12020 receives input of the radio wave or the signal and controls a door locking device, a power window device, a lamp, or the like.

The external information detection unit 12030 detects information outside a vehicle equipped with the vehicle control system 12000. For example, an imaging unit 12031 is connected to the external information detection unit 12030. The external information detection unit 12030 causes the imaging unit 12031 to capture an image outside the vehicle and receives the captured image. The external information detection unit 12030 may perform object detection processing or distance detection processing for a human, a vehicle, an obstacle, a sign, a character on a road surface, or the like on the basis of the received image.

The imaging unit 12031 is an optical sensor which receives light and outputs an electric signal corresponding to the amount of the received light. The imaging unit 12031 can output an electric signal as an image or as ranging information. Further, light received by the imaging unit 12031 may be visible light or invisible light such as an infrared ray.

The internal information detection unit 12040 detects information inside the vehicle. For example, a driver state detection unit 12041 which detects a state of the driver is connected to the internal information detection unit 12040. The driver state detection unit 12041, for example, includes a camera which captures an image of the driver. The internal information detection unit 12040 may calculate the degree of fatigue or the degree of concentration of the driver or may determine whether the driver is drowsy on the basis of detected information input from the driver state detection unit 12041.

The microcomputer 12051 is capable of calculating a control target value for the driving force generation device, the steering mechanism, or the braking device on the basis of information inside or outside the vehicle acquired by the internal information detection unit 12040 or the external information detection unit 12030 and outputting a control command to the drive system control unit 12010. For example, the microcomputer 12051 is capable of performing cooperative control aimed at achieving a function of an advanced driver assistance system (ADAS) including vehicle collision avoidance or shock relaxing, following traveling based on the following distance, vehicle speed maintaining traveling, vehicle collision warning, a vehicle lane departure warning, or the like.

Further, the microcomputer 12051 is capable of performing cooperative control aimed at automatic driving for autonomously traveling without depending on the operation by a driver by controlling the driving force generation device, the steering mechanism, the braking device, or the like on the basis of information around the vehicle acquired by the external information detection unit 12030 or the internal information detection unit 12040.

Further, the microcomputer 12051 is capable of outputting a control command to the body system control unit 12020 on the basis of information outside the vehicle acquired by the external information detection unit 12030. For example, the micro-computer 12051 is capable of performing cooperative control aimed at antiglare by controlling the headlamp according to the position of a preceding vehicle or an oncoming vehicle detected by the external information detection unit 12030, switching high beam to low beam, and the like.

The audio image output unit 12052 transmits at least either an audio output signal or an image output signal to an output device capable of visually or auditorily notifying an occupant of the vehicle or the outside of the vehicle of information. In the example of FIG. 33, an audio speaker 12061, a display unit 12062, and an instrument panel 12063 are illustrated as examples of the output device. The display unit 12062 may include, for example, at least either an onboard display or a head up display.

Figure 34:
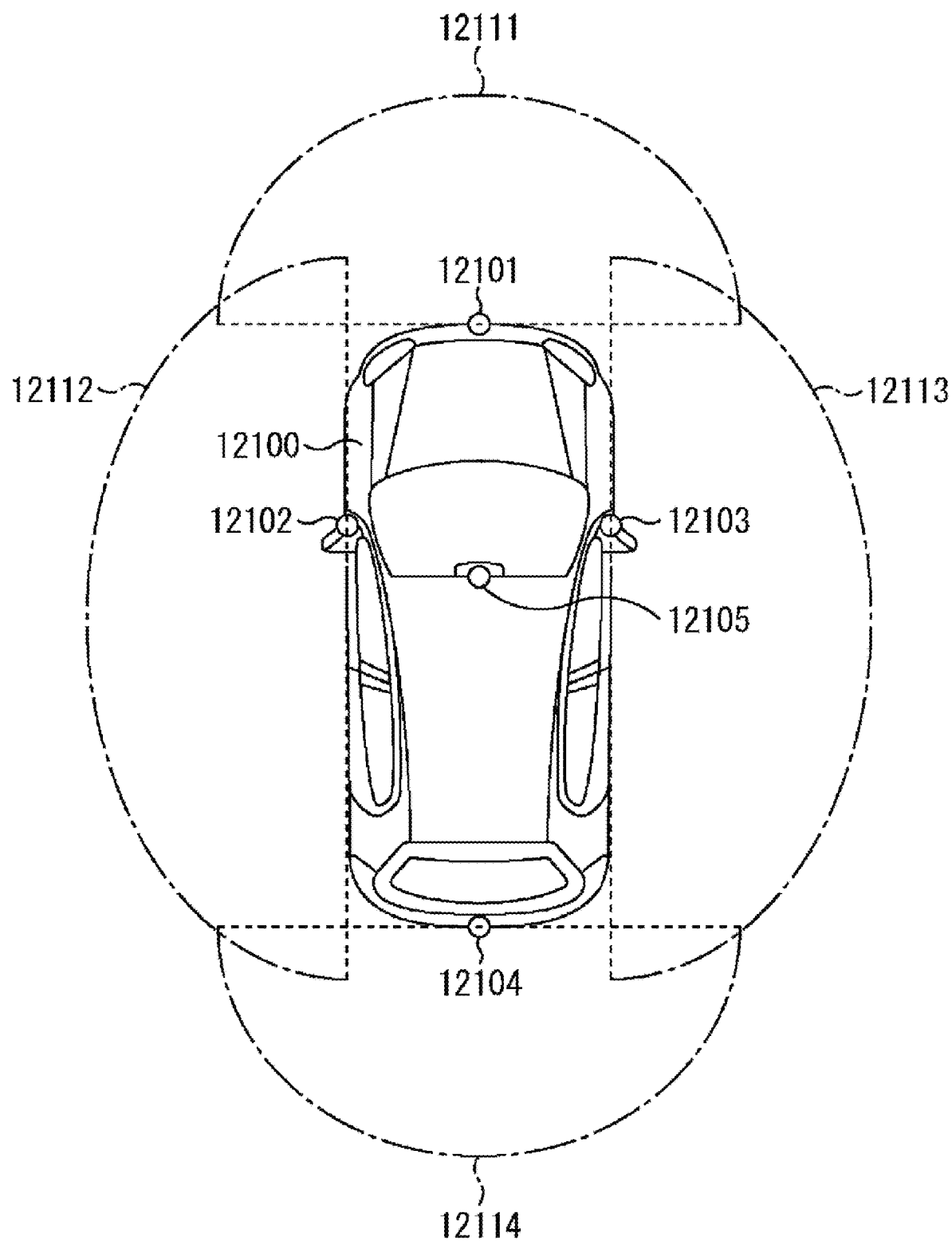
FIG. 34 is an explanatory diagram illustrating an example of installation positions of an external information detection unit and an imaging unit.

FIG. 34 is a diagram illustrating an example of an installation position of the imaging unit 12031.

In FIG. 34, the vehicle 12100 includes imaging units 12101, 12102, 12103, 12104, 12105 as the imaging unit 12031.

For example, the imaging units 12101, 12102, 12103, 12104, 12105 are disposed at positions such as a front nose, a sideview mirror, a rear bumper, a back door, and an upper part of a windshield inside a vehicle cabin in the vehicle 12100. The imaging unit 12101 which is disposed on the front nose and the imaging unit 12105 which is disposed on the upper part of the windshield inside the vehicle cabin mainly acquire images at the front side of the vehicle 12100. The imaging units 12102, 12103 which are disposed on the side minors mainly acquire images at the lateral sides of the vehicle 12100. The imaging unit 12104 which is disposed on the rear bumper or the back door mainly acquires an image at the rear side of the vehicle 12100. The front images acquired by the imaging units 12101 and 12105 are mainly used for detection of a preceding vehicle, a pedestrian, an obstacle, a traffic signal, a traffic sign, a lane, or the like.

Note that FIG. 34 illustrates an example of imaging ranges of the imaging units 12101 to 12104. An imaging range 12111 indicates an imaging range of the imaging unit 12101 disposed on the front nose. Imaging ranges 12112, 12113 respectively indicate imaging ranges of the imaging units 12102, 12103 disposed on the side mirrors. An imaging range 12114 indicates an imaging range of the imaging unit 12104 disposed on the rear bumper or the back door. For example, a bird's-eye view image of the vehicle 12100 which is an image of the vehicle 12100 viewed from above can be obtained by superimposing image data items captured by the imaging units 12101 to 12104 on each other.

At least one of the imaging units 12101 to 12104 may have a function of acquiring distance information. For example, at least one of the imaging units 12101 to 12104 may be a stereo camera which includes a plurality of image sensors or may be an image sensor which includes a pixel for phase difference detection.

For example, the microcomputer 12051 is capable of particularly extracting a three-dimensional object that is closest to the vehicle 12100 on a traveling route of the vehicle 12100 and traveling at a predetermined speed (e.g., 0 km/h or more) in substantially the same direction as the direction of the vehicle 12100 as a preceding vehicle by obtaining the distance to each three-dimensional object within the imaging ranges 12111 to 12114 and a change with time of the distance (the relative speed with respect to the vehicle 12100) on the basis of distance information obtained from the imaging units 12101 to 12104. Further, the microcomputer 12051 is capable of setting a following distance that should be ensured behind the preceding vehicle and performing automatic brake control (including following stop control), automatic acceleration control (including following start control), and the like. In this manner, it is possible to perform cooperative control aimed at, for example, automatic driving for autonomously traveling without depending on the operation by a driver.

For example, the microcomputer 12051 is capable of classifying and extracting three-dimensional object data relating to three-dimensional objects into a two-wheeled vehicle, a standard-sized vehicle, a large-sized vehicle, a pedestrian, and other three-dimensional objects such as a utility pole on the basis of distance information obtained from the imaging units 12101 to 12104 and using the extracted data for automatic obstacle avoidance. For example, the microcomputer 12051 makes discrimination of obstacles around the vehicle 12100 between an obstacle that is visually recognizable by the driver of the vehicle 12100 and an obstacle that is difficult for the driver to visually recognize. Then, the microcomputer 12051 determines a collision risk indicating the degree of risk of collision with each obstacle. When the collision risk is equal to or higher than a set value, that is, there is a possibility of collision, the micro-computer 12051 can perform driving assistance for collision avoidance by outputting an alarm to the driver through the audio speaker 12061 or the display unit 12062 or performing forced deceleration or avoidance steering through the drive system control unit 12010.

At least one of the imaging units 12101 to 12104 may be an infrared camera which detects infrared rays. For example, the microcomputer 12051 can recognize a pedestrian by determining whether there is a pedestrian within images captured by the imaging units 12101 to 12104. The pedestrian recognition is performed by a step of extracting characteristic points in the images captured by the imaging units 12101 to 12104 as infrared cameras, for example, and a step of performing pattern matching on a series of characteristic points indicating the contour of an object and determining whether the object is a pedestrian. When the microcomputer 12051 determines that there is a pedestrian within the images captured by the imaging units 12101 to 12104 and recognizes the pedestrian, the audio image output unit 12052 controls the display unit 12062 so that a square outline for emphasis is superimposed on the recognized pedestrian to be displayed. Further, the audio image output unit 12052 may control the display unit 12062 so that an icon or the like indicating the pedestrian is displayed at a desired position.

An example of the vehicle control system to which the technology according to an embodiment of the present disclosure can be applied has been described above. The technology according to an embodiment of the present disclosure can be applied to, for example, the imaging unit 12031 in the configuration described above. Specifically, for example, the image sensor 100 of each of the above embodiments can be used in the imaging unit 12031. Accordingly, for example, a captured image having a higher quality can be obtained, and the accuracy of detection of conditions outside the vehicle is improved. Further, for example, the imaging unit 12031 can be downsized.

12. Modifications

Hereinbelow, modifications of the embodiments of the present technology described above will be described.

In the above description, an example in which a reflector is disposed between each adjacent pixels has been described. However, for example, pixels provided with GMR filters having the same wavelength characteristic may share the core layer without providing a reflector.

Further, in a case where a one-dimensional diffraction grating is used, no reflector may be provided in a direction perpendicular to the direction in which a standing wave is generated, for example, the up-down direction in FIG. 9A.

Further, for example, a color filter, a band-pass filter, or the like may be disposed on an upper layer (the light incidence side) of the GMR filter to restrict the wavelength of light incident on the GMR filter.

Further, in the above description, an example in which the present technology is applied to a GMR filter has been described. However, the present technology can also be applied to another optical filter (e.g., structural color filter) that uses interference of electromagnetic waves on a light incidence plane or a plane parallel to the incidence plane as with the GMR filter. For example, the present technology can be applied to a plasmon filter having a hole array structure or a dot array structure.

Further, in the above description, the back side illuminated CMOS image sensor has been described as an example of the image sensor. However, the present technology can be applied to various image sensors that uses a wavelength selection filter.

For example, the present technology can also be applied to a front side illuminated CMOS image sensor or CCD image sensor.

Further, the present technology can also be applied to a solid state imaging device (image sensor) described below as an example.

<Section Structural Example of Solid State Imaging Device to which Technology according to one Embodiment of Present Disclosure can be Applied>

Figure 35:
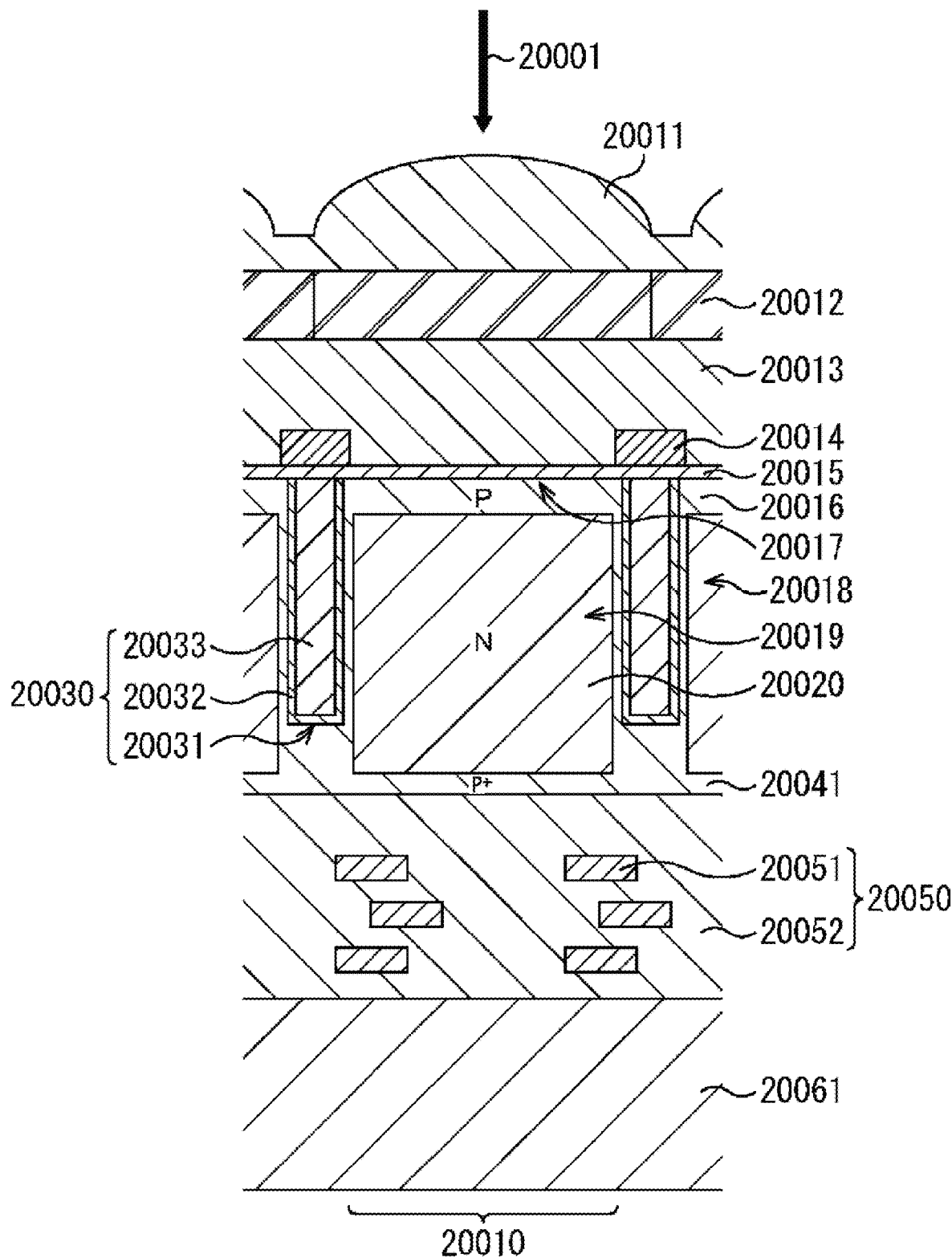
FIG. 35 is a cross-sectional view illustrating a structural example of a solid state imaging device to which the technology according to an embodiment of the present disclosure can be applied.

FIG. 35 is a cross-sectional view illustrating a structural example of a solid state imaging device to which the technology according to an embodiment of the present disclosure can be applied.

In the solid state imaging device, a photo diode (PD) 20019 receives incident light 20001 incident from the back face side (the upper face side in the drawing) of a semiconductor substrate 20018. A flattening film 20013, a GMR filter 20012, and a microlens 20011 are disposed above the PD 20019. The incident light 20001 incident sequentially through the respective members is received by a light receiving surface 20017 and photoelectrically converted.

For example, in the PD 20019, an n-type semiconductor region 20020 is formed as a charge storage region which stores charges (electrons). In the PD 20019, the n-type semiconductor region 20020 is formed inside p-type semiconductor regions 20016, 20041 of the semiconductor substrate 20018. The p-type semiconductor region 20041 which has a higher impurity concentration than the back face side (upper face side) is disposed in the n-type semiconductor region 20020 at the front face side (lower face side) of the semiconductor substrate 20018. That is, the PD 20019 has a hole-accumulation diode (HAD) structure. The p-type semiconductor regions 20016, 20041 are formed so as to reduce the occurrence of a dark current in the respective interfaces at the upper face side and the lower face side of the n-type semiconductor region 20020.

A pixel separator 20030 which electrically separates a plurality of pixels 20010 is disposed inside the semiconductor substrate 20018. The PD 20019 is disposed in each region separated by the pixel separator 20030. In the drawing, in a case where the solid state imaging device is viewed from the upper face side, the pixel separator 20030 is, for example, formed in a grid-like form so as to be interposed between the pixels 20010. The PD 20019 is formed inside the region separated by the pixel separator 20030.

In each PD 20019, an anode is grounded. In the solid state imaging device, signal charges (e.g., electrons) stored by the PD 20019 are read through a transfer Tr (MOSFET, not illustrated) or the like and output as electric signals to a vertical signal line (VSL, not illustrated).

A wiring layer 20050 is disposed on the front face (lower face) of the semiconductor substrate 20018 which is opposite to the back face (upper face) on which a light shielding film 20014, the GMR filter 20012, the microlens 20011 and the like are disposed.

The wiring layer 20050 includes wiring lines 20051 and an insulating layer 20052. The wiring layer 20050 is formed in such a manner that the wiring lines 20051 are electrically connected to respective elements inside the insulating layer 20052. The wiring layer 20050 is a so-called multilayer wiring layer and formed by alternately stacking the wiring lines 20051 and interlayer insulating films which constitute the insulating layer 20052 plurality of times. Here, as the wiring lines 20051, a wiring line to a Tr for reading charges from the PD 20019 such as the transfer Tr and various wiring lines such as a VSL are stacked with the insulating layer 20052 interposed therebetween.

A support substrate 20061 is disposed on a face of the wiring layer 20050 at the side opposite to the side having the PD 20019. For example, a substrate made of a silicon semiconductor having a thickness of several hundred μm is provided as the support substrate 20061.

The light shielding film 20014 is disposed on the back face side (the upper face side in the drawing) of the semiconductor substrate 20018.

The light shielding film 20014 is configured to block part of the incident light 20001 which travels toward the back face of the semiconductor substrate 20018 from above the semiconductor substrate 20018.

The light shielding film 20014 is disposed above the pixel separator 20030 which is disposed inside the semiconductor substrate 20018. Here, the light shielding film 20014 is formed in a projecting shape on the back face (upper face) of the semiconductor substrate 20018 with an insulating film 20015 such as a silicon oxide film interposed therebetween. On the other hand, the light shielding film 20014 is not located above the PD 20019 which is disposed inside the semiconductor substrate 20018 and this part is open so that the incident light 20001 enters the PD 20019.

That is, in the drawing, in a case where the solid state imaging device is viewed from the upper face side, the plane shape of the light shielding film 20014 is a grid-like shape, and openings through which the incident light 20001 to the light receiving surface 20017 passes are formed on the light shielding film 20014.

The light shielding film 20014 is formed of a light shielding material which blocks light. For example, the light shielding film 20014 is formed by sequentially laminating a titanium (Ti) film and a tungsten (W) film. Alternatively, the light shielding film 20014 may be formed by sequentially laminating a titanium nitride (TiN) film and a tungsten (W) film.

The light shielding film 20014 is covered with the flattening film 20013. The flattening film 20013 is formed using an insulating material which transmits light.

The pixel separator 20030 includes a groove 20031, a fixed charge film 20032, and an insulating film 20033.

The fixed charge film 20032 covers the groove 20031 which separates the pixels 20010 at the back face side (upper face side) of the semiconductor substrate 20018.

Specifically, the fixed charge film 20032 covers the inner face of the groove 20031, which is formed at the back face side (upper face side) of the semiconductor substrate 20018, with a constant thickness. Further, the insulating film 20033 is formed (filled) so as to fill up the inside of the groove 20031 which is covered with the fixed charge film 20032.

Here, the fixed charge film 20032 is formed using a high dielectric having a negative fixed charge so that a positive charge (hole) storage region is formed in the interface part with the semiconductor substrate 20018 to reduce the occurrence of a dark current. Since the fixed charge film 20032 has a negative fixed charge, an electric field is applied to the interface with the semiconductor substrate 20018 by the negative fixed charge, and the positive charge (hole) storage region is formed.

The fixed charge film 20032 may be formed of, for example, a hafnium oxide film (HfO2 film). Further, for example, the fixed charge film 20032 may include at least one of oxides of hafnium, zirconium, aluminum, tantalum, titanium, magnesium, yttrium, lanthanoid, and the like.

<Section Structural Example of Pixel Separator of Solid State Imaging Device to which Technology according to one Embodiment of Present Disclosure can be Applied>

Figure 36:
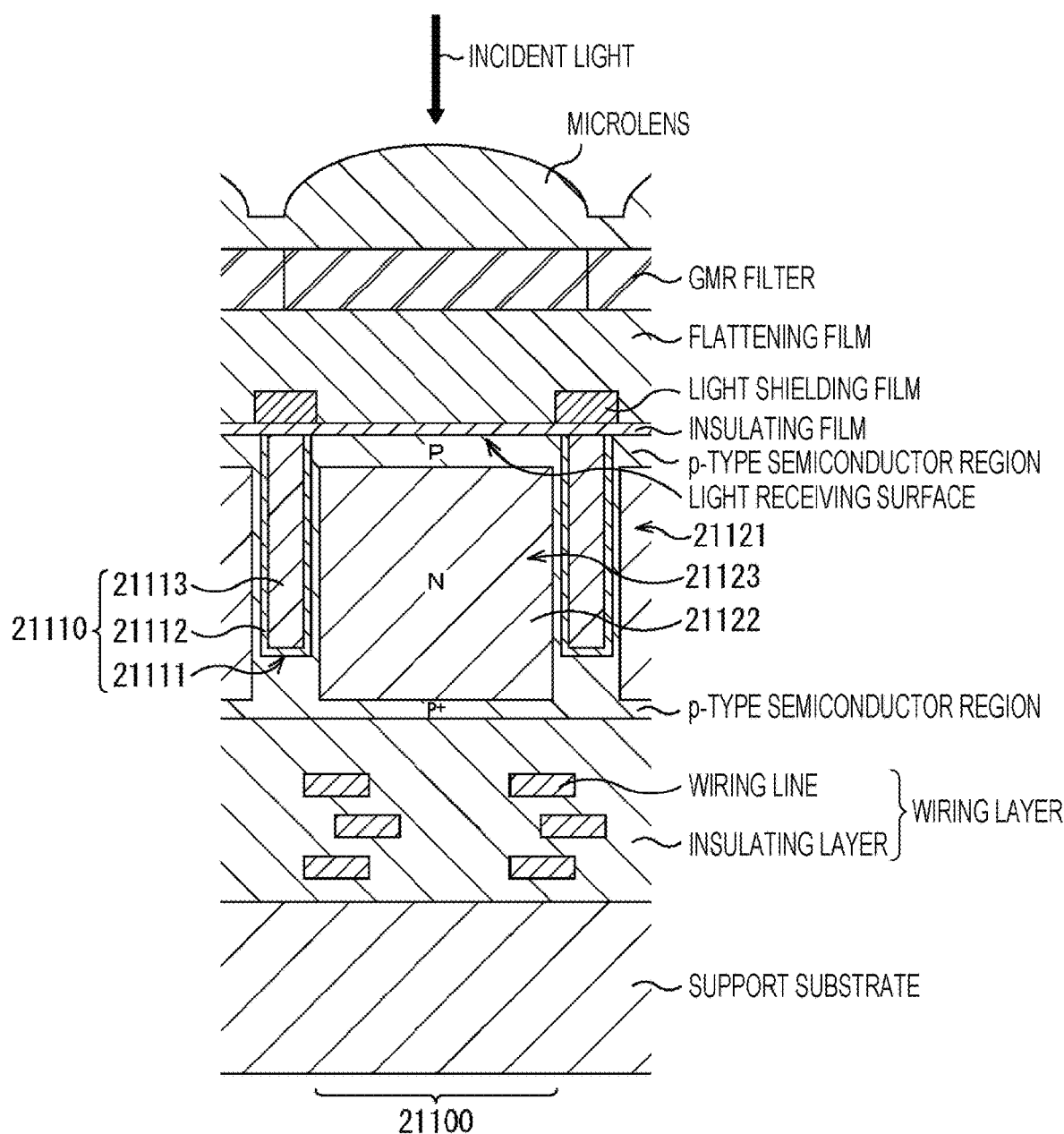
FIG. 36 is a cross-sectional view illustrating a first structural example of a pixel separator of the solid state imaging device to which the technology according to an embodiment of the present disclosure can be applied.

FIG. 36 is a cross-sectional view illustrating a first structural example of the pixel separator of the solid state imaging device to which the technology according to an embodiment of the present disclosure can be applied.

In the solid state imaging device, a pixel separator 21110 is formed of an insulating material so as to separate a plurality of pixels 21100 and electrically separates the pixels 21100.

The pixel separator 21110 includes a groove 21111, a fixed charge film 21112, and an insulating film 21113. The pixel separator is buried inside a semiconductor substrate 21121 at the back face side (the upper face side in the drawing) of the semi-conductor substrate 21121.

That is, at the back face side (the upper face side) of the semiconductor substrate 21121, the groove 21111 is formed to separate n-type semiconductor regions 21122 each of which constitutes a charge storage region of a photodiode (PD) 20123. The inside of the groove 21111 is covered with the fixed charge film 21112. Further, the groove 21111 is filled with the insulating film 21113 so as to constitute the pixel separator 21110.

In the drawing, in a case where the solid state imaging device is viewed from the upper face side, the plane shape of the pixel separator 21110 is a grid-like shape, and the pixel separator 21110 is interposed between the pixels 21100. Further, the PD 20123 is formed inside each rectangular region separated by the grid-like pixel separator 21110.

For example, a silicon oxide film (SiO), a silicon nitride film (SiN), or the like may be employed as the insulating film 21113 of the pixel separator 21110. The pixel separator 21110 may be formed by, for example, shallow trench isolation.

Figure 37:
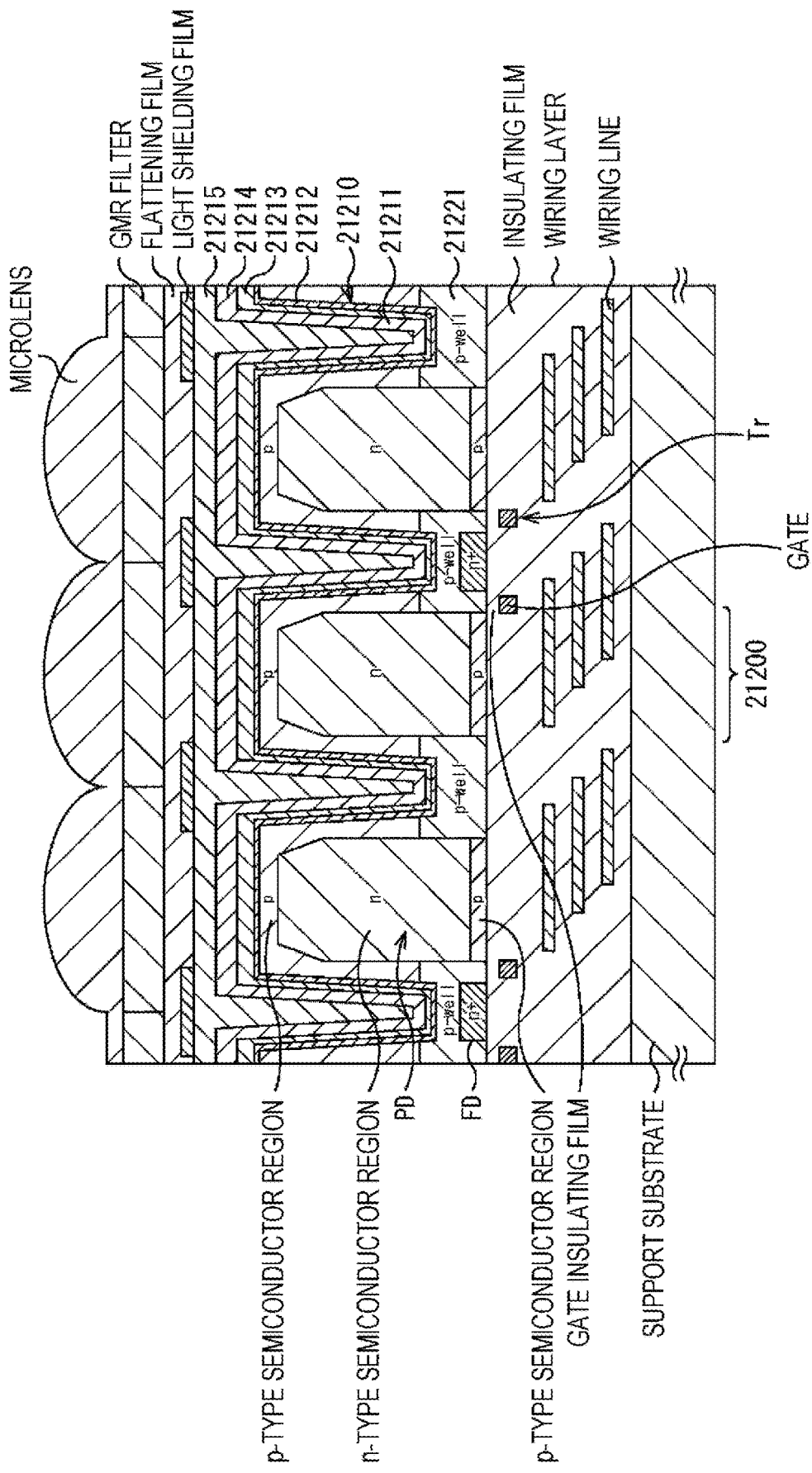
FIG. 37 is a cross-sectional view illustrating a second structural example of the pixel separator of the solid state imaging device to which the technology according to an embodiment of the present disclosure can be applied.

FIG. 37 is a cross-sectional view illustrating a second structural example of the pixel separator of the solid state imaging device to which the technology according to an embodiment of the present disclosure can be applied.

In FIG. 37, a pixel separator 21210 which separates pixels 21200 is formed by filling a groove 21211 with a first fixed charge film 21212, a second fixed charge film 21213, a first insulating film 21214, and a second insulating film 21215 in this order. The groove 21211 has a tapered cross-sectional shape and has an opening diameter reduced in the depth direction of a substrate 21221.

Note that the pixel separator 21210 may be formed by filling the groove 21211 with the first fixed charge film 21212, the second fixed charge film 21213, the first insulating film 21214, and the second insulating film 21215 in an order other than the above order. For example, the pixel separator 21210 may be formed by filling the groove 21211 alternately with the insulating film and the fixed charge film in such an order as the first insulating film 21214, the first fixed charge film 21212, the second insulating film 21215, and the second fixed charge film 21213.

Figure 38:
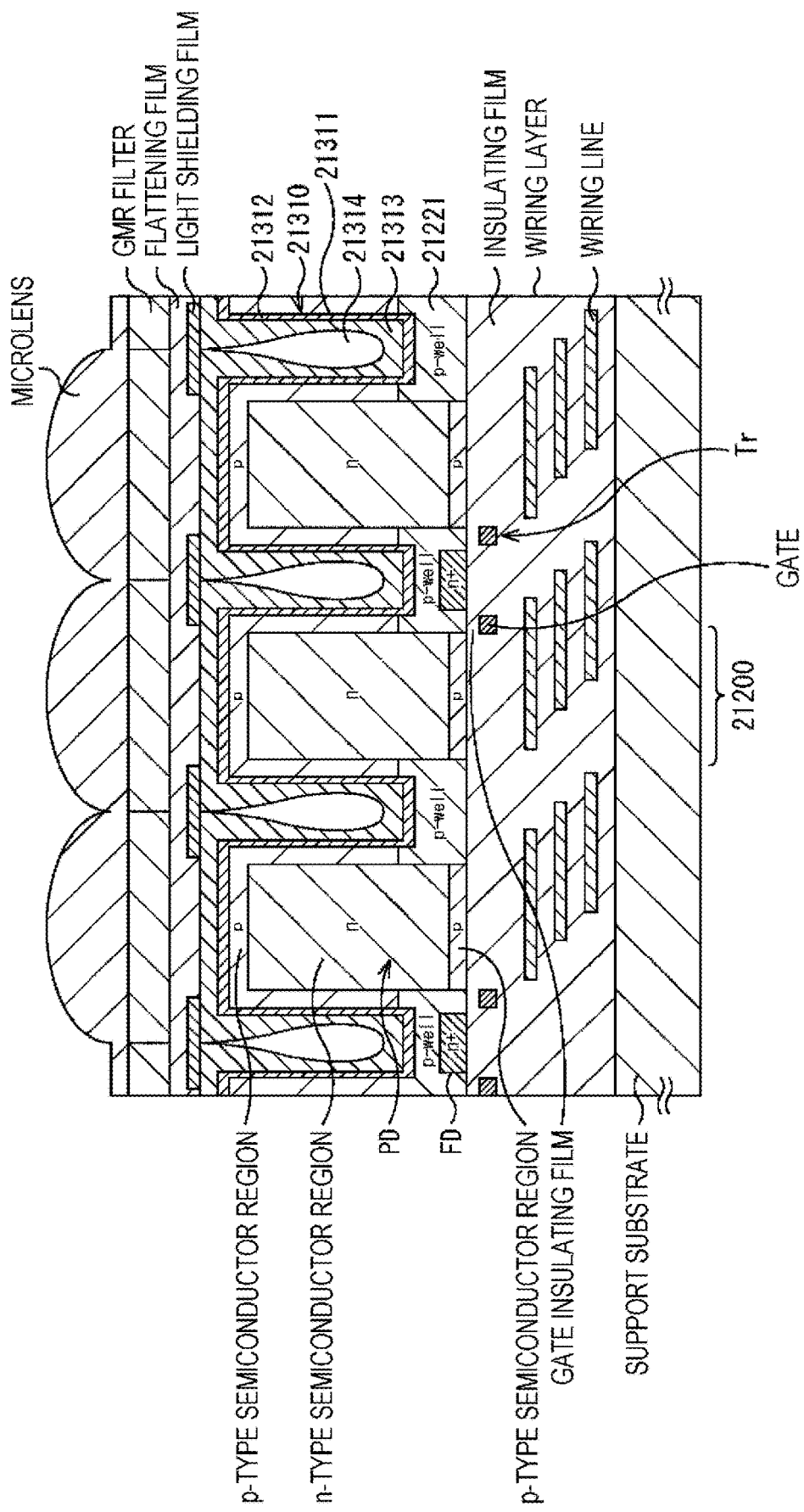
FIG. 38 is a cross-sectional view illustrating a third structural example of the pixel separator of the solid state imaging device to which the technology according to an embodiment of the present disclosure can be applied.

FIG. 38 is a cross-sectional view illustrating a third structural example of the pixel separator of the solid state imaging device to which the technology according to an embodiment of the present disclosure can be applied.

In a solid state imaging device of FIG. 38, a pixel separator 21310 which separates pixels 21200 has a hollow structure, which differs from the case of FIG. 37 in which the pixel separator 21210 does not have a follow structure. Further, in the solid state imaging device of FIG. 38, a groove 21311 does not have a tapered shape, which differs from the case of FIG. 37 in which the groove 21211 has a tapered shape. Note that the groove 21311 may be formed in a tapered shape in a similar manner to that of the groove 21211 of FIG. 37.

The pixel separator 21310 is formed by filling the groove 21311 which is formed in the depth direction from the back face side (the upper face side) of the substrate 21221 with a fixed charge film 21312 and an insulating film 21313 in this order. A hollow part (that is, a void) 21314 is formed inside the groove 21311.

That is, the fixed charge film 21312 is formed on an inner wall surface of the groove 21311 and the back face side of the substrate 21221, and the insulating film 21313 covers the fixed charge film 21312. Further, in order to form the hollow part 21314 in the groove 21311, the insulating film 21313 is formed with a film thickness with which the groove 21311 is not entirely filled with the insulating film 21313 inside the groove 21311, but the insulating film 21313 blocks the groove 21311 at an opening edge of the groove 21311. For example, the insulating film 21313 may be formed of a material such as silicon oxide, silicon nitride, silicon oxynitride, or a resin.

<Structural Example of Stacked Solid State Imaging Device to which Technology according to one Embodiment of Present Disclosure can be Applied>

Figure 39:
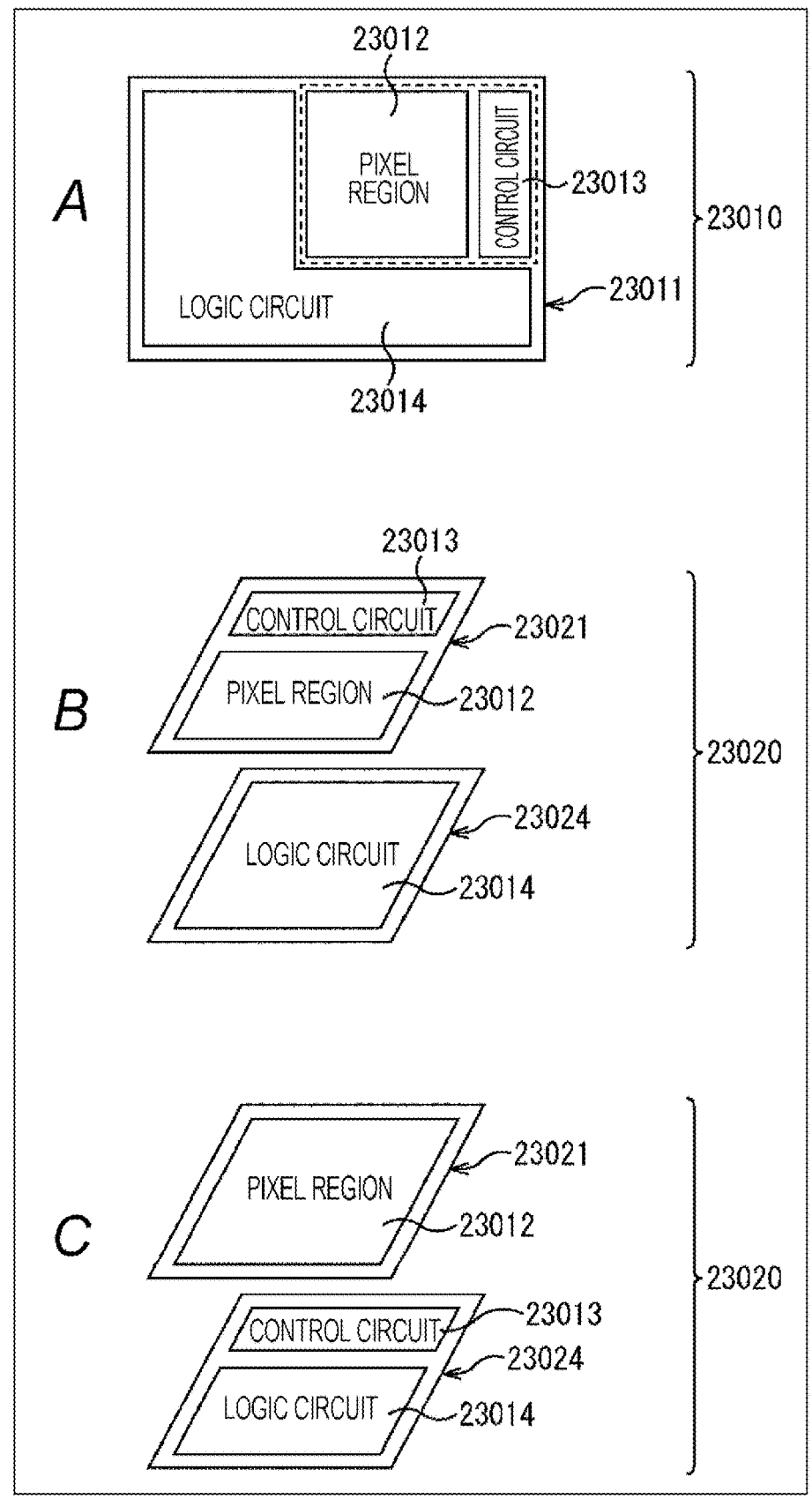
FIG. 39 is a diagram illustrating an outline of a structural example of a stacked solid state imaging device to which the technology according to an embodiment of the present disclosure can be applied.

FIG. 39 is a diagram illustrating an outline of a structural example of a stacked solid state imaging device to which the technology according to an embodiment of the present disclosure can be applied.

A of FIG. 39 illustrates a schematic structural example of a non-stacked solid state imaging device. As illustrated in A of FIG. 39, a solid state imaging device 23010 includes a die (semiconductor substrate) 23011. A pixel region 23012 in which pixels are arranged in an array, a control circuit 23013 which performs various controls for driving of the pixels and the like, and a logic circuit 23014 for signal processing are mounted on the die 23011.

B and C of FIG. 39 illustrate schematic structural examples of a stacked solid state imaging device. As illustrated in B and C of FIG. 39, a solid state imaging device 23020 is configured as one semiconductor chip by stacking two dies: a sensor die 23021; and a logic die 23024 and electrically connecting the dies.

In B of FIG. 39, a pixel region 23012 and a control circuit 23013 are mounted on the sensor die 23021, and a logic circuit 23014 which includes a signal processing circuit which performs signal processing is mounted on the logic die 23024.

In C of FIG. 39, a pixel region 23012 is mounted on the sensor die 23021, and a control circuit 23013 and a logic circuit 23014 are mounted on the logic die 23024.

Figure 40:
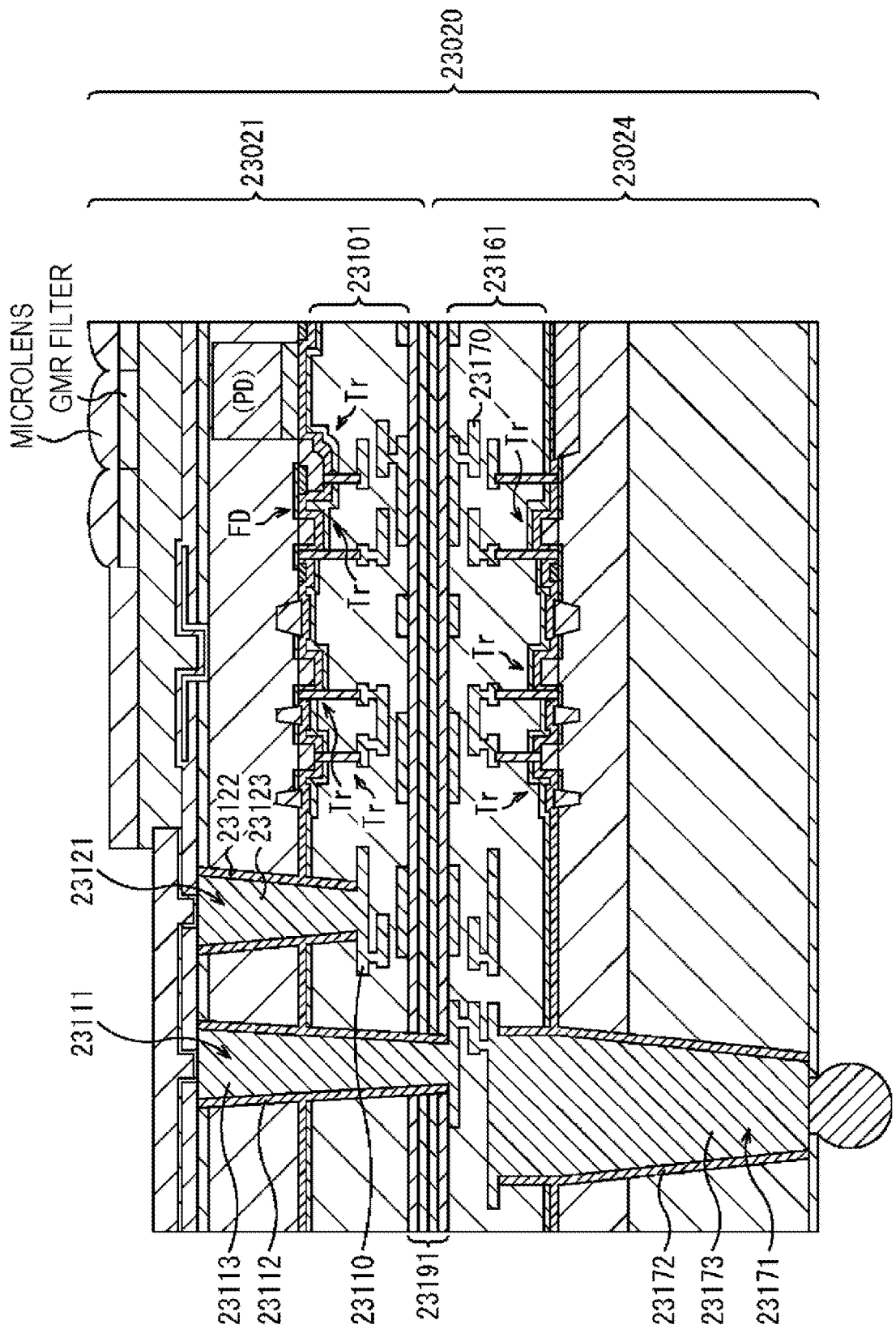
FIG. 40 is a cross-sectional view illustrating a first structural example of the stacked solid state imaging device.

FIG. 40 is a cross-sectional view illustrating a first structural example of the stacked solid state imaging device 23020.

A photodiode (PD) which constitutes a pixel, a floating diffusion (FD), and a Tr (MOSFET) which form the pixel region 23012, a Tr which constitutes the control circuit 23013, and the like are formed on the sensor die 23021. Further, a wiring layer 23101 which includes a plurality of layers, in this example, three layers of wiring lines 23110 is formed on the sensor die 23021. Note that the control circuit 23013 (Tr) may be disposed not on the sensor die 23021, but on the logic die 23024.

A Tr which constitutes the logic circuit 23014 is formed on the logic die 23024. Further, a wiring layer 23161 which includes a plurality of layers, in this example, three layers of wiring lines 23170 is formed on the logic die 23024. Further, a connection hole 23171 which includes an insulating film 23172 formed on an inner wall surface thereof is formed on the logic die 23024. The connection hole 23171 is filled with a connection conductor 23173 which is connected to the wiring lines 23170 and the like.

The sensor die 23021 and the logic die 23024 are bonded together with their wiring layers 23101 and 23161 facing each other. With this arrangement, the stacked solid state imaging device 23020 in which the sensor die 23021 and the logic die 23024 are stacked is formed. A film 23191 such as a protective film is formed between the bonded faces of the sensor die 23021 and the logic die 23024.

A connection hole 23111 is formed on the sensor die 23021. The connection hole 23111 penetrates the sensor die 23021 from the back face side (the light incident side to the PD, the upper side) of the sensor die 23021 up to the top layer wiring line 23170 of the logic die 23024. Further, a connection hole 23121 is formed on the sensor die 23021. The connection hole 23121 is close to the connection hole 23111 and formed from the back face side of the sensor die 23021 up to the first layer wiring line 23110. An insulating film 23112 is formed on an inner wall surface of the connection hole 23111, and an insulating film 23122 is formed on an inner wall surface of the connection hole 23121. Further, the connection holes 23111 and 23121 are filled with connection conductors 23113 and 23123, respectively. The connection conductor 23113 and the connection conductor 23123 are electrically connected at the back face side of the sensor die 23021, so that the sensor die 23021 and the logic die 23024 are electrically connected through the wiring layer 23101, the connection hole 23121, the connection hole 23111, and the wiring layer 23161.

Figure 41:
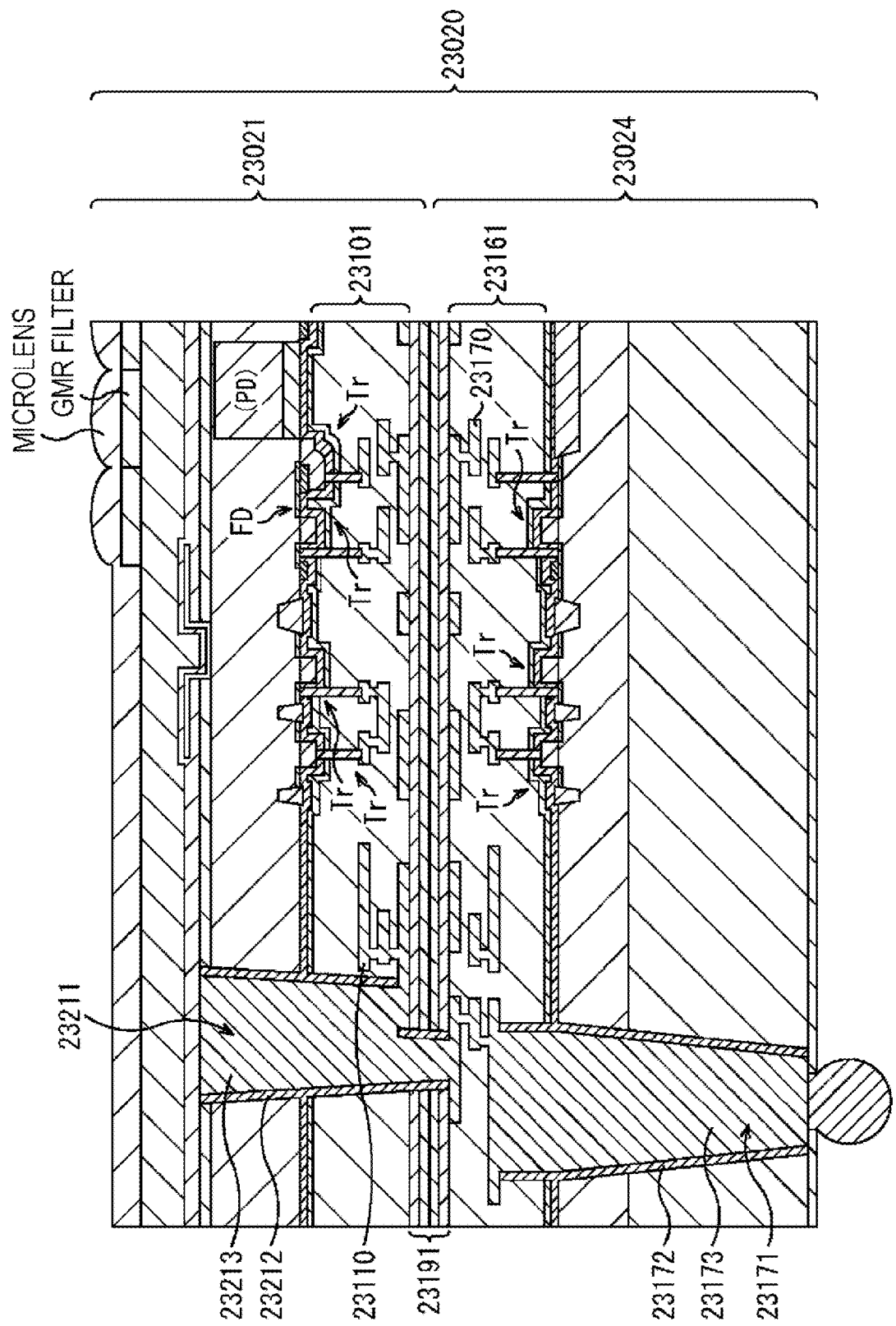
FIG. 41 is a cross-sectional view illustrating a second structural example of the stacked solid state imaging device.

FIG. 41 is a cross-sectional view illustrating a second structural example of the stacked solid state imaging device 23020.

In the second structural example of the solid state imaging device 23020, the sensor die 23021 (the wiring layer 23101 (the wiring lines 23110)) and the logic die 23024 (the wiring layer 23161 (the wiring lines 23170)) are electrically connected through a single connection hole 23211 which is formed on the sensor die 23021.

That is, in FIG. 41, the connection hole 23211 penetrates the sensor die 23021 from the back face side of the sensor die 23021 up to the top layer wiring line 23170 of the logic die 23024 and also up to the top layer wiring 23110 of the sensor die 23021. An insulating film 23212 is formed on an inner wall surface of the connection hole 23211, and the connection hole 23211 is filled with a connection conductor 23213. In FIG. 40 described above, the sensor die 23021 and the logic die 23024 are electrically connected through the two connection holes 23111 and 23121. On the other hand, in FIG. 41, the sensor die 23021 and the logic die 23024 are electrically connected through the single connection hole 23211.

Figure 42:
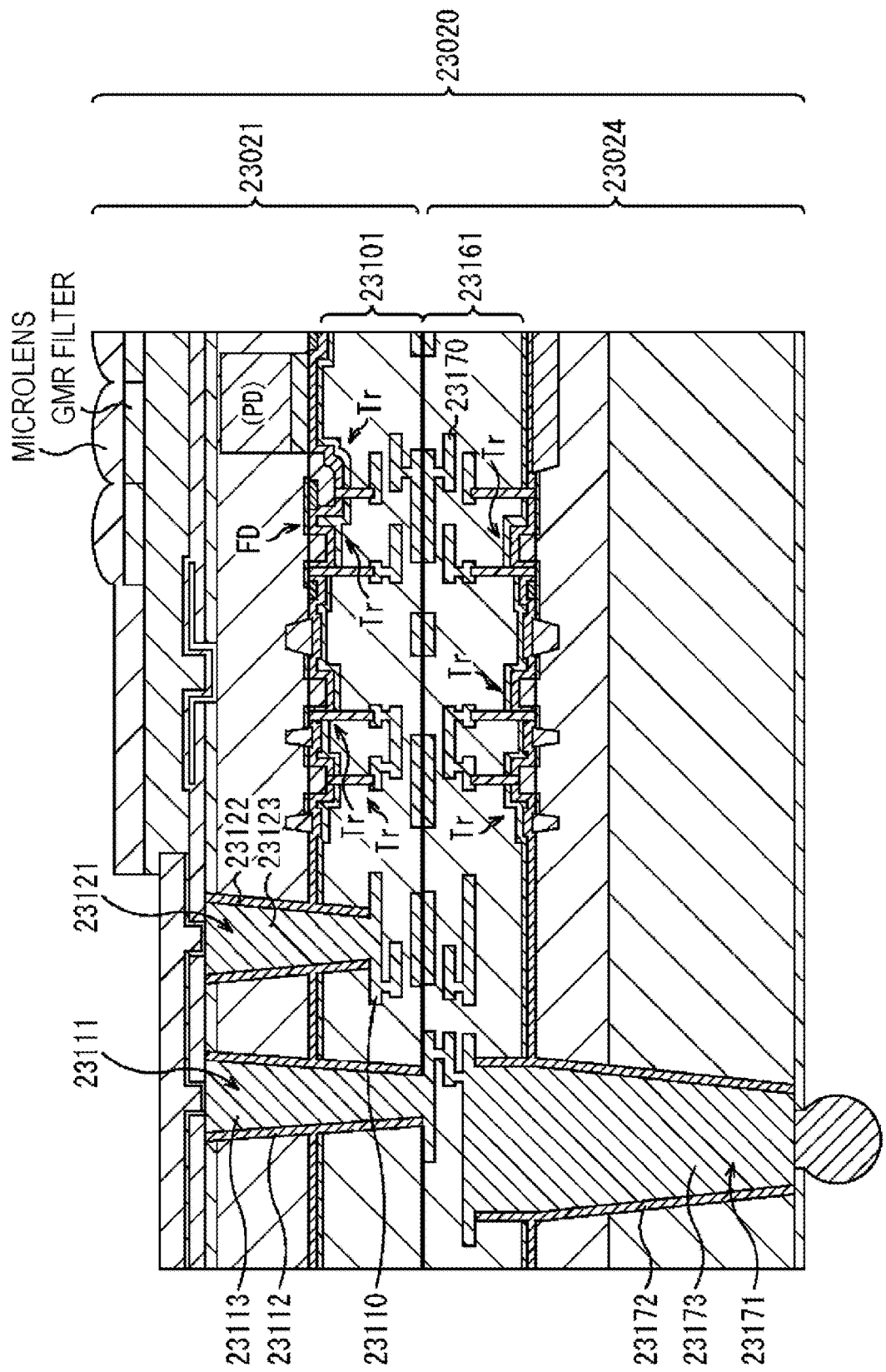
FIG. 42 is a cross-sectional view illustrating a third structural example of the stacked solid state imaging device.

FIG. 42 is a cross-sectional view illustrating a third structural example of the stacked solid state imaging device 23020.

In the stacked solid state imaging device 23020 of FIG. 42, the film 23191 such as a protective film is not formed between the bonded faces of the sensor die 23021 and the logic die 23024, which differs from the case of FIG. 40 in which the film 23191 such as a protective film is formed between the bonded faces of the sensor die 23021 and the logic die 23024.

The solid state imaging device 23020 of FIG. 42 is formed by putting the sensor die 23021 and the logic die 23024 together in such a manner that the wiring lines 23110 and 23170 are brought into direct contact with each other and heating the dies while applying a required weight thereto to directly join the wiring lines 23110 and 23170 together.

Figure 43:
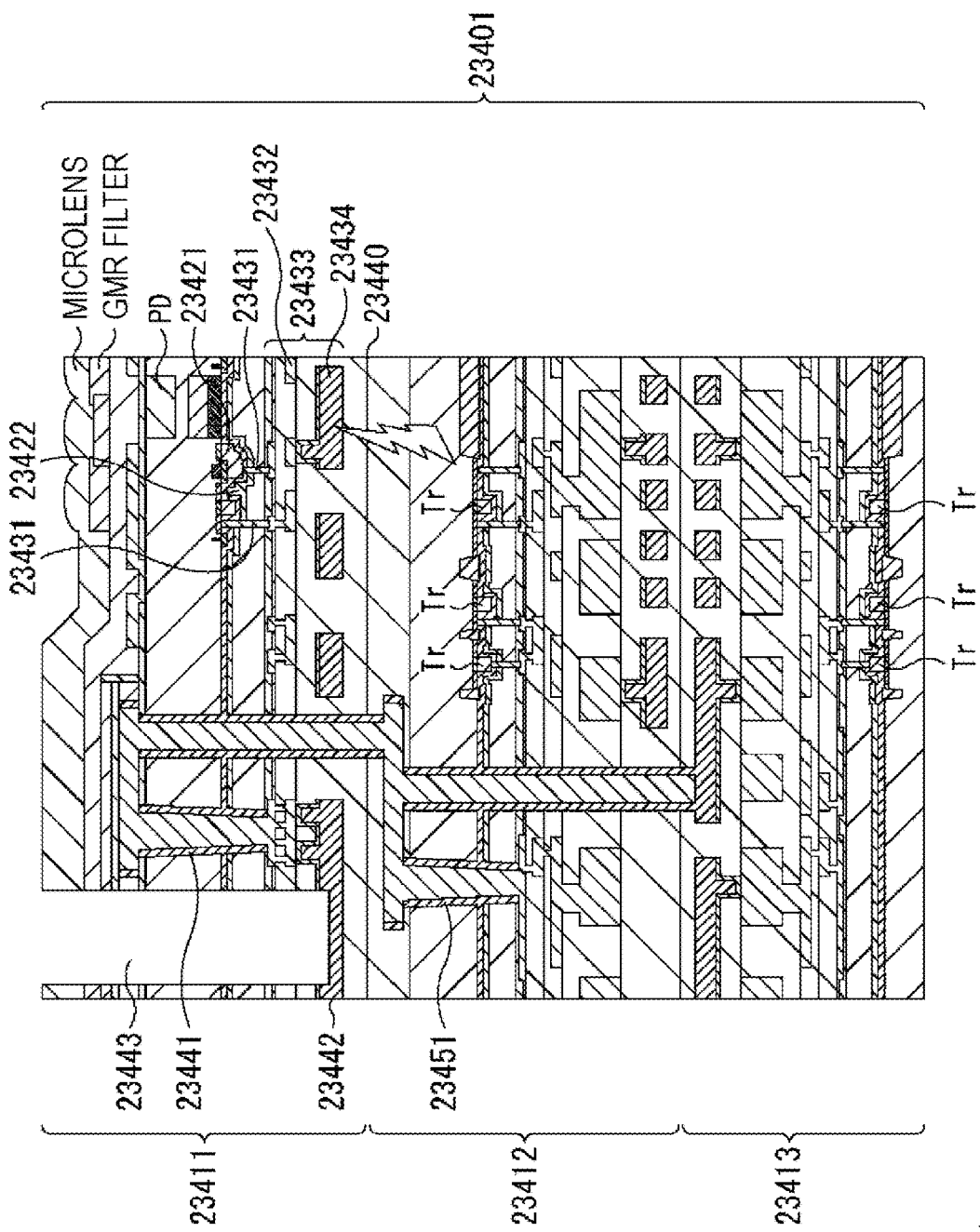
FIG. 43 is a cross-sectional view illustrating another structural example of the stacked solid state imaging device to which the technology according to an embodiment of the present disclosure can be applied.

FIG. 43 is a cross-sectional view illustrating another structural example of the stacked solid state imaging device to which the technology according to an embodiment of the present disclosure can be applied.

In FIG. 43, a solid state imaging device 23401 has a three-layer stacked structure in which three dies: a sensor die 23411; a logic die 23412; and a memory die 23413 are stacked.

The memory die 23413 includes, for example, a memory circuit which stores data which may be temporarily required in signal processing performed in the logic die 23412.

In FIG. 43, the logic die 23412 and the memory die 23413 are stacked in this order under the sensor die 23411. However, the logic die 23412 and the memory die 23413 may be stacked in an inverse order, that is, the memory die 23413 and the logic die 23412 may be stacked in this order under the sensor die 23411.

Note that, in FIG. 43, a PD which serves as a photoelectric converter of a pixel and source/drain regions of pixel Trs are formed on the sensor die 23411.

A gate electrode is formed around the PD with a gate insulating film interposed therebetween, and the gate electrode and a pair of source/drain regions form a pixel Tr 23421 and a pixel Tr 23422.

The pixel Tr 23421 which is adjacent to the PD is a transfer Tr, and one of the pair of source/drain regions which constitutes the pixel Tr 23421 serves as an FD.

Further, an interlayer insulating film is formed on the sensor die 23411. Connection holes are formed on the interlayer insulating film. Connection conductors 23431 which are connected to the pixel Tr 23421 and the pixel Tr 23422 are formed on the connection holes.

Further, a wiring layer 23433 which includes a plurality of layers of wiring lines 23432 which are connected to the respective connection conductors 23431 is formed on the sensor die 23411.

Further, an aluminum pad 23434 which serves as an electrode for external connection is formed on the bottom layer in the wiring layer 23433 of the sensor die 23411. That is, in the sensor die 23411, the aluminum pad 23434 is formed at a position that is closer to a bonded face 23440 bonded to the logic die 23412 than the wiring lines 23432 are. The aluminum pad 23434 is used as one end of a wiring line relating to input and output of signals to the outside.

Further, a contact 23441 which is used for electrical connection with the logic die 23412 is formed on the sensor die 23411. The contact 23441 is connected to a contact 23451 of the logic die 23412 and also connected to an aluminum pad 23442 of the sensor die 23411.

Further, the sensor die 23411 includes a pad hole 23443 which is formed from the back face side (upper side) of the sensor die 23411 up to the aluminum pad 23442.

<Structural Example of Solid state Imaging Device Sharing Plurality of Pixels to which Technology according to one Embodiment of Present Disclosure can be Applied>

Figure 44:
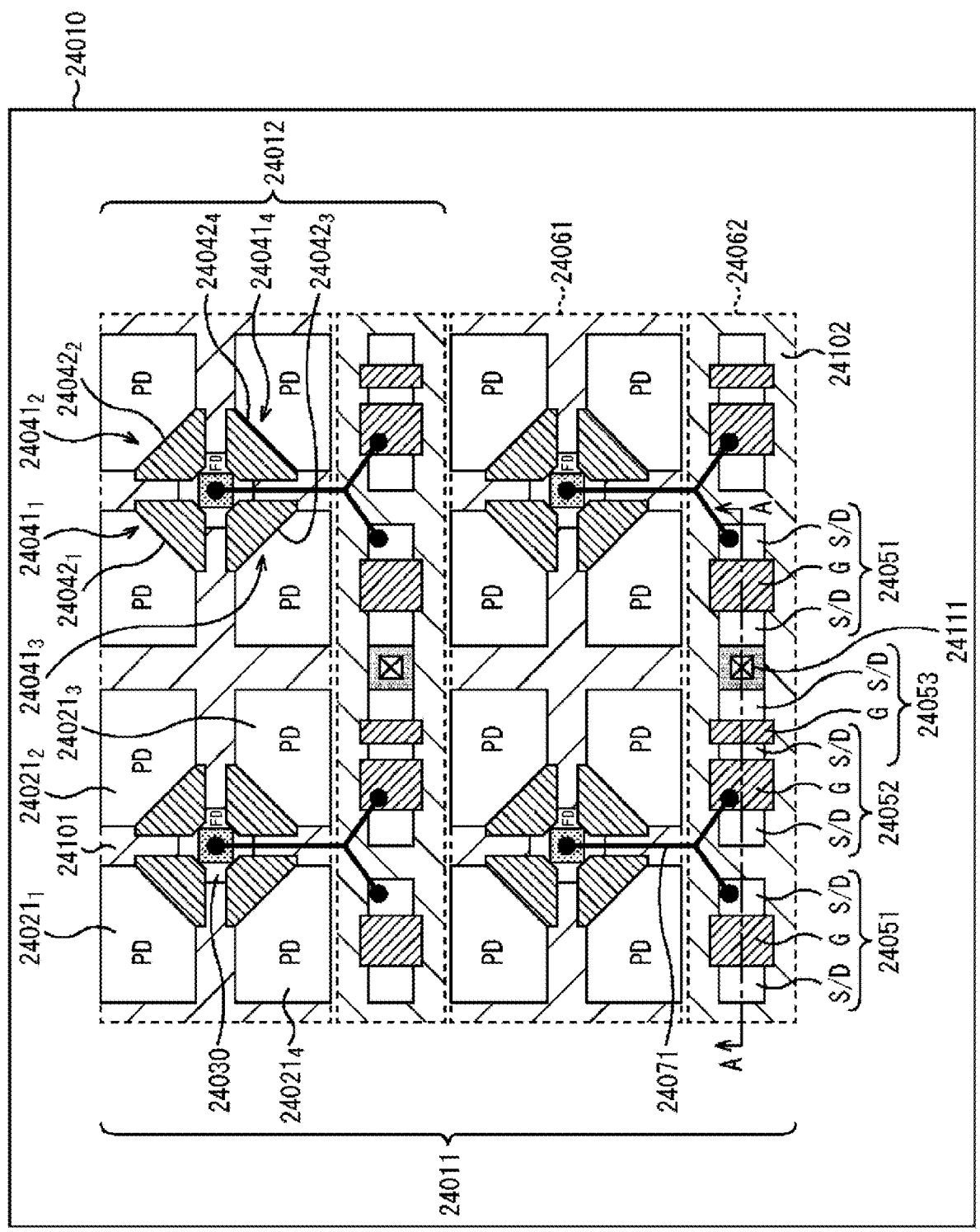
FIG. 44 is a plan view illustrating a first structural example of a solid state imaging device that shares a plurality of pixels to which the technology according to an embodiment of the present disclosure can be applied.
Figure 45:
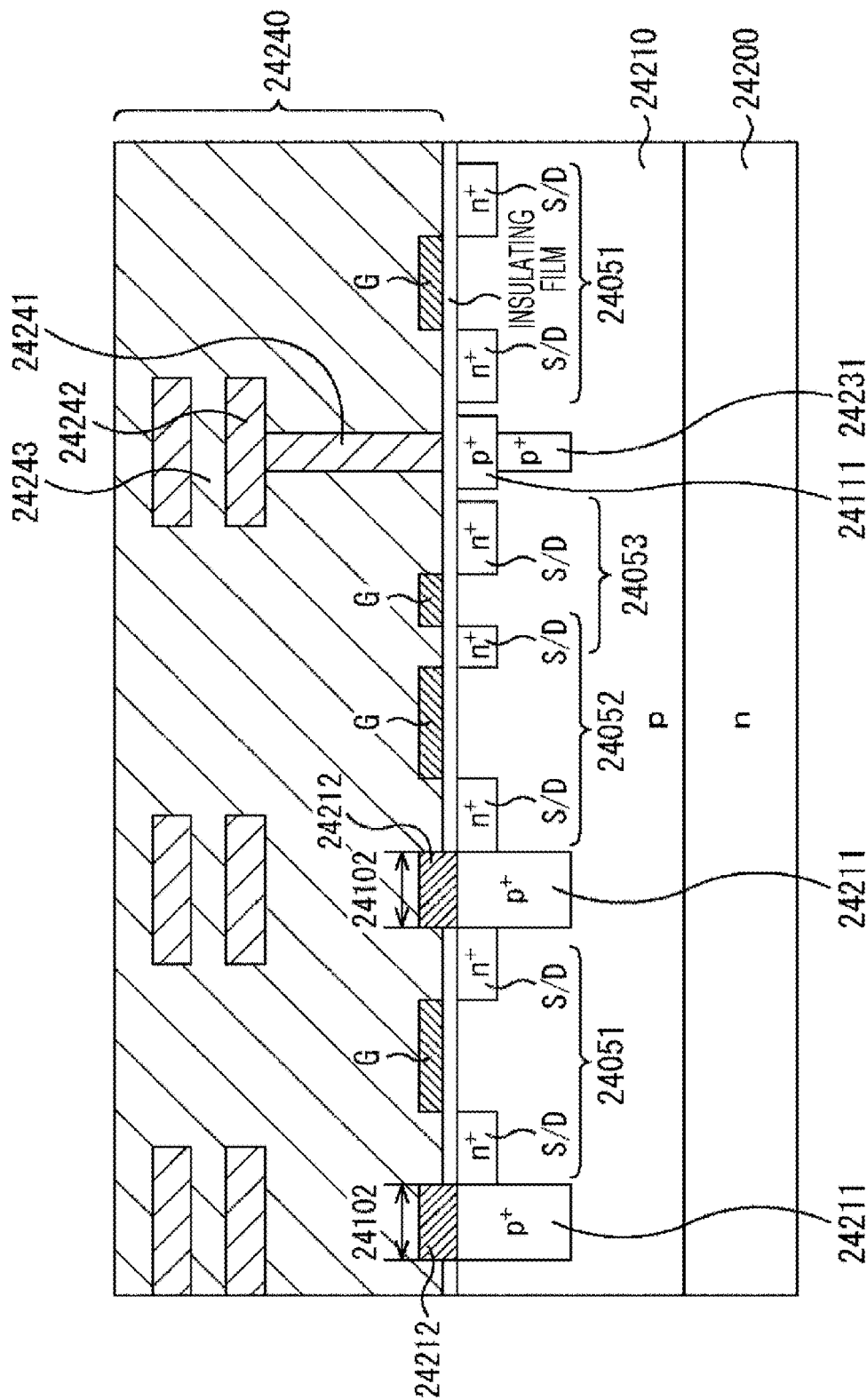
FIG. 45 is a cross-sectional view illustrating the first structural example of the solid state imaging device that shares a plurality of pixels to which the technology according to an embodiment of the present disclosure can be applied.

FIG. 44 is a plan view illustrating a first structural example of a solid state imaging device that shares a plurality of pixels to which the technology according to an embodiment of the present disclosure can be applied. FIG. 45 is a cross-sectional view taken along line A-A of FIG. 44.

A solid state imaging device 24010 includes a pixel region 24011 in which pixels are arranged in a two-dimensional array. In the pixel region 24011, four pixels in total including two pixels wide by two pixels high (2×2 pixels) are defined as each sharing pixel unit 24012 for sharing a pixel Tr (MOSFET) and the like, and the sharing pixel units 24012 are arranged in a two-dimensional array.

The respective four pixels in the sharing pixel unit 24012 of 4-pixel sharing which shares four pixels (2×2 pixels) include photodiodes (PDs) 240211, 240212, 240213, and 240214, and share one floating diffusion (FD) 24030. Further, the sharing pixel unit 24012 includes, as pixel Trs, transfer Trs 24041i corresponding to the PDs 24021i (here, i=1, 2, 3, 4), and a reset Tr 24051, an amplification Tr 24052, and a selection Tr 24053 as shared Trs shared between the four pixels.

The FD 24030 is surrounded by the four PDs 240211 to 240214 and disposed on the center thereof. The FD 24030 is connected to a source/drain region S/D as a drain of the reset Tr 24051 and a gate G of the amplification Tr 24052 through a wiring line 24071. The transfer Tr 24041i includes a gate 24042i which is disposed between the PD 24021i corresponding to the transfer Tr 24041i and the FD 24030 close to the PD 24021i and operates according to voltage applied to the gate 24042i.

Here, a region that includes the PDs 240211 to 240214, the FD 24030, and the transfer Trs 240411 to 240414 of each sharing pixel unit 24012 in each row is referred to as a PD forming region 24061. Further, a region that includes the reset Tr 24051, the amplification Tr 24052, and the selection Tr 24053 shared between the four pixels among the pixels Tr of each sharing pixel units 24012 in each row is referred to as a Tr forming region 24062. The Tr forming region 24062 and the PD forming region 24061 each of which is horizontally continuous are alternately arranged in the vertical direction of the pixel region 24011.

Each of the reset Tr 24051, the amplification Tr 24052, and the selection Tr 24053 includes a pair of source/drain regions S/D and a gate G. One of the pair of source/drain regions S/D functions as a source, and the other source/drain region S/D functions as a drain.

For example, the PDs 240211 to 240214, FD 24030, the transfer Trs 240411 to 240414, the reset Tr 24051, the amplification Tr 24052, and the selection Tr 24053 are formed in a p-type semiconductor region (p-well) 24210 which is formed on an n-type semiconductor substrate 24200 as illustrated in a cross-sectional view of FIG. 45.

As illustrated in FIG. 44, a pixel separator 24101 is formed in the PD forming region 24061, and an element separator 24102 is formed in the Tr forming region 24062 (a region including the Tr forming region 24062). As illustrated in FIG. 45, the element separator 24102 includes, for example, a p-type semiconductor region 24211 which is formed in the p-type semiconductor region 24210 and an insulating film (e.g., a silicon oxide film) 24212 which is formed on the surface of the p-type semiconductor region 24211. Although not illustrated, the pixel separator 24101 can be configured in a similar manner.

A well contact 24111 for applying fixed voltage to the p-type semiconductor region 24210 is formed in the pixel region 24011. The well contact 24111 can be configured as a p-type semiconductor region that is an impurity diffusion region formed on the surface of a p-type semiconductor region 24231 which is formed in the p-type semi-conductor region 24210. The well contact 24111 is a p-type semiconductor region having a higher impurity concentration than the p-type semiconductor region 24231. The well contact 24111 (and the p-type semiconductor region 24231 under the well contact 24111) also serves as the element separator 24102 and is formed between the shared Trs (the reset Trs 24051, the amplification Trs 24052, and the selection Trs 24053) of sharing pixel units 24012 that are adjacent in the right-left direction. The well contact 24111 is connected to a required wiring line 24242 of a wiring layer 24240 through a conductive via 24241. A required fixed voltage is applied to the p-type semiconductor region 24210 through the wiring line 24242, the conductive via 24241, and the well contact 24111. The wiring layer 24240 includes a plurality of layers of wiring lines 24242 which are arranged with an insulating film 24243 interposed therebetween. Although not illustrated, a GMR filter and a microlens are formed on the wiring layer 24240 with a flattening film interposed therebetween.

Figure 46:
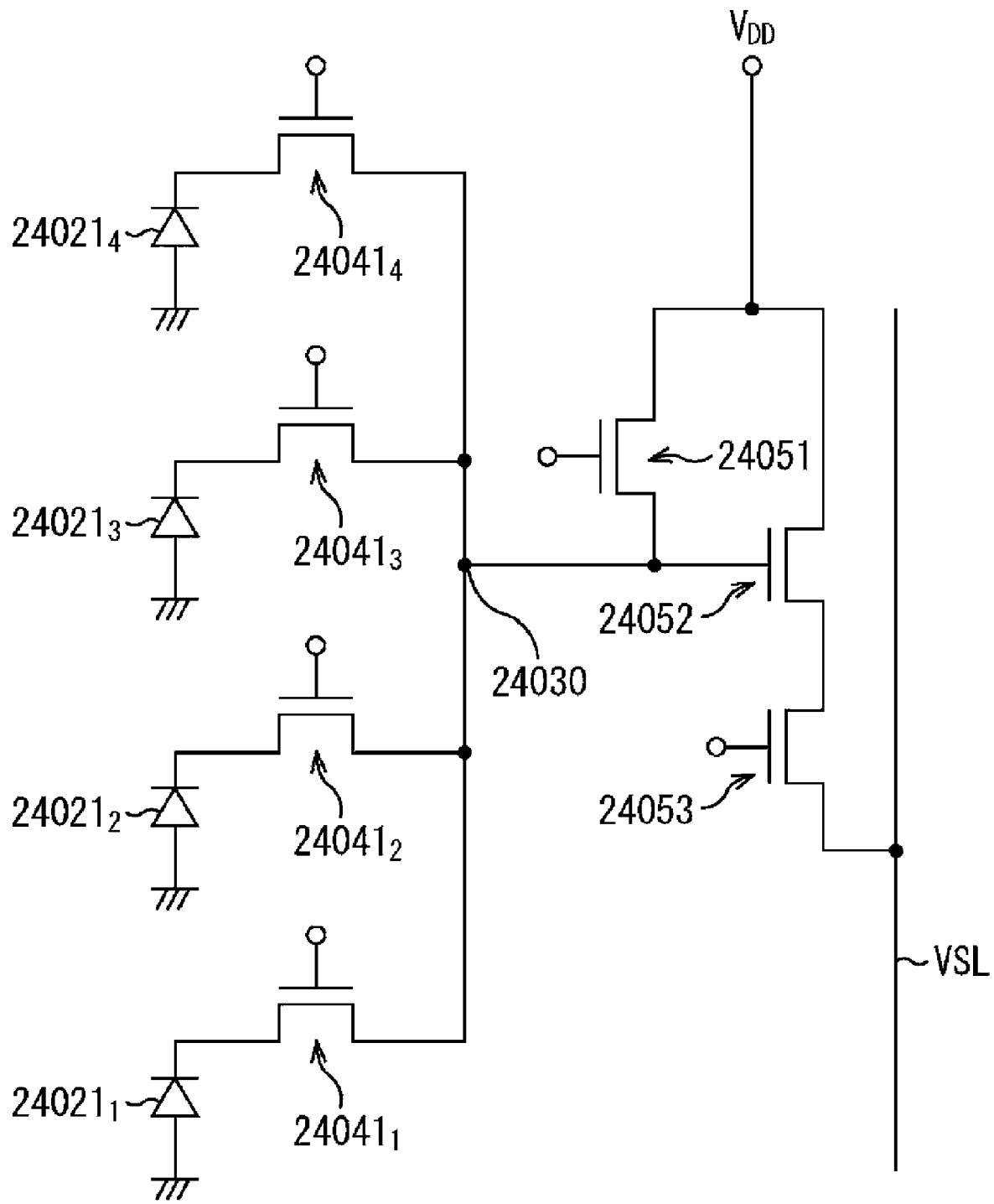
FIG. 46 is a diagram illustrating an example of an equivalent circuit of a sharing pixel unit of 4-pixel sharing.

FIG. 46 is a diagram illustrating an example of an equivalent circuit of the sharing pixel unit 24012 of 4-pixel sharing. In the equivalent circuit of the sharing pixel unit 24012 of 4-pixel sharing, the four PDs 240211 to 240214 are connected to sources of the four transfer Trs 240411 to 240414, respectively. A drain of each transfer Tr 24041i is connected to a source of the reset Tr 24051. The common FD 24030 serves as the drains of the respective transfer Trs 24041i. The FD 24030 is connected to a gate of the amplification Tr 24052. A source of the amplification Tr 24052 is connected to a drain of the selection Tr 24053. A drain of the reset Tr 24051 and a drain of the amplification Tr 24052 are connected to a power source VDD. A source of the selection Tr 24053 is connected to a vertical signal line (VSL).

Figure 47:
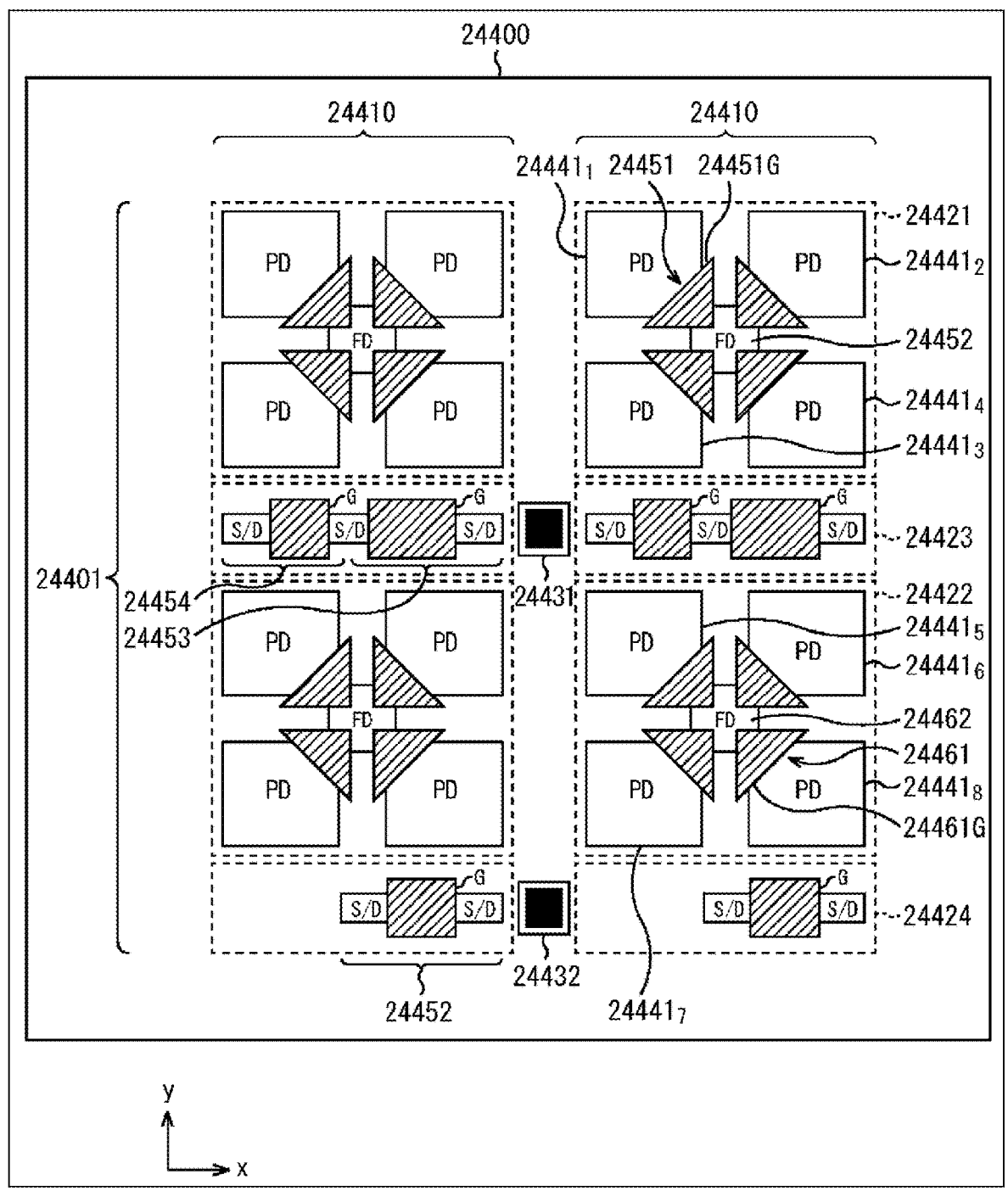
FIG. 47 is a plan view illustrating a second structural example of the solid state imaging device that shares a plurality of pixels to which the technology according to an embodiment of the present disclosure can be applied.

FIG. 47 is a plan view illustrating a second structural example of the solid state imaging device that shares a plurality of pixels to which the technology according to an embodiment of the present disclosure can be applied.

A solid state imaging device 24400 includes a pixel region 24401 in which pixels are arranged in a two-dimensional array. In the pixel region 24401, eight pixels in total including two pixels wide by four pixels high (2×4 pixels) are defined as each sharing pixel unit 24410, and the sharing pixel units 24410 are arranged in a two-dimensional array.

The sharing pixel unit 24410 which shares the eight pixels (2×4 pixels) includes a first light receiving unit 24421 and a second light receiving unit 24422. The first light receiving unit 24421 and the second light receiving unit 24422 are arranged in the vertical direction (y direction) within the sharing pixel unit 24410.

The first light receiving unit 24421 includes PDs 244411, 244412, 244413, and 244414 which are arranged in two pixels wide by two pixels high, and four transfer Trs 24451 which correspond to the respective PDs 244411 to 244414, and an FD 24452 which is shared between the PDs 244411 to 244414. The FD 24452 is disposed on the center of the PDs 244411 to 244414.

The second light receiving unit 24422 includes PDs 244415, 244416, 244417, and 244418 which are arranged in two pixels wide by two pixels high, and four transfer Trs 24461 which correspond to the respective PDs 244415 to 244418, and an FD 24462 which is shared between the PDs 244415 to 244418. The FD 24462 is disposed on the center of the PDs 244415 to 244418.

The transfer Tr 24451 includes a gate 24451G which is disposed between the PD 24441*i* corresponding to the transfer Tr 24451 and the FD 24452 and operates according to voltage applied to the gate 24451G. Similarly, the transfer Tr 24461 includes a gate 24461G which is disposed between the PD 24441*i* corresponding to the Tr 24461 and the FD 24462 and operates according to voltage applied to the gate 24461G.

Further, the sharing pixel unit 24410 includes a first Tr group 24423 and a second Tr group 24424. In the first Tr group 24423 and the second Tr group 24424, a reset Tr 24452, an amplification Tr 24453, and a selection Tr 24454 as shared Trs which are shared between the eight pixels of the sharing pixel unit 24410 are disposed in a divided manner. In FIG. 47, the amplification Tr 24453 and the selection Tr 24454 are disposed in the first Tr group 24423, and the reset Tr 24452 is disposed in the second Tr group 24424.

The first Tr group 24423 is disposed between the first light receiving unit 24421 and the second light receiving unit 24422. The second Tr group 24424 is disposed in a peripheral region of the second light receiving unit 24422 at the side opposite to the side where the first Tr group 24423 is disposed.

Note that the first light receiving units 24421 are formed in the horizontal direction (x direction), and the second light receiving units 24422 are formed in the horizontal direction (x direction).

Further, each of the reset Tr 24452, the amplification Tr 24453, and the selection Tr 24454 includes a pair of source/drain regions S/D and a gate G. One of the pair of source/drain regions S/D functions as a source, and the other source/drain region S/D functions as a drain.

The pair of source/drain regions S/D and the gate G which constitute each of the reset Tr 24452, the amplification Tr 24453, and the selection Tr 24454 are disposed in the horizontal direction (x direction). The gate G of the reset Tr 24452 is disposed in a region that substantially faces the lower-right PD 244418 of the second light receiving unit 24422 in the vertical direction (y direction).

A first well contact 24431 and a second well contact 24432 are disposed between two sharing pixel units 24410 that are arranged side by side in the right-left direction. The first light receiving unit 24421, the second light receiving unit 24422, the first Tr group 24423, and the second Tr group 24424 are formed in a semiconductor region as a predetermined well region formed within a Si substrate. The first well contact 24431 and the second well contact 24432 electrically connect the predetermined well region and internal wiring of the solid state imaging device 24400 to each other. The first well contact 24431 is disposed between the first Tr groups 24423 of the two sharing pixel units 24410 arranged side by side in the right-left direction. The second well contact 24432 is disposed between the second Tr groups 24424 of the two sharing pixel units 24410 arranged side by side in the right-left direction.

Further, the members inside the sharing pixel unit 24410 are electrically connected so as to satisfy a connection relationship similar to that in the equivalent circuit of 4-pixel sharing illustrated in FIG. 46.

Figure 48:
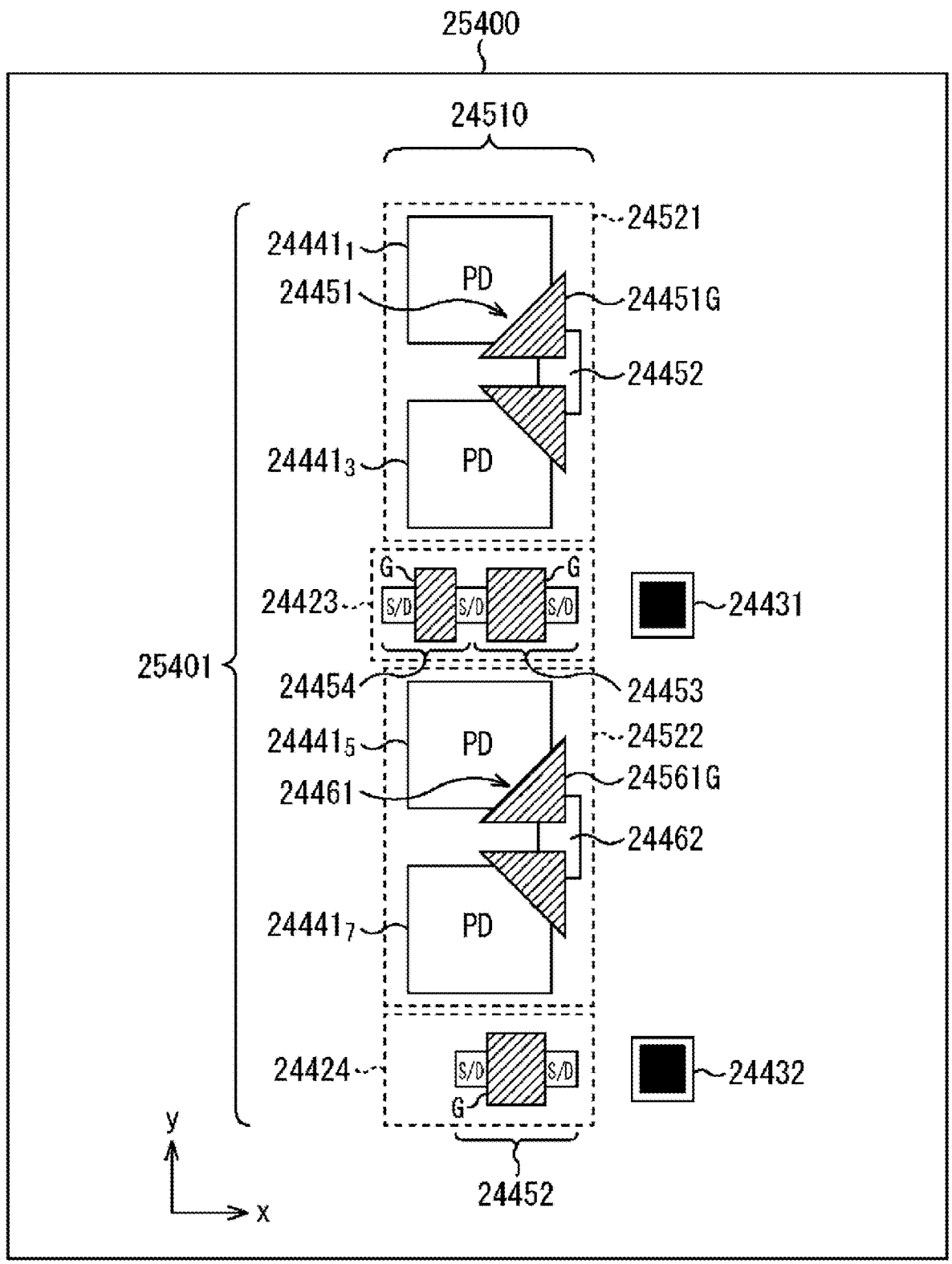
FIG. 48 is a plan view illustrating a third structural example of the solid state imaging device that shares a plurality of pixels to which the technology according to an embodiment of the present disclosure can be applied.

FIG. 48 is a plan view illustrating a third structural example of the solid state imaging device that shares a plurality of pixels to which the technology according to an embodiment of the present disclosure can be applied.

A solid state imaging device 25400 includes a pixel region 25401 in which pixels are arranged in a two-dimensional array. In the pixel region 25401, four pixels in total including one pixel wide by four pixels high (1×4 pixels) are defined as each sharing pixel unit 24510, and the sharing pixel units 24510 are arranged in a two-dimensional array.

The pixel region 25401 includes a first well contact 24431 and a second well contact 24432 in addition to the sharing pixel unit 24510. The pixel region 25401 is in common with the pixel region 24401 of FIG. 47 in including the first well contact 24431 and the second well contact 24432. However, the pixel region 25401 differs from the pixel region 24401 of FIG. 47 in including the sharing pixel unit 24510 including 1×4 pixels instead of the sharing pixel unit 24410 including 2×4 pixels of FIG. 47.

The sharing pixel unit 24510 includes a first light receiving unit 24521 and a second light receiving unit 24522, and a first Tr group 24423 and a second Tr group 24424. The sharing pixel unit 24510 is in common with the sharing pixel unit 24410 of FIG. 47 in including the first Tr group 24423 and the second Tr group 24424. However, the sharing pixel unit 24510 differs from the sharing pixel unit 24410 of FIG. 47 in including the first light receiving unit 24521 and the second light receiving unit 24522 instead of the first light receiving unit 24421 and the second light receiving unit 24422.

The first light receiving unit 24521 includes PDs 244411 and 244413 which are arranged in one pixel wide by two pixels high, two transfer Trs 24451 which correspond to the respective PDs 244411 and 244413, and an FD 24452. The first light receiving unit 24521 is in common with the first light receiving unit 24421 of FIG. 47 in including the PDs 244411 and 244413, the two transfer Trs 24451 which correspond to the respective PDs 244411 and 244413, and the FD 24452. However, the first light receiving unit 24521 differs from the first light receiving unit 24421 of FIG. 47 in not including the PDs 244412 and 244414 and the two transfer Trs 24451 which correspond to the respective PDs 244412 and 244414.

The second light receiving unit 24522 includes PDs 244415 and 244417 which are arranged in one pixel wide by two pixels high, two transfer Trs 24461 which correspond to the respective PDs 244415 and 244417, and an FD 24462. The second light receiving unit 24522 is in common with the second light receiving unit 24422 of FIG. 47 in including the PDs 244415 and 244417, the two transfer Trs 24461 which correspond to the respective PDs 244415 and 244417, and the FD 24462. However, the second light receiving unit 24522 differs from the second light receiving unit 24422 of FIG. 47 in not including the PDs 244416 and 244418 and the two transfer Trs 24461 which correspond to the respective PDs 244416 and 244418.

Note that, in the sharing pixel unit 24510, the gate G of the reset Tr 24452 is disposed in a region that substantially faces the left side of the PD 244417 of the second light receiving unit 24522 in the vertical direction (y direction).

Further, the members inside the sharing pixel unit 24510 are electrically connected so as to satisfy a connection relationship similar to that in the equivalent circuit of 4-pixel sharing illustrated in FIG. 46.

The technology according to an embodiment of the present disclosure can be applied to the solid state imaging devices as described above.

It is to be noted that embodiments of the present technology are not limited to the embodiments described above, and various modifications can be made within the scope of the present technology.

<Structure Combination Examples>

Further, for example, the present technology can also employ the following structures.

(1)

An imaging device including:

a photodetector; and an optical filter disposed on a light-receiving surface of the photodetector, wherein the optical filter includes: a diffraction grating, a first core layer; and a reflector disposed on first and second opposing sides of the first core layer, wherein a refractive index of the reflector is different from a refractive index of the first core layer.

(2)

The imaging device according to (1), in which the first core layer is disposed on a light-receiving surface of the diffraction grating or on a surface opposite the light-receiving surface of the diffraction grating.

(3)

The imaging device according to (1) or (2), in which the reflector surrounds at least a periphery of the first core layer.

(4)

The imaging device according to any one of (1) to (3), in which the reflector includes a metal.

(5)

The imaging device according to any one of (1) to (3), in which the reflector includes a Bragg mirror.

(6)

The imaging device according to any one of (1) to (3), in which the reflector includes a dielectric mirror having a higher or lower reflectivity than the first core layer.

(7)

The imaging device according to (6), in which the dielectric mirror includes SiN, $TiO_2$, and/or silicon oxide.

(8)

The imaging device according to any one of (1) to (3), in which the reflector is an air gap.

(9)

The imaging device according to any one of (1) to (8), in which a width of the reflector is 50 nm or more and 200 nm or less.

(10)

The imaging device according to any one of (1) to (9), in which the first core layer has a waveguide structure or a light-guiding plate structure.

(11)

The imaging device according to any one of (1) to (10), in which the first clad layer includes silicon nitride, tantalum dioxide, and/or titanium oxide.

(12)

The imaging device according to any one of (1) to (11), in which the diffraction grating is a one-dimensional diffraction grating or a two-dimensional diffraction grating and in which the diffraction grating includes a plurality of grating lines having a grating period of 200 nm or more and 600 nm or less.

(13)

The imaging device according to any one of (1) to (12), in which the diffraction grating includes a metal thin film.

(14)

The imaging device according to any one of (1) to (13), in which the diffraction grating includes a dielectric material.

(15)

The imaging device according to any one of (1) to (14), in which a thickness of the diffraction grating is about 50 nm or more and 150 nm or less.

(16)

The imaging device according to any one of (1) to (15), in which the optical filter is a guided mode resonance (GMR) filter.

(17)

The imaging device according to any one of (1) to (16), further including a first clad layer disposed between the diffraction grating and the first core layer.

(18)

The imaging device according to (17), in which the first clad layer is directly adjacent to the diffraction grating and/or the first core layer.

(19)

The imaging device according to any one of (17) or (18), in which the first clad layer has a refractive index lower than the refractive index of the first core layer.

(20)

The imaging device according to any one of (17) to (19), in which the reflector is disposed on first and second opposing sides of the first clad layer.

(21)

The imaging device according to (20), in which the reflector surrounds at least a periphery of the first clad layer.

(22)

The imaging device according to any one of (17) to (21), in which the first clad layer has a thickness of about 150 nm or less.

(23)

The imaging device according to any one of (17) to (22), further including a second core layer disposed on a surface of the diffraction grating opposite the surface of the diffraction grating on which the first core layer is disposed.

(24)

The imaging device according to (23), in which the reflector is disposed on first and second opposing sides of the second core layer, and in which a refractive index of the second core layer is different from the refractive index of the reflector.

(25)

The imaging device according to (23) or (24), in which the reflector surrounds at least a periphery of the second core layer.

(26)

The imaging device according to any one of (23) to (25), in which the second core layer has a waveguide structure or a light-guiding plate structure.

(27)

The imaging device according to any one of (23) to (26), in which the second core layer includes silicon nitride, tantalum dioxide, and/or titanium oxide.

(28)

The imaging device according to any one of (23) to (27), further including a second clad layer disposed between the diffraction grating and the second core layer.

(29)

The imaging device according to (28), in which the second clad layer is directly adjacent to the diffraction grating and/or the second core layer.

(30)

The imaging device according to (28) or (29), in which the second clad layer has a refractive index lower than a refractive index of the second core layer.

(31)

The imaging device according to any one of (28) to (30), in which the reflector is disposed on first and second opposing sides of the second clad layer.

(32)

The imaging device according to any one of (28) to (31), in which the reflector surrounds at least a periphery of the second clad layer.

(33)

The imaging device according to any one of (28) to (32), in which the second clad layer has a thickness of about 150 nm or less.

(34)

The imaging device according to any one of (1) to (33), further including a first dielectric layer disposed above the diffraction grating and a second dielectric layer disposed below the diffraction grating, in which a refractive index of the first dielectric layer is lower than a refractive index of the second dielectric layer.

(35)

The imaging device according to any one of (1) to (34), in which the photodetector is a photodiode.

(36)

The imaging device according to any one of (1) to (35), in which the photodetector is disposed in a semiconductor substrate.

(37)

The imaging device according to (36), further including a wiring layer disposed on a surface of the semiconductor substrate opposite a light-receiving surface of the photodetector.

(38)

An electronic device, including: the imaging device of any one of (1) to (37), an optical lens configured to cause an optical image to enter the imaging device, a drive unit configured to send a timing signal to the imaging device, and a signal processing unit configured to process a signal output from the imaging device.

(39)

An imaging device including:

a first photodetector;

a second photodetector disposed adjacent to the first photodetector; and an optical filter disposed above a light-receiving surface of the first photodetector and the second photodetector, in which a first portion of the optical filter disposed above the first photodetector and a second portion of the optical filter disposed above the second photodetector each comprise a diffraction grating and a first core layer, in which a reflector is disposed between the first core layer of the first portion of the optical filter and the first core layer of the second portion of the optical filter, and in which the reflector has a refractive index different from a refractive index of the first core layer of the first portion of the optical filter and a refractive index of the first core layer of the second portion of the optical filter.

(40)

The imaging device according to (39), in which the first portion of the optical filter is configured to transmit light in a first wavelength range and the second portion of the optical filter is configured to transmit light in a second wavelength range different from the first wavelength range.

(41)

The imaging device according to (39) or (40), in which the diffraction gratings of the first and second portions of the optical filter each comprise a plurality of grating lines having a grating period, and in which the grating period of the diffraction grating of the first portion is different from the grating period of the diffraction grating of the second portion.

(42)

The imaging device according to any one of (39) to (41), in which the first core layer of the first portion of the optical filter is disposed on a light-receiving surface of the diffraction grating of the first portion of the optical filter and the first core layer of the second portion of the optical filter is disposed on a light-receiving surface of the diffraction grating of the second portion of the optical filter.

(43)

The imaging device according to any one of (39) to (42), in which the first core layer of the first portion of the optical filter is disposed on a surface opposite a light-receiving surface of the diffraction grating of the first portion of the optical filter and the first core layer of the second portion of the optical filter is disposed on a surface opposite a light-receiving surface of the diffraction grating of the second portion of the optical filter.

(44)

The imaging device according to any one of (39) to (43), in which the reflector includes a metal, a Bragg minor, a dielectric mirror, and/or an air gap.

(45)

The imaging device according to any one of (39) to (44), in which the optical filter is a GMR filter.

(46)

The imaging device according to any one of (39) to (45), in which each of the first and second portions of the optical filter further includes a first clad layer disposed between the diffraction grating and the first core layer, and in which the first clad layer of each portion of the optical filter has a refractive index lower than the refractive index of the first core layer of the same portion.

(47)

The imaging device according to (46), in which the reflector is disposed between the first clad layer of the first portion of the optical filter and the first clad layer of the second portion of the optical filter.

(48)

The imaging device according to any one of (39) to (47), in which each of the first and second portions of the optical filter further includes a second core layer disposed on a surface of the diffraction grating opposite the surface of the diffraction grating on which the first core layer is disposed.

(49)

The imaging device according to (48), in which the reflector is disposed between the second core layer of the first portion of the optical filter and the second core layer of the second portion of the optical filter, and in which a refractive index of the second core layer of the first portion of the optical filter and a refractive index of the second core layer of the second portion of the optical filter are different from the refractive index of the reflector.

(50)

The imaging device according to any one of (39) to (49), in which each of the first and second portions of the optical filter further includes a second clad layer disposed between the diffraction grating and the second core layer, and in which the second clad layer of each portion of the optical filter has a refractive index lower than the refractive index of the second core layer of the same portion of the optical filter.

(51)

The imaging device according to (50), in which the reflector is disposed between the second clad layer of the first portion of the optical filter and the second clad layer of the second portion of the optical filter.

(52)

The imaging device according to any one of (39) to (51), in which the first and second photodetectors are photodiodes.

(53)

An electronic device, including: the imaging device of any one of (39) to (52), an optical lens configured to cause an optical image to enter the imaging device, a drive unit configured to send a timing signal to the imaging device, and a signal processing unit configured to process a signal output from the imaging device.

REFERENCE SIGNS LIST 100, 100a to 100h Image sensor
101 On-chip microlens
102, 102a to 102h Filter layer
103 Semiconductor substrate
111 Pixel array unit
201a to 201h Pixel
221 Interlayer insulating film
222a to 222c GMR filter
222A Diffraction grating
222B Clad layer
222C Core layer
223 Interlayer insulating film
224 Reflector
231 Photodiode
251, 271, 301, 321 Reflector
400 Electronic device
401 Optical system configuration unit
403 Image sensor
404 Signal processing unit

The invention claimed is:

1. An imaging device, comprising:
a photodetector; and
an optical filter disposed on a light-receiving surface of the photodetector, wherein the optical filter comprises:
a diffraction grating;
a first core layer; and
a reflector disposed on first and second opposing sides of the first core layer, wherein a refractive index of the reflector is different from a refractive index of the first core layer.

2. The imaging device according to claim 1, wherein the first core layer is disposed on a light-receiving surface of the diffraction grating or on a surface opposite the light-receiving surface of the diffraction grating.

3. The imaging device according to claim 1, wherein the reflector surrounds at least a periphery of the first core layer.

4. The imaging device according to claim 1, wherein the reflector comprises a metal.

5. The imaging device according to claim 1, wherein the reflector comprises a Bragg mirror.

6. The imaging device according to claim 1, wherein the reflector comprises a dielectric mirror having a higher or lower reflectivity than the first core layer.

7. The imaging device according to claim 6, wherein the dielectric mirror comprises SiN, $TiO_2$, and/or silicon oxide.

8. The imaging device according to claim 1, wherein the reflector is an air gap.

9. The imaging device according to claim 1, wherein a width of the reflector is 50 nm or more and 200 nm or less.

10. The imaging device according to claim 1, wherein the first core layer has a waveguide structure or a light-guiding plate structure.

11. The imaging device according to claim 1, wherein the diffraction grating is a one-dimensional diffraction grating or a two-dimensional diffraction grating, and wherein the diffraction grating comprises a plurality of grating lines having a grating period of 200 nm or more and 600 nm or less.

12. The imaging device according to claim 1, wherein the diffraction grating comprises a metal thin film.

13. The imaging device according to claim 1, wherein the diffraction grating comprises a dielectric material.

14. The imaging device according to claim 1, wherein a thickness of the diffraction grating is about 50 nm or more and 150 nm or less.

15. The imaging device according to claim 1, wherein the optical filter is a guided mode resonance (GMR) filter.

16. The imaging device according to claim 1, further comprising a first clad layer disposed between the diffraction grating and the first core layer.

17. The imaging device according to claim 16, wherein the first clad layer comprises silicon nitride, tantalum dioxide, and/or titanium oxide.

18. The imaging device according to claim 16, wherein the first clad layer is directly adjacent to the diffraction grating and/or the first core layer.

19. The imaging device according to claim 16, wherein the first clad layer has a refractive index lower than the refractive index of the first core layer.

20. The imaging device according to claim 16, wherein the reflector is disposed on first and second opposing sides of the first clad layer.

21. The imaging device according to claim 20, wherein the reflector surrounds at least a periphery of the first clad layer.

22. The imaging device according to claim 16, wherein the first clad layer has a thickness of about 150 nm or less.

23. The imaging device according to claim 16, further comprising a second core layer disposed on a surface of the diffraction grating opposite the surface of the diffraction grating on which the first core layer is disposed.

24. The imaging device according to claim 23, wherein the reflector is disposed on first and second opposing sides of the second core layer, and wherein a refractive index of the second core layer is different from the refractive index of the reflector.

25. The imaging device according to claim 23, wherein the reflector surrounds at least a periphery of the second core layer.

26. The imaging device according to claim 23, wherein the second core layer has a waveguide structure or a light-guiding plate structure.

27. The imaging device according to claim 23, wherein the second core layer comprises silicon nitride, tantalum dioxide, and/or titanium oxide.

28. The imaging device according to claim 23, further comprising a second clad layer disposed between the diffraction grating and the second core layer.

29. The imaging device according to claim 28, wherein the second clad layer is directly adjacent to the diffraction grating and/or the second core layer.

30. The imaging device according to claim 28, wherein the second clad layer has a refractive index lower than a refractive index of the second core layer.

31. The imaging device according to claim 28, wherein the reflector is disposed on first and second opposing sides of the second clad layer.

32. The imaging device according to claim 28, wherein the reflector surrounds at least a periphery of the second clad layer.

33. The imaging device according to claim 28, wherein the second clad layer has a thickness of about 150 nm or less.

34. The imaging device according to claim 1, further comprising a first dielectric layer disposed above the diffraction grating and a second dielectric layer disposed below the diffraction grating, wherein a refractive index of the first dielectric layer is lower than a refractive index of the second dielectric layer.

35. The imaging device according to claim 1, wherein the photodetector is a photodiode.

36. The imaging device according to claim 1, wherein the photodetector is disposed in a semiconductor substrate.

37. The imaging device according to claim 36, further comprising a wiring layer disposed on a surface of the semiconductor substrate opposite a light-receiving surface of the photodetector.

38. An electronic device, comprising: the imaging device of claim 1, an optical lens configured to cause an optical image to enter the imaging device, a drive unit configured to send a timing signal to the imaging device, and a signal processing unit configured to process a signal output from the imaging device.

39. An imaging device, comprising:
a first photodetector;
a second photodetector disposed adjacent to the first photodetector; and
an optical filter disposed above a light-receiving surface of the first photodetector and the second photodetector,
wherein a first portion of the optical filter disposed above the first photodetector and a second portion of the optical filter disposed above the second photodetector each comprise a diffraction grating and a first core layer,
wherein a reflector is disposed between the first core layer of the first portion of the optical filter and the first core layer of the second portion of the optical filter, and
wherein the reflector has a refractive index different from a refractive index of the first core layer of the first portion of the optical filter and a refractive index of the first core layer of the second portion of the optical filter.

40. The imaging device according to claim 39, wherein the first portion of the optical filter is configured to transmit light in a first wavelength range and the second portion of the optical filter is configured to transmit light in a second wavelength range different from the first wavelength range.

41. The imaging device according to claim 39, wherein the diffraction gratings of the first and second portions of the optical filter each comprise a plurality of grating lines having a grating period, and wherein the grating period of the diffraction grating of the first portion is different from the grating period of the diffraction grating of the second portion.

42. The imaging device according to claim 39, wherein the first core layer of the first portion of the optical filter is disposed on a light-receiving surface of the diffraction grating of the first portion of the optical filter and the first core layer of the second portion of the optical filter is disposed on a light-receiving surface of the diffraction grating of the second portion of the optical filter.

43. The imaging device according to claim 39, wherein the first core layer of the first portion of the optical filter is disposed on a surface opposite a light-receiving surface of the diffraction grating of the first portion of the optical filter and the first core layer of the second portion of the optical filter is disposed on a surface opposite a light-receiving surface of the diffraction grating of the second portion of the optical filter.

44. The imaging device according to claim 39, wherein the reflector comprises a metal, a Bragg mirror, a dielectric mirror, and/or an air gap.

45. The imaging device according to claim 39, wherein the optical filter is a GMR filter.

46. The imaging device according to claim 39, wherein each of the first and second portions of the optical filter further comprises a first clad layer disposed between the diffraction grating and the first core layer, and wherein the first clad layer of each portion of the optical filter has a refractive index lower than the refractive index of the first core layer of the same portion.

47. The imaging device according to claim 46, wherein the reflector is disposed between the first clad layer of the first portion of the optical filter and the first clad layer of the second portion of the optical filter.

48. The imaging device according to claim 46, wherein each of the first and second portions of the optical filter further comprises a second core layer disposed on a surface of the diffraction grating opposite the surface of the diffraction grating on which the first core layer is disposed.

49. The imaging device according to claim 48, wherein the reflector is disposed between the second core layer of the first portion of the optical filter and the second core layer of the second portion of the optical filter, and wherein a refractive index of the second core layer of the first portion of the optical filter and a refractive index of the second core layer of the second portion of the optical filter are different from the refractive index of the reflector.

50. The imaging device according to claim 48, wherein each of the first and second portions of the optical filter further comprises a second clad layer disposed between the diffraction grating and the second core layer, and wherein the second clad layer of each portion of the optical filter has a refractive index lower than a refractive index of the second core layer of the same portion of the optical filter.

51. The imaging device according to claim 50, wherein the reflector is disposed between the second clad layer of the first portion of the optical filter and the second clad layer of the second portion of the optical filter.

52. The imaging device according to claim 39, wherein the first and second photodetectors are photodiodes.

53. An electronic device, comprising: the imaging device of claim 39, an optical lens configured to cause an optical image to enter the imaging device, a drive unit configured to send a timing signal to the imaging device, and a signal processing unit configured to process a signal output from the imaging device.

* * * * *